US012584065B2

(12) United States Patent
Yu et al.

(10) Patent No.: US 12,584,065 B2
(45) Date of Patent: Mar. 24, 2026

(54) ORGANIC LIGHT EMITTING DIODE AND ORGANIC LIGHT EMITTING DEVICE INCLUDING THE SAME

(71) Applicant: LG DISPLAY CO., LTD., Seoul (KR)

(72) Inventors: Young-Jun Yu, Paju-si (KR); Sang-Beom Kim, Paju-si (KR); Jung-Keun Kim, Paju-si (KR); Jeong-Dae Seo, Paju-si (KR); Sung-Hoon Kim, Seoul (KR); Kwang-Seok Do, Seoul (KR); Dong-Hun Lee, Seoul (KR); Won-Bin Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 1171 days.

(21) Appl. No.: 17/522,620

(22) Filed: Nov. 9, 2021

(65) Prior Publication Data

US 2022/0209115 A1 Jun. 30, 2022

(30) Foreign Application Priority Data

Dec. 29, 2020 (KR) ........................ 10-2020-0186054

(51) Int. Cl.

| | |
|---|---|
| ***C09K 11/06*** | (2006.01) |
| ***H10K 50/11*** | (2023.01) |
| ***H10K 50/15*** | (2023.01) |
| ***H10K 50/19*** | (2023.01) |
| ***H10K 59/80*** | (2023.01) |
| ***H10K 85/60*** | (2023.01) |
| ***H10K 101/00*** | (2023.01) |

(52) U.S. Cl.

CPC .............. *C09K 11/06* (2013.01); *H10K 50/11* (2023.02); *H10K 50/19* (2023.02); *H10K 85/615* (2023.02); *H10K 85/626* (2023.02); *H10K 85/633* (2023.02); *H10K 85/658* (2023.02); *H10K 50/15* (2023.02); *H10K 59/873* (2023.02); *H10K 59/8731* (2023.02); *H10K 2101/90* (2023.02)

(58) Field of Classification Search

CPC .... H10K 50/19; H10K 85/633; H10K 85/615; H10K 85/626; H10K 85/658

See application file for complete search history.

(56) References Cited

U.S. PATENT DOCUMENTS

| | | | | |
|---|---|---|---|---|
| 2006/0040132 A1* | 2/2006 | Liao | H10K 50/125 313/506 |
| 2013/0207046 A1* | 8/2013 | Pflumm | C07D 219/02 252/500 |
| 2017/0287985 A1* | 10/2017 | Kim | H10K 50/13 |
| 2019/0058124 A1* | 2/2019 | Hatakeyama | H10K 85/322 |
| 2021/0053998 A1* | 2/2021 | Kim | H10K 85/322 |
| 2023/0159434 A1* | 5/2023 | Montenegro | C07D 209/88 257/40 |

FOREIGN PATENT DOCUMENTS

| | | | | |
|---|---|---|---|---|
| CN | 111509132 A | 8/2020 | |
| KR | 10-1605987 B1 | 3/2016 | |
| KR | 10-2017-0084917 A | 7/2017 | |
| KR | 10-2020-0038061 A | 4/2020 | |
| WO | WO-2017122988 A1 * | 7/2017 | C07C 13/567 |
| WO | WO 2020/054676 A1 | 3/2020 | |
| WO | WO 2020/080417 A1 | 4/2020 | |

OTHER PUBLICATIONS

Lee et al., machine translation of WO-2017122988-A1 (2017) pp. 1-44. (Year: 2017).*

Hatakeyama et al., machine translation of WO 2020/054676 A1 (2020) pp. 1-339. (Year: 2020).*

* cited by examiner

*Primary Examiner* — Dylan C Kershner

(74) *Attorney, Agent, or Firm* — Birch, Stewart, Kolasch & Birch, LLP

(57) ABSTRACT

An organic light emitting diode and an organic light emitting device including the same are described. The organic light emitting diode can include a first electrode, a second electrode facing the first electrode, and a first emitting part including a red emitting material layer and a first hole transporting layer and positioned between the first and second electrodes. The red emitting material layer can include a first red host and a red dopant, and the first hole transporting layer can include a hole transporting material and is positioned between the first electrode and the red emitting material layer. At least one of the first red host and the hole transporting material is a compound of the following Formula:

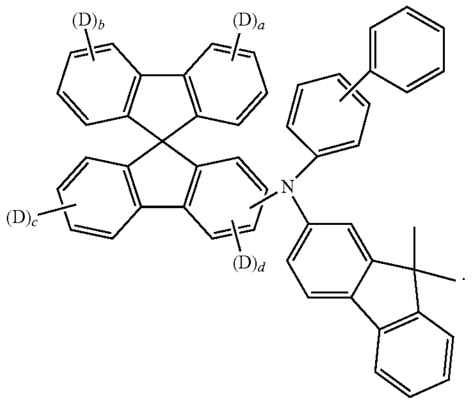

22 Claims, 4 Drawing Sheets

ORGANIC LIGHT EMITTING DIODE AND ORGANIC LIGHT EMITTING DEVICE INCLUDING THE SAME

CROSS-REFERENCE TO RELATED APPLICATIONS

The present application claims the priority benefit of Korean Patent Application No. 10-2020-0186054 filed in the Republic of Korea on Dec. 29, 2020, the entire contents of which are hereby incorporated by reference into the present application.

BACKGROUND

Technology Field

The present disclosure relates to an organic light emitting diode (OLED) display device and an organic light emitting device, and more specifically, to an OLED having improved emitting efficiency and lifespan and an organic light emitting device including the same.

DISCUSSION OF BACKGROUND ART

As requests for a flat panel display device having a small occupied area have been increased, an organic light emitting display device including an OLED has been the subject of recent research and development.

The OLED emits light by injecting electrons from a cathode as an electron injection electrode and holes from an anode as a hole injection electrode into an emitting material layer (EML), combining the electrons with the holes, generating an exciton, and transforming the exciton from an excited state to a ground state. A flexible substrate, for example, a plastic substrate, can be used as a base substrate where elements are formed. In addition, the organic light emitting display device can be operated at a voltage (e.g., 10V or below) lower than a voltage required to operate other display devices. Moreover, the organic light emitting display device has advantages in the power consumption and the color sense.

The OLED includes a first electrode as an anode over a substrate, a second electrode, which is spaced apart from and faces the first electrode, and an organic emitting layer therebetween.

The materials in the organic emitting layer have been studied and researched, but there can still be a limitation in the emitting efficiency and the lifespan of the OLED.

SUMMARY OF THE DISCLOSURE

The present disclosure is directed to an OLED and an organic light emitting device including the OLED that substantially obviate one or more of the problems associated with the limitations and disadvantages of the related art.

Additional features and advantages of the present disclosure are set forth in the description which follows, and will be apparent from the description, or evident by practice of the present disclosure. The objectives and other advantages of the present disclosure are realized and attained by the features described herein as well as in the appended drawings.

To achieve these and other advantages in accordance with the purpose of the embodiments of the present disclosure, as described herein, an aspect of the present disclosure is an organic light emitting diode comprising a first electrode: a second electrode facing the first electrode; and a first emitting part including a red emitting material layer and a first hole transporting layer and positioned between the first and second electrodes, the red emitting material layer including a first red host and a red dopant, and the first hole transporting layer including a hole transporting material and positioned between the first electrode and the red emitting material layer, wherein at least one of the first red host and the hole transporting material is a compound of Formula 1-1:

[Formula 1-1]

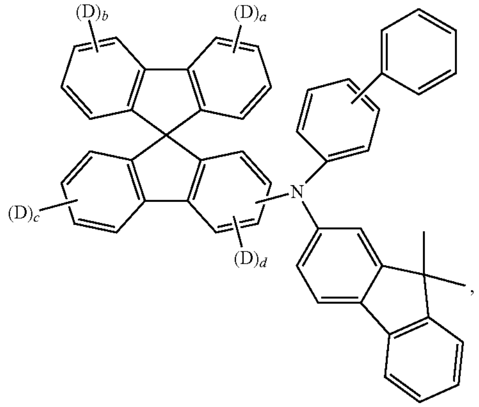

wherein each of a, b and c is independently an integer of 0 to 4, and d is an integer of 0 to 3, and wherein at least one of a, b, c and d is a positive integer.

Another aspect of the present disclosure is an organic light emitting device comprising a substrate; and an organic light emitting diode positioned on the substrate and including a first electrode; a second electrode facing the first electrode; and a first emitting part including a red emitting material layer and a first hole transporting layer and positioned between the first and second electrodes, the red emitting material layer including a first red host and a red dopant, and the first hole transporting layer including a hole transporting material and positioned between the first electrode and the red emitting material layer, wherein at least one of the first red host and the hole transporting material is a compound of Formula 1-1:

[Formula 1-1]

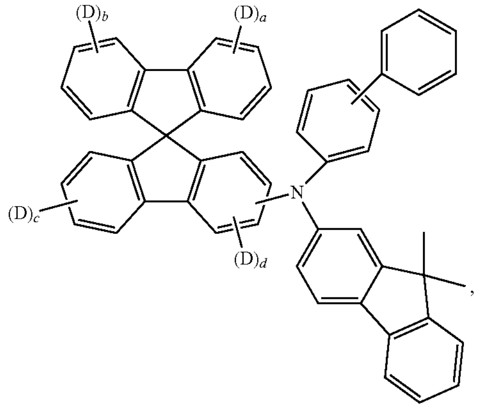

wherein each of a, b and c is independently an integer of 0 to 4, and d is an integer of 0 to 3, and wherein at least one of a, b, c and d is a positive integer.

It is to be understood that both the foregoing general description and the following detailed description are exemplary and explanatory and are intended to further explain the present disclosure as claimed.

BRIEF DESCRIPTION OF THE DRAWINGS

The accompanying drawings, which are included to provide a further understanding of the present disclosure and are incorporated in and constitute a part of this specification, illustrate embodiments of the present disclosure and together with the description serve to explain the principles of the present disclosure.

DETAILED DESCRIPTION OF THE EMBODIMENTS

Reference will now be made in detail to some of the examples and preferred embodiments, which are illustrated in the accompanying drawings.

In the present disclosure, an aryl group, an arylene group, a heteroaryl group and a heteroarylene group can be unsubstituted or substituted with alkyl and/or aryl without specific definition.

Figure 1:
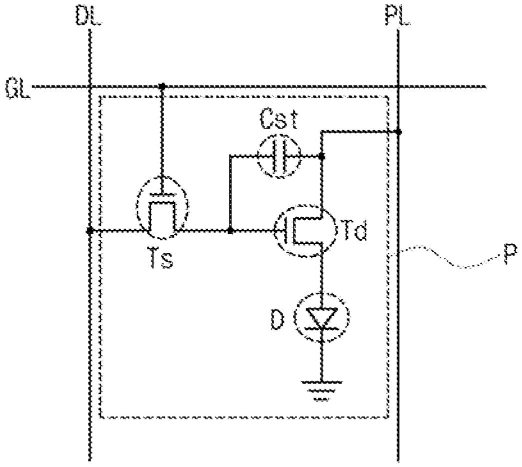
FIG. 1 is a schematic circuit diagram illustrating an organic light emitting display device of the present disclosure.

FIG. 1 is a schematic circuit diagram illustrating an organic light emitting display device of the present disclosure. All the components of each organic light emitting display device according to all embodiments of the present disclosure are operatively coupled and configured.

As illustrated in FIG. 1, in the organic light emitting display device, a gate line GL and a data line DL, which cross each other to define a pixel region (pixel) P, and a power line PL are formed in an organic light emitting display device. A switching thin film transistor (TFT) Ts, a driving TFT Td, a storage capacitor Cst and an OLED D are formed in the pixel region P. The pixel region P can include a red pixel region, a green pixel region and a blue pixel region. In addition, the pixel region P can further include a white pixel region. The organic light emitting display device includes a plurality of such pixels.

The switching thin film transistor Ts is connected to the gate line GL and the data line DL, and the driving thin film transistor Td and the storage capacitor Cst are connected between the switching thin film transistor Ts and the power line PL. The OLED D is connected to the driving thin film transistor Td. When the switching thin film transistor Ts is turned on by the gate signal applied through the gate line GL, the data signal applied through the data line DL is applied to a gate electrode of the driving thin film transistor Td and one electrode of the storage capacitor Cst through the switching thin film transistor Ts.

The driving thin film transistor Td is turned on by the data signal applied into the gate electrode so that a current proportional to the data signal is supplied from the power line PL to the OLED D through the driving thin film transistor Td. The OLED D emits light having a luminance proportional to the current flowing through the driving thin film transistor Td. In this case, the storage capacitor Cst is charged with a voltage proportional to the data signal so that the voltage of the gate electrode in the driving thin film transistor Td is kept constant during one frame. Therefore, the organic light emitting display device can display a desired image.

Figure 2:
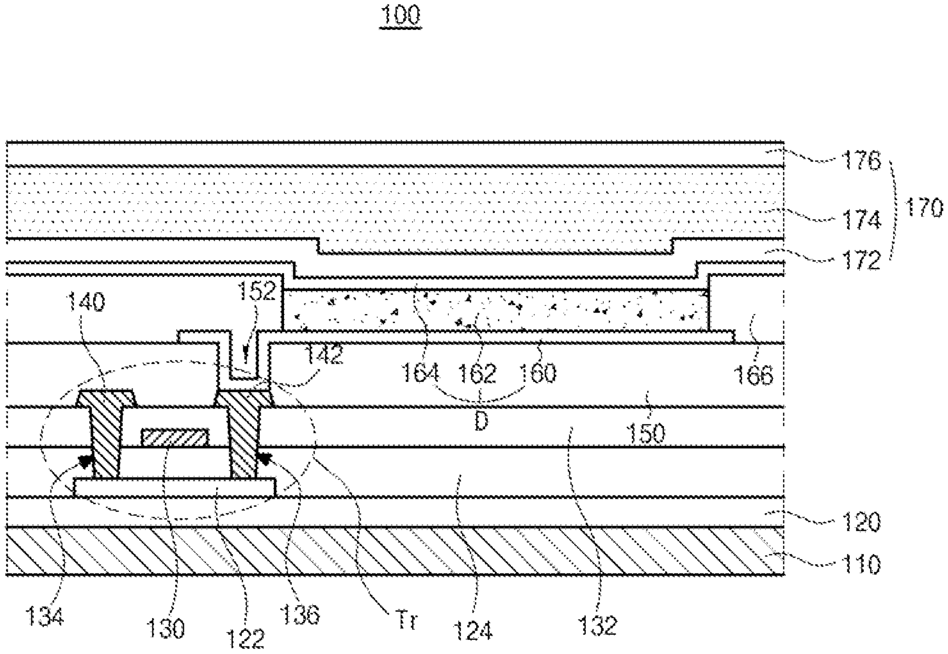
FIG. 2 is a schematic cross-sectional view illustrating an organic light emitting display device according to a first embodiment of the present disclosure.

FIG. 2 is a schematic cross-sectional view illustrating an organic light emitting display device according to a first embodiment of the present disclosure.

As illustrated in FIG. 2, the organic light emitting display device 100 includes a substrate 110, a TFT Tr and an OLED D connected to the TFT Tr. For example, the organic light emitting display device 100 can include a red pixel region, a green pixel region and a blue pixel region, and the OLED D can be formed in each of the red, green and blue pixel regions. Namely, the OLEDs D emitting red light, green light and blue light can be provided in the red, green and blue pixel regions, respectively.

The substrate 110 can be a glass substrate or a flexible substrate. For example, the flexible substrate can be a polyimide (PI) substrate, a polyethersulfone (PES) substrate, a polyethylenenaphthalate (PEN) substrate, a polyethylene terephthalate (PET) substrate or a polycarbonate (PC) substrate.

A buffer layer 120 is formed on the substrate, and the TFT Tr is formed on the buffer layer 120. The buffer layer 120 can be omitted.

A semiconductor layer 122 is formed on the buffer layer 120. The semiconductor layer 122 can include an oxide semiconductor material or polycrystalline silicon.

When the semiconductor layer 122 includes the oxide semiconductor material, a light-shielding pattern can be formed under the semiconductor layer 122. The light to the semiconductor layer 122 is shielded or blocked by the light-shielding pattern such that thermal degradation of the semiconductor layer 122 can be prevented. On the other hand, when the semiconductor layer 122 includes polycrystalline silicon, impurities can be doped into both sides of the semiconductor layer 122.

A gate insulating layer 124 is formed on the semiconductor layer 122. The gate insulating layer 124 can be formed of an inorganic insulating material such as silicon oxide or silicon nitride.

A gate electrode 130, which is formed of a conductive material, e.g., metal, is formed on the gate insulating layer 124 to correspond to a center of the semiconductor layer 122.

In FIG. 2, the gate insulating layer 124 is formed on an entire surface of the substrate 110. Alternatively, the gate insulating layer 124 can be patterned to have the same shape as the gate electrode 130.

An interlayer insulating layer 132, which is formed of an insulating material, is formed on the gate electrode 130. The interlayer insulating layer 132 can be formed of an inorganic insulating material, e.g., silicon oxide or silicon nitride, or an organic insulating material, e.g., benzocyclobutene or photo-acryl.

The interlayer insulating layer 132 includes first and second contact holes 134 and 136 exposing both sides of the semiconductor layer 122. The first and second contact holes 134 and 136 are positioned at both sides of the gate electrode 130 to be spaced apart from the gate electrode 130.

The first and second contact holes 134 and 136 are formed through the gate insulating layer 124. Alternatively, when the gate insulating layer 124 is patterned to have the same shape as the gate electrode 130, the first and second contact holes 134 and 136 is formed only through the interlayer insulating layer 132.

A source electrode 140 and a drain electrode 142, which are formed of a conductive material, e.g., metal, are formed on the interlayer insulating layer 132.

The source electrode 140 and the drain electrode 142 are spaced apart from each other with respect to the gate electrode 130 and respectively contact both sides of the semiconductor layer 122 through the first and second contact holes 134 and 136.

The semiconductor layer 122, the gate electrode 130, the source electrode 140 and the drain electrode 142 constitute the TFT Tr. The TFT Tr serves as a driving element. Namely, the TFT Tr can correspond to the driving TFT Td (of FIG. 1).

In the TFT Tr, the gate electrode 130, the source electrode 140, and the drain electrode 142 are positioned over the semiconductor layer 122. Namely, the TFT Tr has a coplanar structure.

Alternatively, in the TFT Tr, the gate electrode can be positioned under the semiconductor layer, and the source and drain electrodes can be positioned over the semiconductor layer such that the TFT Tr can have an inverted staggered structure. In this instance, the semiconductor layer can include amorphous silicon.

The gate line and the data line cross each other to define the pixel region, and the switching TFT is formed to be connected to the gate and data lines. The switching TFT is connected to the TFT Tr as the driving element.

In addition, the power line, which can be formed to be parallel to and spaced apart from one of the gate and data lines, and the storage capacitor for maintaining the voltage of the gate electrode of the TFT Tr in one frame can be further formed.

A planarization layer 150, which includes a drain contact hole 152 exposing the drain electrode 142 of the TFT Tr, is formed to cover the TFT Tr.

A first electrode 160, which is connected to the drain electrode 142 of the TFT Tr through the drain contact hole 152, is separately formed in each pixel region and on the planarization layer 150. The first electrode 160 can be an anode and can be formed of a conductive material having a relatively high work function. For example, the first electrode 160 can be formed of a transparent conductive material such as indium-tin-oxide (ITO) or indium-zinc-oxide (IZO).

When the organic light emitting display device 100 is operated in a bottom-emission type, the first electrode 160 can have a single-layered structure of the transparent conductive material layer. When the organic light emitting display device 100 is operated in a top-emission type, a reflection electrode or a reflection layer can be formed under the first electrode 160. For example, the reflection electrode or the reflection layer can be formed of silver (Ag) or aluminum-palladium-copper (APC) alloy. In this instance, the first electrode 160 can have a triple-layered structure of ITO/Ag/ITO or ITO/APC/ITO.

A bank layer 166 is formed on the planarization layer 150 to cover an edge of the first electrode 160. Namely, the bank layer 166 is positioned at a boundary of the pixel region and exposes a center of the first electrode 160 in the pixel region.

An organic emitting layer 162 is formed on the first electrode 160. The organic emitting layer 162 includes a single emitting part including an emitting material layer (EML). Alternatively, the organic emitting layer 162 includes a plurality of emitting parts, e.g., at least two emitting parts, each including the EML. In addition, the organic emitting layer 162 can further include a charge generation layer between adjacent emitting parts.

Each emitting part can further include at least one of a hole injection layer (HIL), a hole transporting layer (HTL), an electron blocking layer (EBL), a hole blocking layer (HBL), an electron transporting layer (ETL) and an electron injection layer (EIL) such that each emitting part has a multi-layered structure.

The organic emitting layer 162 is separated in each of the red, green and blue pixel regions. As illustrated below, in the OLED D in the red pixel region, at least one of the EML and the HTL includes a spiro-fluorene derivative (or compound) having a spiro-fluorene core substituted with a deuterium, e.g., a deuterated spiro-fluorene core. As a result, the emitting efficiency and the lifespan of the OLED D and the organic light emitting display device 100 are improved.

The second electrode 164 is formed over the substrate 110 where the organic emitting layer 162 is formed. The second electrode 164 covers an entire surface of the display area and can be formed of a conductive material having a relatively low work function to serve as a cathode. For example, the second electrode 164 can be formed of aluminum (Al), magnesium (Mg), silver (Ag) or their alloy, e.g., Al—Mg alloy (AlMg) or Ag—Mg alloy (MgAg). In the top-emission type organic light emitting display device 100, the second electrode 164 can have a thin profile (small thickness) to provide a light transmittance property (or a semi-transmittance property).

The first electrode 160, the organic emitting layer 162 and the second electrode 164 constitute the OLED D.

An encapsulation film 170 is formed on the second electrode 164 to prevent penetration of moisture into the OLED D. The encapsulation film 170 includes a first inorganic insulating layer 172, an organic insulating layer 174 and a second inorganic insulating layer 176 sequentially stacked, but it is not limited thereto. The encapsulation film 170 can be omitted.

The organic light emitting display device 100 can further include a polarization plate for reducing an ambient light reflection. For example, the polarization plate can be a circular polarization plate. In the bottom-emission type organic light emitting display device 100, the polarization plate can be disposed under the substrate 110. In the top-emission type organic light emitting display device 100, the polarization plate can be disposed on or over the encapsulation film 170.

In addition, in the top-emission type organic light emitting display device 100, a cover window can be attached to the encapsulation film 170 or the polarization plate. In this instance, the substrate 110 and the cover window have a flexible property such that a flexible organic light emitting display device can be provided.

Figure 3:
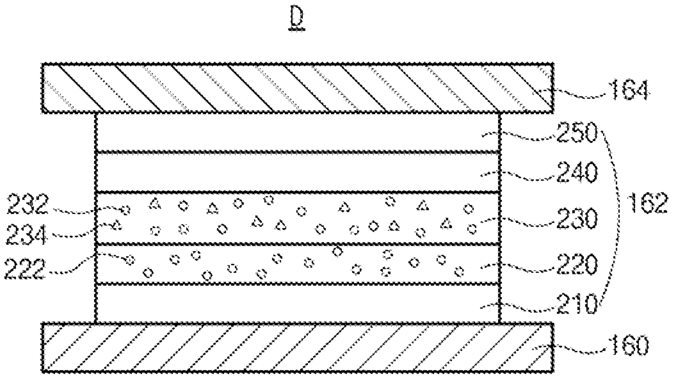
FIG. 3 is a schematic cross-sectional view illustrating an OLED according to a second embodiment.

FIG. 3 is a schematic cross-sectional view illustrating an OLED according to a second embodiment.

As shown in FIG. 3, the OLED D includes the first and second electrodes 160 and 164 facing each other and the organic emitting layer 162 between the first and second electrodes 160 and 164. The organic emitting layer 162 includes a red EML 230 and an HTL 220 under the red EML 230.

The organic light emitting display device 100 (of FIG. 2) can include a red pixel region, a green pixel region and a blue pixel region, and the OLED D can be positioned in the red pixel region.

The first electrode 160 is an anode injecting a hole, and the second electrode 164 is a cathode injecting an electron. One of the first and second electrodes 160 and 164 is a reflection electrode, and the other one of the first and second electrodes 160 and 164 is a transparent electrode (or a semi-transparent electrode).

For example, the first electrode 160 can include a transparent conductive material, e.g., ITO or IZO, and the second electrode 164 can be formed of Al, Mg, Ag, AlMg or MgAg.

The organic emitting layer 162 can further include an ETL 240 on or over the red EML 230. Namely, the HTL 220 is positioned between the red EML 230 and the first electrode 160, and the ETL 240 is positioned between the red EML 230 and the second electrode 164.

The red EML 230, the HTL 220 and the ETL 240 constitute an emitting part.

In addition, the organic emitting layer 162 can further include at least one of an HIL 210 under the HTL 220 and an EIL 250 on the ETL 240.

The organic emitting layer 162 can further include at least one of an EBL between the HTL 220 and the red EML 230 and an HBL between the red EML 230 and the ETL 240.

The red EML 230 includes a host 232 (e.g., a first host) being a first compound. In addition, the red EML 230 can further include a red dopant 234 (e.g., a red emitter). In the red EML 230, a weight % of the host being the first compound can be greater than that of the red dopant 234. The red dopant 234 can be one of a red phosphorescent compound, a red fluorescent compound and a red delayed-fluorescent compound.

In the red EML 230, the red dopant 234 can have a weight % of 1 weight % to 10 weight %, preferablyl weight % to 5 weight %, but it is not limited thereto. The red EML 230 can have a thickness of 30 to 400 Å, preferably100 to 250 Å, but it is not limited thereto.

The HTL 220 includes a hole transporting material 222 being a second compound. The HTL 220 can have a thickness of 500 to 1000 Å, but it is not limited thereto.

Each of the first compound as the host 232 in the red EML 230 and the second compound as the hole transporting material 222 in the HTL 220 is a compound including a spiro-fluorene moiety as a core and an arylamine moiety, and the spiro-fluorene core in at least one of the first and second compounds is partially or wholly deuterated. Namely, a part of hydrogens or all of hydrogens in the spiro-fluorene core in at least one of the first and second compounds are substituted with deuterium.

For example, in both of the first compound as the host 232 in the red EML 230 and the second compound as the hole transporting material 222 in the HTL 220, the spiro-fluorene core can be partially or wholly deuterated.

At least one of the first compound as the host 232 in the red EML 230 and the second compound as the hole transporting material 222 in the HTL 220 is represented by Formula 1-1.

[Formula 1-1]

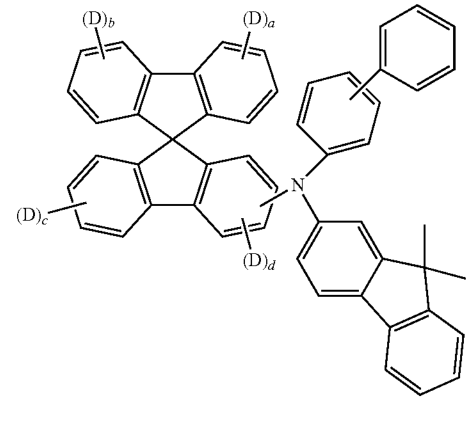

In Formula 1-1, each of a, b and c is independently an integer of 0 to 4, d is an integer of 0 to 3, and at least one of a, b, c and d is a positive integer. In Formula 1-1, D denotes a deuterium atom, and each of a, b, c and d denotes a number of deuterium atom.

For example, in Formula 1-1, the phenyl moiety can be connected to a phenylene moiety at an ortho-position or a para-position with respect to nitrogen atom (N). Namely, the compound in Formula 1-1 can be represented by Formula 1-2 or Formula 1-3.

[Formula 1-2]

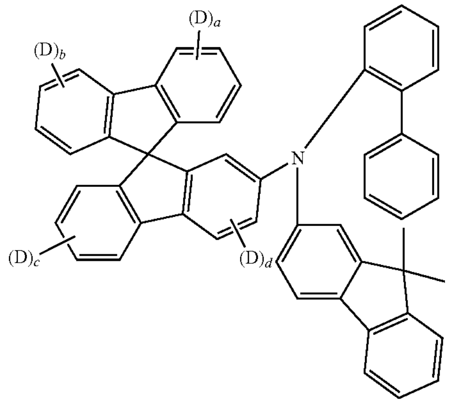

[Formula 1-3]

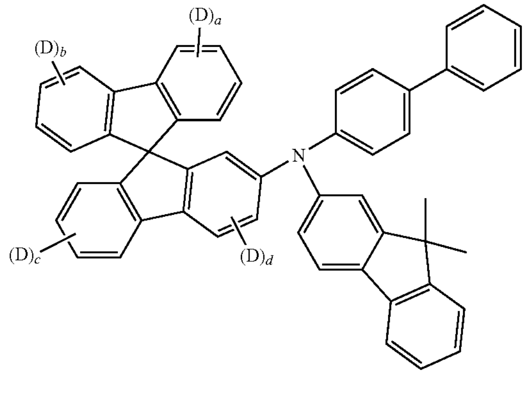

Namely, the compound, which is used as the host 232 in the red EML 230 and/or the hole transporting material 222 in the HTL 220, has a structure, in which the arylamine moiety is bonded (connected or combined) to the spiro-fluorene moiety, and the spiro-fluorene moiety except the arylamine moiety is partially or wholly deuterated.

The compound in Formula 1-1 can be one of the compounds in Formula 2.

[Formula 2]

A-2

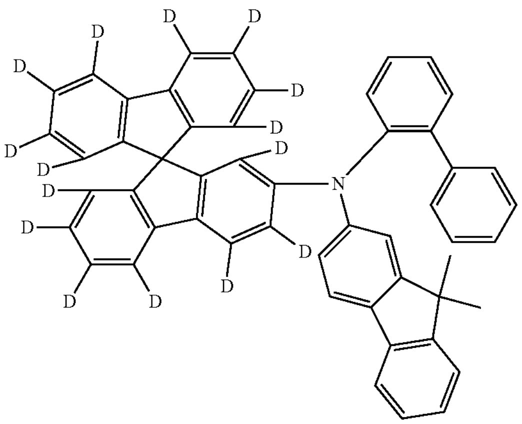

B-2

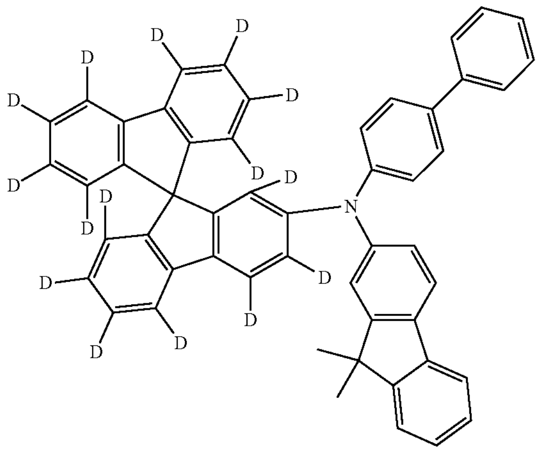

In one embodiment of the present disclosure, the spiro-fluorene core in the first compound as the host 232 in the red EML 230 can be partially or wholly deuterated, and the second compound as the hole transporting material 222 in the HTL 220 may not be deuterated, partially deuterated or wholly deuterated.

In addition, the spiro-fluorene core in the second compound as the hole transporting material 222 in the HTL 220 can be partially or wholly deuterated, the first compound as the host 232 in the red EML 230 may not be deuterated, partially deuterated or wholly deuterated.

When one of the host 232 in the red EML 230 and the hole transporting material 222 in the HTL 220 is the compound of Formula 1-1, the other one of the host 232 in the red EML 230 and the hole transporting material 222 in the HTL 220 can be represented by Formula 3-1.

[Formula 3-1]

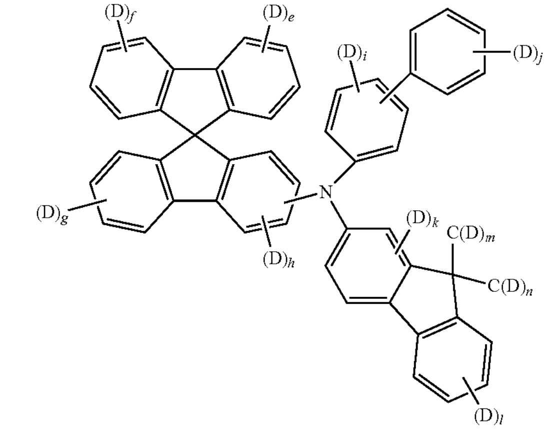

In Formula 3-1, each of e, f, g, i and 1 is independently an integer of 0 to 4, each of h, k, m and n is an integer of 0 to 3, and j is an integer of 0 to 5. In Formula 3-1, each of e to n denotes a number of deuterium atom.

For example, in Formula 3-1, the phenyl moiety can be connected to a phenylene moiety at an ortho-position or a para-position with respect to nitrogen atom (N). Namely, the compound in Formula 3-1 can be represented by Formula 3-2 or Formula 3-3.

[Formula 3-2]

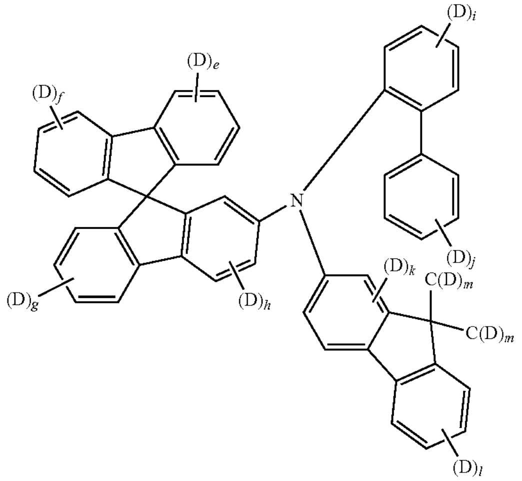

[Formula 3-3]

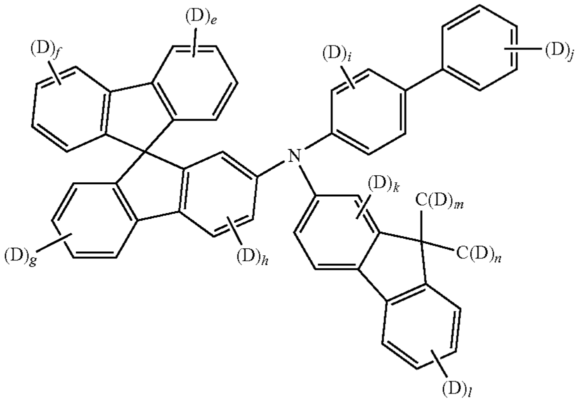

Namely, the compound, which can be used as the host 232 in the red EML 230 or the hole transporting material 222 in the HTL 220, has a structure, in which the arylamine moiety is bonded (connected or combined) to the spiro-fluorene moiety. In this instance, the compound is not deuterated, or the arylamine moiety except the spiro-fluorene moiety is partially or wholly deuterated. Alternatively, the compound, in which the arylamine moiety and the spiro-fluorene moiety are partially or wholly deuterated, can be used as the host 232 in the red EML 230 or the hole transporting material 222 in the HTL 220.

The compound in Formula 3-1 can be one of the compounds in Formula 4.

[Formula 4]

A-1

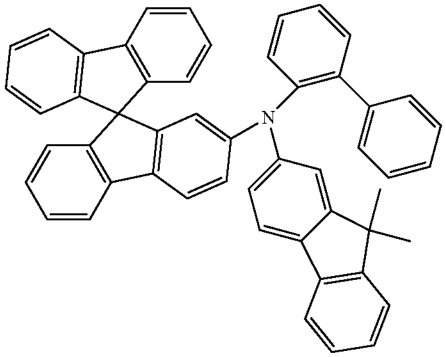

A-3

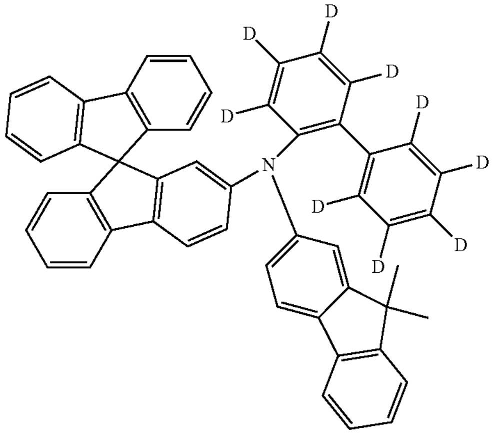

A-4

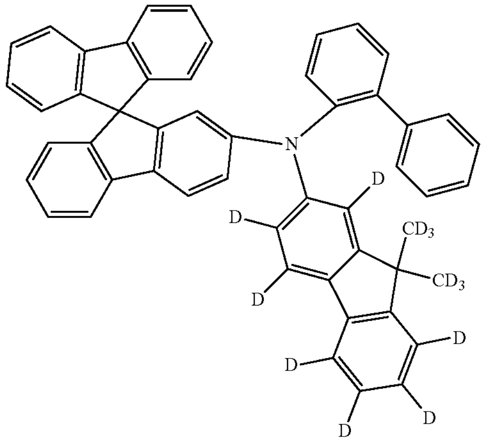

-continued

A-5

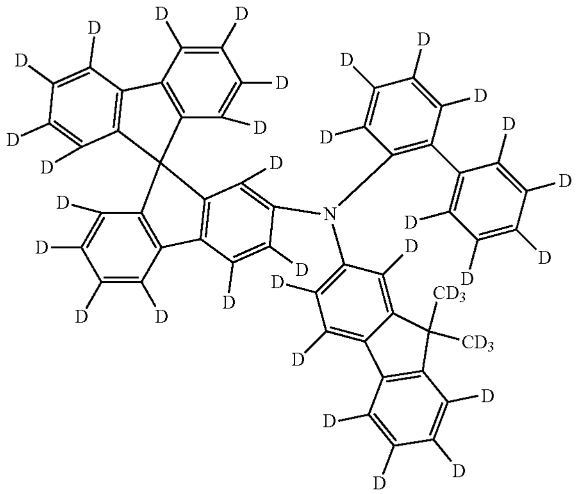

B-1

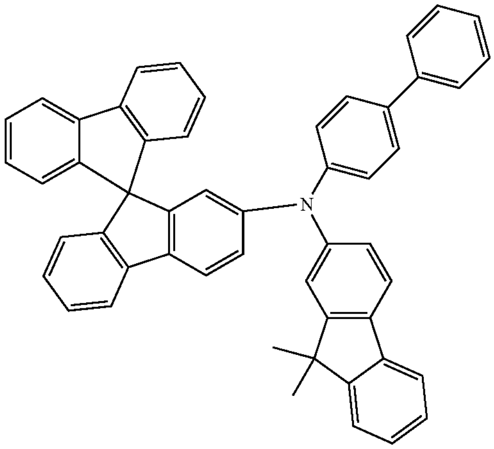

B-3

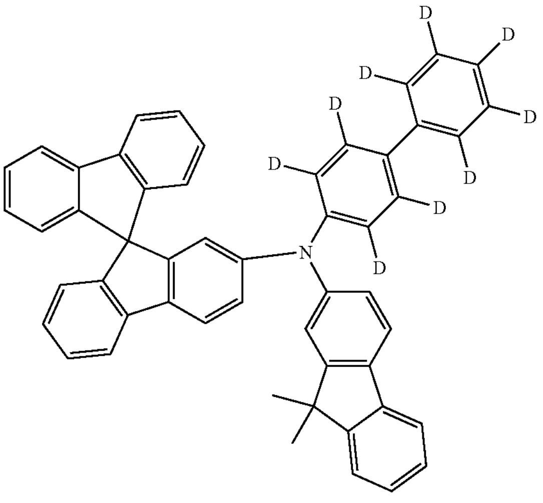

-continued

B-4

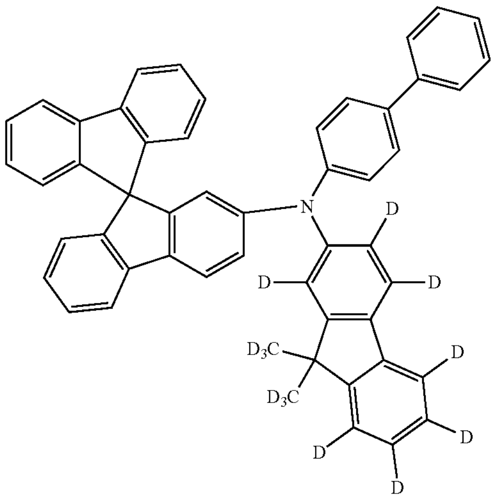

B-5

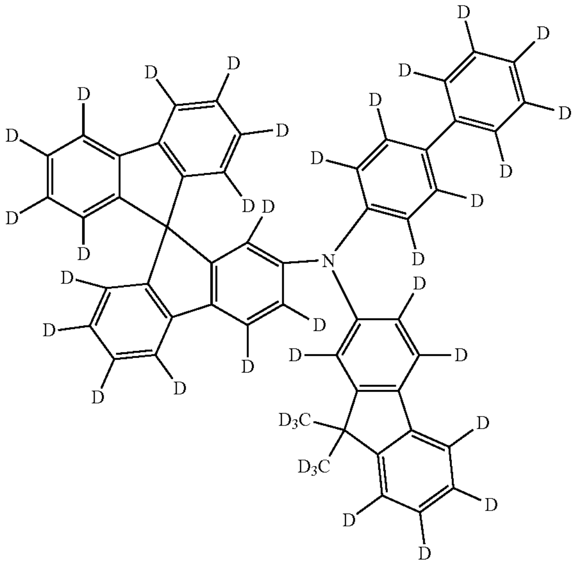

Synthesis

1. Synthesis of the Compound A-1

[Reaction Formula 1]

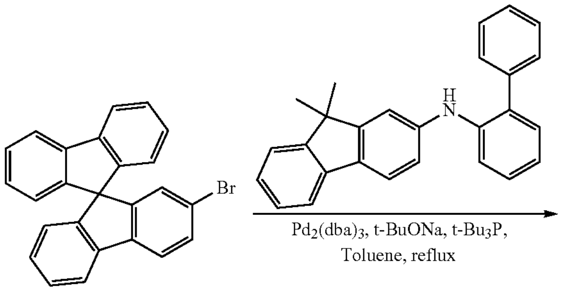

-continued

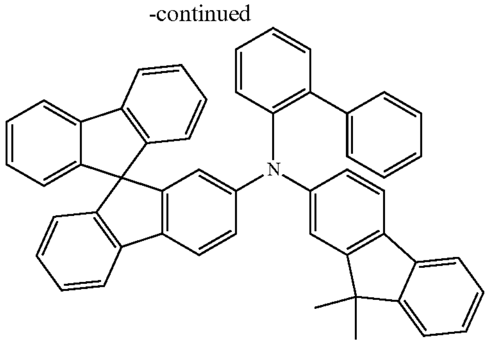

A-1

After dissolving 2-bromo-9,9'-spirobifluorene 9.88 g (25 mmol) in 80 mL of toluene, 8.31 g (23 mmol) of N-(2-biphenylyl)-9,9-dimethyl-9H-fluorene-2-amine was added. Then, 7.20 g (75 mmol) of t-BuONa, 0.4 g (2.5 mmol) of (t-Bu) 3P, and 1.19 g (1.2 mmol) of $Pd_2(dba)_3$ were sequentially added. The mixed solution was reacted while circulating distillation at 110° C. After the reaction is completed, the solution was filtered and the organic layer was separated. Water remaining in the organic layer was removed using $MgSO_4$. The product was separated by performing column chromatography to the organic layer, and the separated product was purified through recrystallization to obtain 6.42 g of the compound A-1. (Yield 38%)

2. Synthesis of the compound A-2

(1) the compound IC-1

[Reaction Formula 2-1]

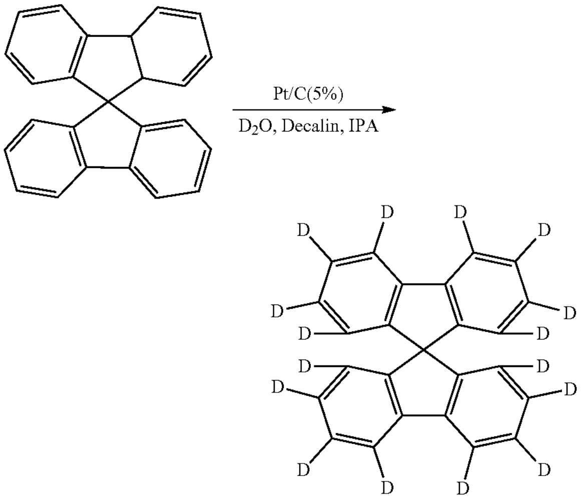

IC-1

7.9 g (25 mmol) of 9,9'-spirobifluorene was dissolved in a mixed solution of 158 mL of $D_2O$, 15.8 mL of IPA, and 316.4 mL of decalin, and then 3.36 g of 5% Pt/C catalyst was added. The mixed solution was stirred at 100° C. for 24 hours in a high-pressure reactor, and then cooled to room temperature. Thereafter, dichloromethane was added to separate the organic layer, and the separated organic layer was dried using $MgSO_4$ and was concentrated. After adding IPA (isopropyl alcohol) to the remaining solution, the precipitated material was filtered to obtain 7 g of the compound IC-1. (Yield 86%)

(2) the Compound IC-2

[Reaction Formula 2-2]

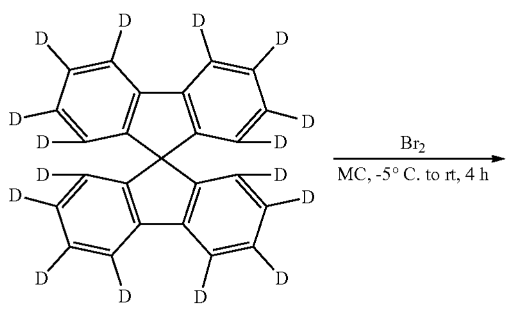

IC-1

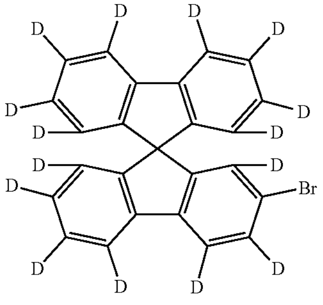

IC-2

After dissolving 7 g of the compound IC-1 in 50 mL of dichloromethane (MC), 3.3 g of $Br_2$ was added at low temperature (−5° C.). It was reacted for 4 hours while slowly raising the temperature to room temperature. After the reaction is completed, 10 mL of 2M $Na_2S_2O_3$ aqueous solution was added to the mixture and stirred. After separating the organic material layer from the mixed solution, the separated material was washed with 10 mL of 10% $Na_2CO_3$ aqueous solution and distilled water. After separating again the organic material layer, water in the organic material layer was removed using $MgSO_4$. After the organic solution was concentrated, an excess of methanol was added to precipitate the product. The product was filtered to obtain 6.2 g of the compound IC-2. (Yield 71%)

(2) the Compound A-2

Reaction Formula 2-3

[Reaction Formula 2-3]

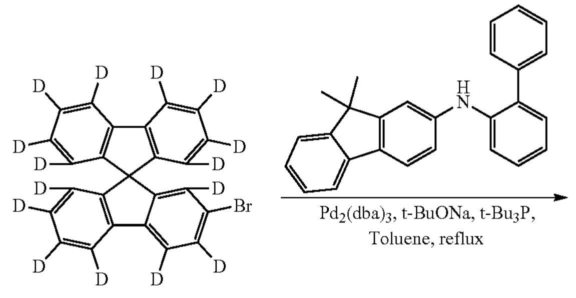

IC-2

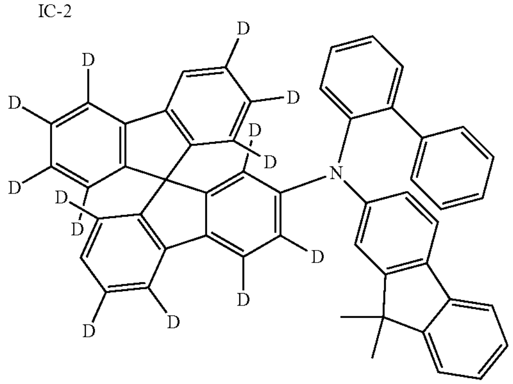

A-2

After dissolving 6.15 g of the compound IC-2 in 60 mL of toluene, 5.15 g of N-(2-biphenylyl)-9,9-dimethyl-9H-fluorene-2-amine was added. Subsequently, 4.32 g of t-BuONa, 0.3 g of (t-Bu) 3P, and 0.69 g of $Pd_2(dba)_3$ were sequentially added. The mixed solution was reacted while circulating distillation at 110° C. After the reaction is completed, the solution was filtered and the organic layer was separated. Water remaining in the organic layer was removed using $MgSO_4$. The product was separated by performing column chromatography to the organic layer, and the separated product was purified through recrystallization to obtain 3.9 g of the compound A-2. (Yield 38%)

3. Synthesis of the Compound A-3

(1) the Compound "Aniline-d5"

[Reaction Formula 3-1]

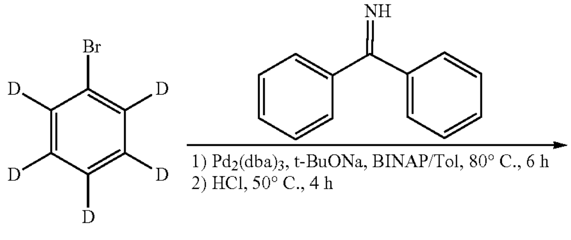

Bromobenzene-d5

-continued

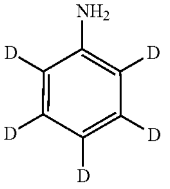

Aniline-d5

After dissolving 16.2 g of bromobenzene-d5 in 120 mL of toluene, 19.9 g of 1,1-diphenylmethanimine was added. Subsequently, 28.8 g of t-BuONa, 6.23 g of BINAP (2,2'-bis(diphenylphosphino)-1,1'-binaphthalene), and 4.58 g of $Pd_2(dba)_3$ were sequentially added. The mixed solution was reacted for 6 hours under a nitrogen atmosphere at a temperature of 80° C. Thereafter, 3N HCl was added to the mixed solution, followed by reaction at 50° C. under a nitrogen atmosphere for 4 hours. After the reaction is completed, the solution was filtered and the organic layer was separated. Water remaining in the organic layer was removed using $MgSO_4$. The product was separated by performing column chromatography on the organic layer, and the separated product was purified through recrystallization to obtain 5.6 g of the compound "Aniline-d5". (Yield 57%)

(2) the Compound IC-3

[Reaction Formula 3-2]

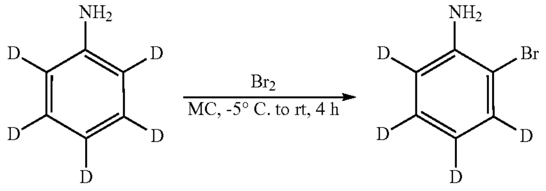

Aniline-d5 IC-3

After dissolving 7 g of the compound "Aniline-d5" in 50 mL of dichloromethane (MC), 8.21 g of $Br_2$ was added at low temperature (−5° C.). It was reacted for 4 hours while slowly raising the temperature to room temperature. After the reaction is completed, 10 mL of 2M $Na_2S_2O_3$ aqueous solution was added to the mixture and stirred. After separating the organic material layer from the mixed solution, the separated material was washed with 10 mL of 10% $Na_2CO_3$ aqueous solution and distilled water. After separating again the organic material layer, water in the organic material layer was removed using $MgSO_4$. After the organic solution was concentrated, an excess of methanol was added to precipitate the product. The product was filtered to obtain 4.1 g of the compound IC-3. (Yield 41%)

(3) the Compound IC-4

[Reaction Formula 3-3]

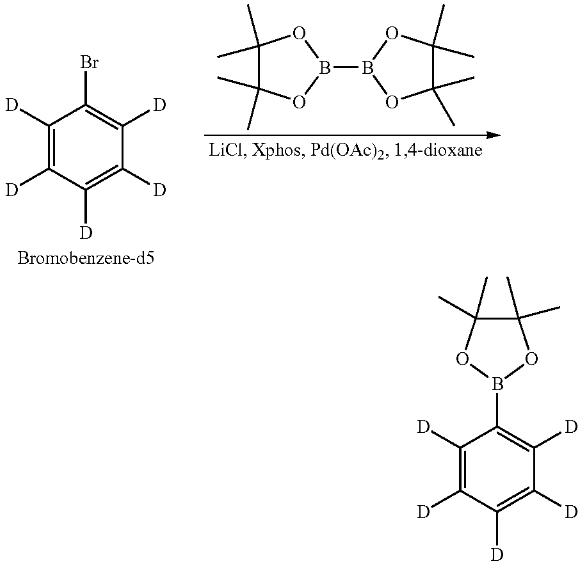

Bromobenzene-d5

IC-4

After dissolving 10.8 g of bromobenzene-d5 in 80 mL of 1,4-dioxane, 18.6 g of bis(pinacolato)diboron was added. Then, 8.48 g of LiCl, 3.18 g of XPhos, and 0.75 g of $Pd(OAc)_2$ were sequentially added. The mixed solution was reacted for 18 hours under a nitrogen atmosphere at a temperature of 90° C. After the reaction is completed, the solution was filtered and the organic layer was separated. Water remaining in the organic layer was removed using $MgSO_4$. The product was separated by performing column chromatography to the organic layer, and the separated product was purified through recrystallization to obtain 12.5 g of the compound IC-4. (Yield 91%)

(4) the Compound IC-5

[Reaction Formula 3-4]

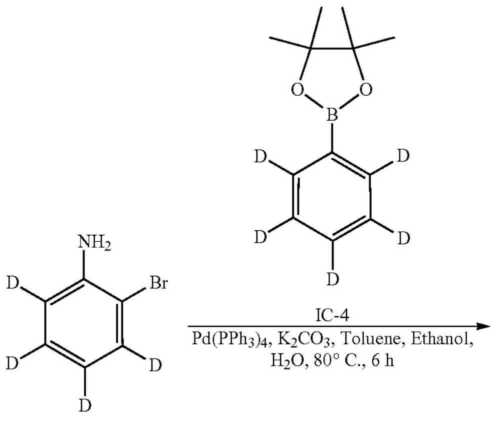

IC-3

-continued

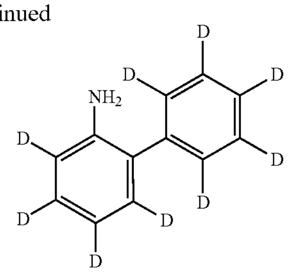

IC-5

After dissolving 4.1 g of the compound IC-3 in 50 mL of toluene, 5.1 g of the compound IC-4 was added. Then, 5 mL of water, 9.7 g of $K_2CO_3$, 5 mL of ethanol, and 1.35 g of $Pd(PPh_3)_4$ were sequentially added. The mixed solution was reacted for 6 hours under a nitrogen atmosphere at a temperature of 80° C. After the reaction is completed, the solution was filtered and the organic layer was separated. Water remaining in the organic layer was removed using $MgSO_4$. The product was separated by performing column chromatography to the organic layer, and the separated product was purified through recrystallization to obtain 2.5 g of the compound IC-5. (Yield 61%)

(4) the Compound IC-7

[Reaction Formula 3-5]

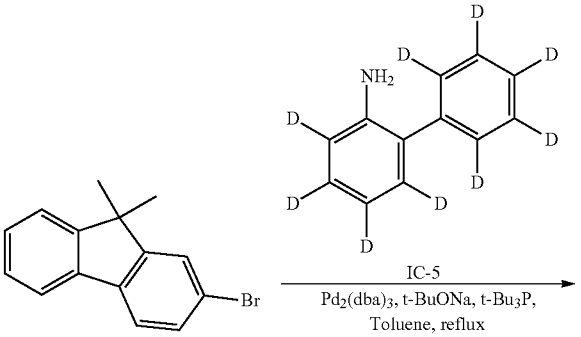

-continued

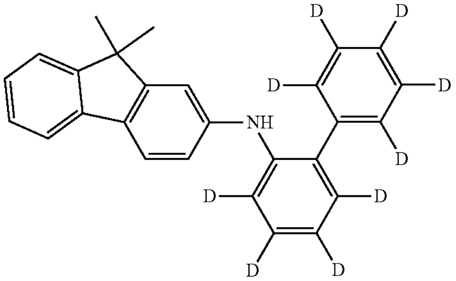

IC-7

After dissolving 5.5 g of 2-bromo-9,9-dimethylfluorene in 60 mL of toluene, 2.87 g of the compound IC-5 was added. Subsequently, 2.1 g of t-BuONa, 0.4 g of (t-Bu) 3P, and 0.92 g of $Pd_2$(dba): were sequentially added. The mixed solution was reacted at 90° C. After the reaction is completed, the solution was filtered and the organic layer was separated. Water remaining in the organic layer was removed using $MgSO_4$. The product was separated by performing column chromatography to the organic layer, and the separated product was purified through recrystallization to obtain 3 g of the compound IC-7. (Yield 40%)

(6) the Compound A-3

[Reaction Formula 3-6]

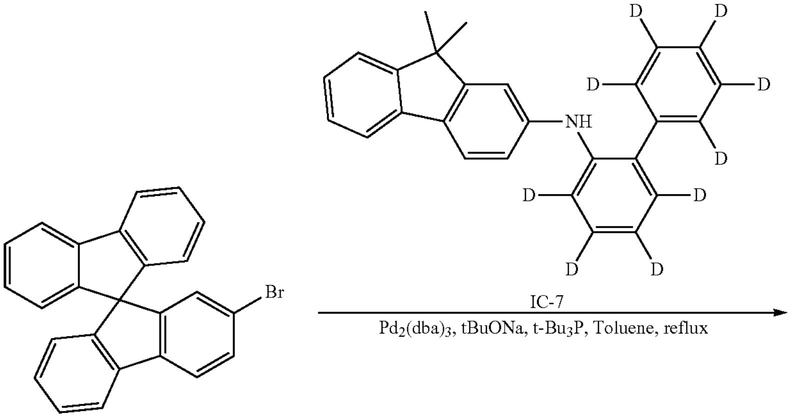

-continued

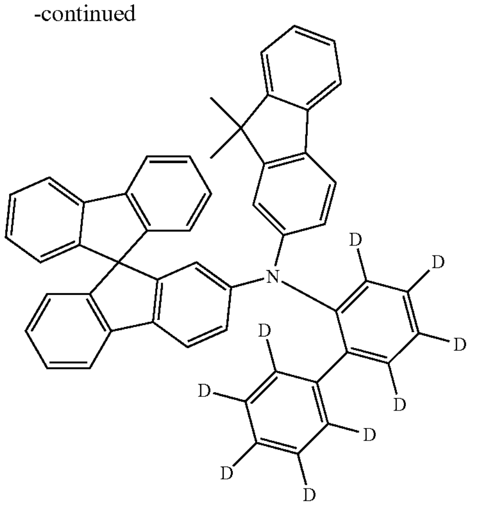

A-3

After dissolving 6 g of 2-bromo-9,9'-spirobilfluorene in 60 mL of toluene, 5.3 g of the compound IC-7 was added. Subsequently, 4.38 g of t-BuONa, 0.31 g of (t-Bu) 3P, and 0.69 g of $Pd_2(dba)_3$ were sequentially added. The mixed solution was reacted while circulating distillation under a nitrogen atmosphere. After the reaction is completed, the solution was filtered and the organic layer was separated. Water remaining in the organic layer was removed using $MgSO_4$. The product was separated by performing column chromatography to the organic layer, and the separated product was purified through recrystallization to obtain 4 g of the compound A-3. (Yield 39%)

4. Synthesis of the Compound A-4

(1) the compound IC-8

[Reaction Formula 4-1]

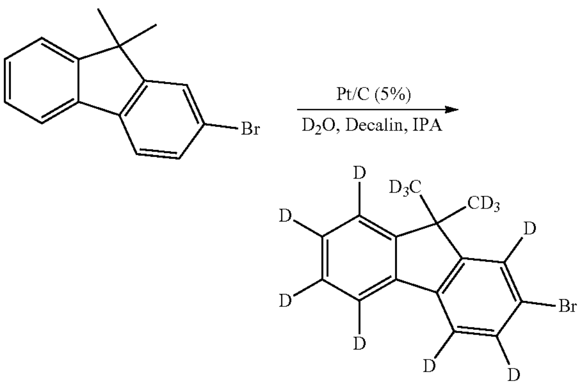

IC-8

6.8 g of 2-bromo-9,9-dimethylfluorene was dissolved in a mixed solution of 137 mL of $D_2O$, 14 mL of IPA, and 273 mL of decalin, and 2.9 g of a 5% Pt/C catalyst was added. The mixed solution was stirred at 100° C. for 24 hours in a high-pressure reactor, and then cooled to room temperature. Thereafter, dichloromethane was added to separate the organic layer, and the separated organic layer was dried using $MgSO_4$. The remaining solution was concentrated. After IPA was added to the concentrated solution, the precipitated material was filtered to obtain the compound IC-8 (6.15 g).

(2) the Compound IC-9

[Reaction Formula 4-2]

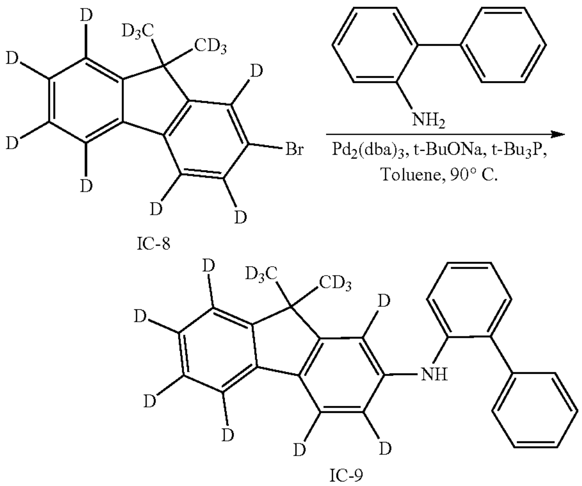

IC-8

IC-9

After dissolving 3 g of the compound IC-8 in 40 mL of toluene, 1.42 g of [1,1'-biphenyl]-2-amine was added. Subsequently, 1.1 g of t-BuONa, 0.21 g of (t-Bu) 3P, and 0.48 g of $Pd_2(dba)_3$ were sequentially added. The mixed solution was reacted at 90° C. After the reaction is completed, the solution was filtered and the organic layer was separated. Water remaining in the organic layer was removed using $MgSO_4$. The product was separated by performing column chromatography to the organic layer, and the separated product was purified through recrystallization to obtain 1.6 g of the compound IC-9. (Yield 40%)

(3) the Compound A-4
[Reaction Formula 4-3]
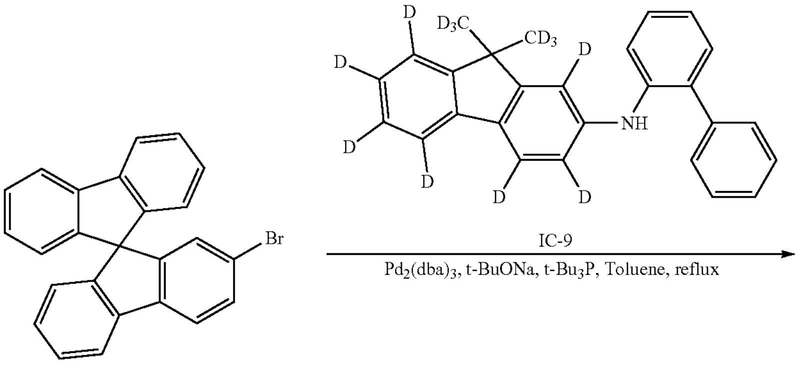
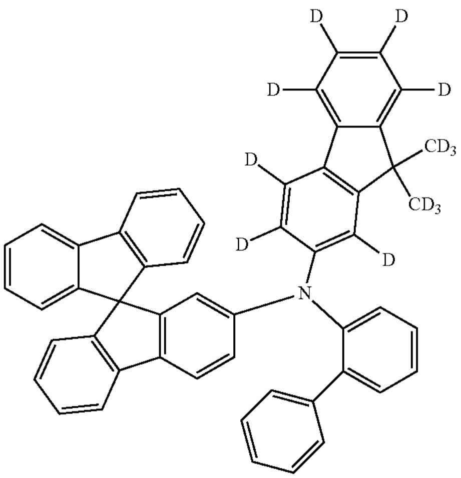
A-4

After dissolving 6 g of 2-bromo-9,9'-spirobilfluorene in 60 mL of toluene, 5.4 g of the compound IC-9 was added. Subsequently, 4.38 g of t-BuONa, 0.31 g of (t-Bu) 3P, and 0.69 g of $Pd_2(dba)_3$ were sequentially added. The mixed solution was reacted while circulating distillation under a nitrogen atmosphere. After the reaction is completed, the solution was filtered and the organic layer was separated. Water remaining in the organic layer was removed using $MgSO_4$. The product was separated by performing column chromatography to the organic layer, and the separated product was purified through recrystallization to obtain 4 g of the compound A-4. (Yield 39%)

5. Synthesis of the Compound A-5

(1) The Compound IC-10

[Reaction Formula 5-1]

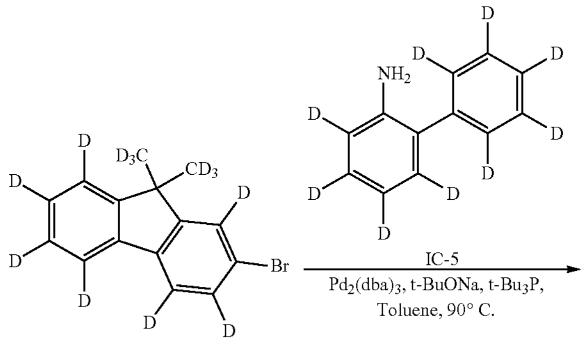

IC-8

-continued

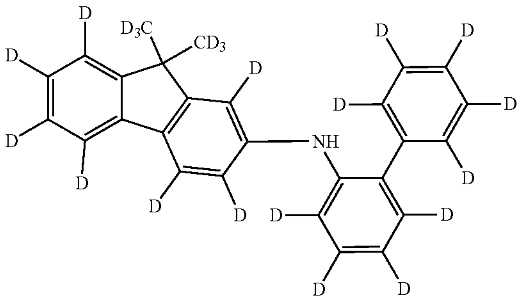

IC-10

After dissolving 3 g of the compound IC-8 in 40 mL of toluene, 1.49 g of the compound IC-5 was added. Subsequently, 1.11 g of t-BuONa, 0.21 g of (t-Bu) 3P, and 0.48 g of $Pd_2(dba)_3$ were sequentially added. The mixed solution was reacted at 90° C. After the reaction is completed, the solution was filtered and the organic layer was separated. Water remaining in the organic layer was removed using $MgSO_4$. The product was separated by performing column chromatography to the organic layer, and the separated product was purified through recrystallization to obtain 1.65 g of the compound IC-10. (Yield 41%)

(2) the Compound A-5

[Reaction Formula 5-2]

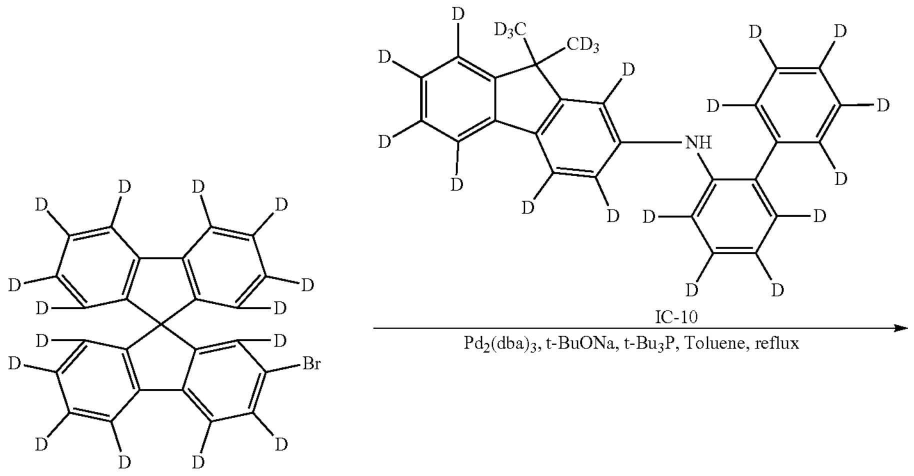

IC-2

-continued

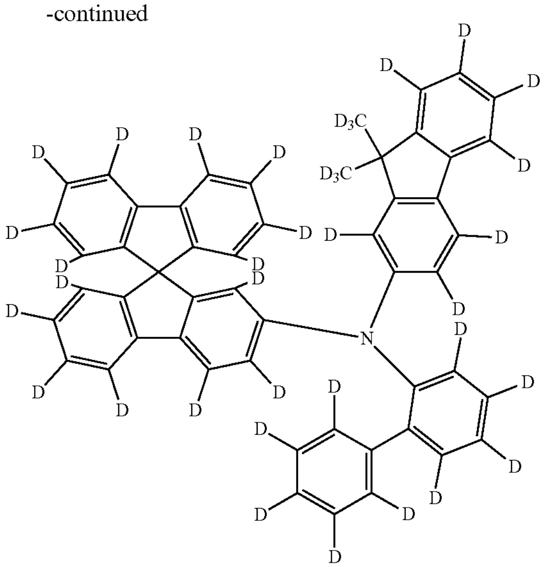

A-5

After dissolving 6 g of the compound IC-2 in 60 mL of toluene, 5.33 g of the compound IC-10 was added. Subsequently, 4.22 g of t-BuONa, 0.30 g of (t-Bu) 3P, and 0.67 g of $Pd_2(dba)_3$ were sequentially added. The mixed solution was reacted while circulating distillation under a nitrogen atmosphere. After the reaction is completed, the solution was filtered and the organic layer was separated. Water remaining in the organic layer was removed using $MgSO_4$. The product was separated by performing column chromatography to the organic layer, and the separated product was purified through recrystallization to obtain 3.73 g of the compound A-5. (Yield 37%)

6. Synthesis of the Compound B-1

[Reaction Formula 6]

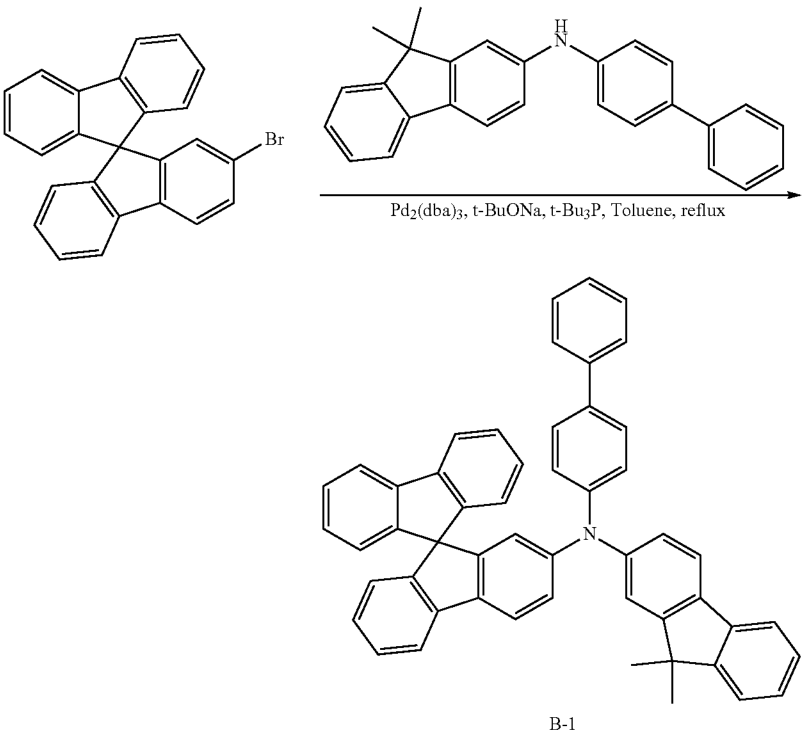

B-1

After dissolving 9.88 g (25 mmol) of 2-bromo-9,9'-spirobifluorene in 80 mL of toluene, 8.31 g (23 mmol) of N-(4-biphenylyl)-9,9-dimethyl-9H-fluorene-2-amine was added. Then, 7.20 g (75 mmol) of t-BuONa, 0.4 g (2.5 mmol) of (t-Bu) 3P, and 1.19 g (1.2 mmol) of $Pd_2(dba)_3$ were sequentially added. The mixed solution was reacted while circulating distillation at 110° C. After the reaction is completed, the solution was filtered and the organic layer was separated. Water remaining in the organic layer was removed using $MgSO_4$. The product was separated by performing column chromatography to the organic layer, and the separated product was purified through recrystallization to obtain 6.4 g of the compound B-1. (Yield 37%)

7. Synthesis of the Compound B-2

[Reaction Formula 7]

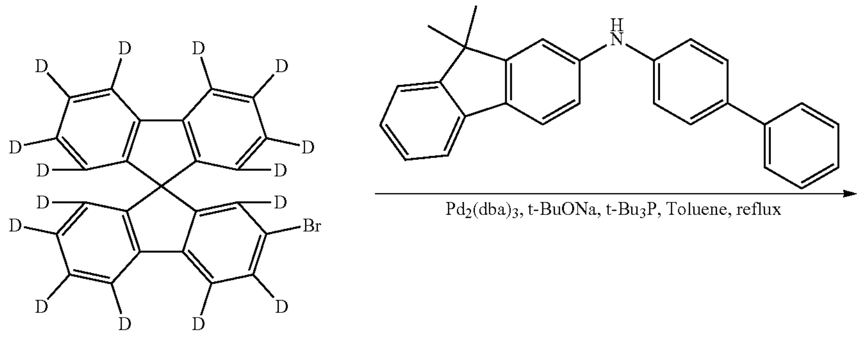

IC-2

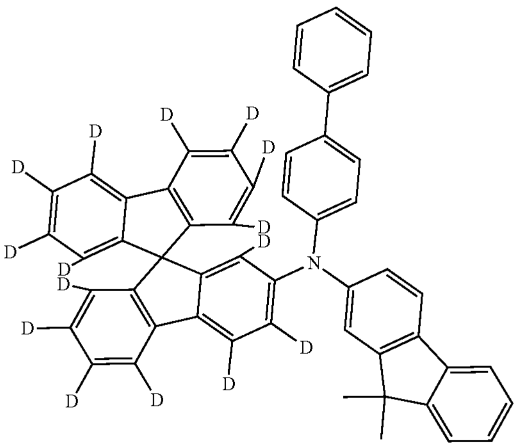

B-2

After dissolving 6.15 g of the compound IC-2 in 60 mL of toluene, 5.15 g of N-(4-biphenylyl)-9,9-dimethyl-9H-fluorene-2-amine was added. Subsequently, 4.32 g of t-BuONa, 0.3 g of (t-Bu) 3P, and 0.69 g of $Pd_2(dba)_3$ were sequentially added. The mixed solution was reacted while circulating distillation at 110° C. After the reaction is completed, the solution was filtered and the organic layer was separated. Water remaining in the organic layer was removed using $MgSO_4$. The product was separated by performing column chromatography to the organic layer, and the separated product was purified through recrystallization to obtain 3.9 g of the compound B-2. (Yield 38%)

8. Synthesis of the Compound B-3

(1) the Compound IC-11

[Reaction Formula 8-1]

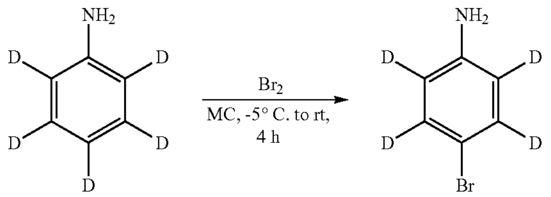

IC-11

After dissolving 5.6 g of the compound "Aniline-d5" in 50 mL of dichloromethane (MC), 8.21 g of $Br_2$ was added at low temperature (−5° C.). It was reacted for 4 hours while slowly raising the temperature to room temperature. After the reaction is completed, 10 mL of 2M $Na_2S_2O_3$ aqueous solution was added to the mixture and stirred. After separating the organic material layer from the mixed solution, the separated material was washed with 10 mL of 10% $Na_2CO_3$ aqueous solution and distilled water. After separating again the organic material layer, water in the organic material layer was removed using $MgSO_4$. After the organic solution was concentrated, an excess of methanol was added to precipitate the product. The product was filtered to obtain 4.1 g of the compound IC-11. (Yield 41%)

(2) the Compound IC-12

[Reaction Formula 8-2]

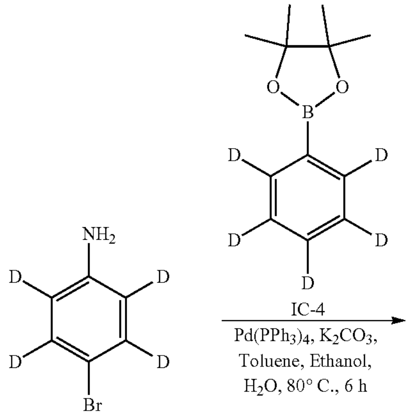

IC-11

-continued

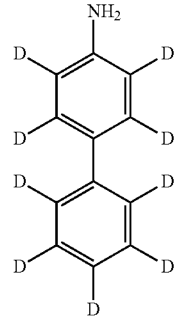

IC-12

After dissolving 4.1 g of the compound IC-11 in 50 mL of toluene, 5.1 g of the compound IC-4 was added. Then, 5 mL of water, 9.7 g of $K_2CO_3$, 5 mL of ethanol, and 1.35 g of $Pd(PPh_3)_4$ were sequentially added. The mixed solution was reacted for 6 hours under a nitrogen atmosphere at a temperature of 80° C. After the reaction is completed, the solution was filtered and the organic layer was separated. Water remaining in the organic layer was removed using $MgSO_4$. The product was separated by performing column chromatography to the organic layer, and the separated product was purified through recrystallization to obtain 2.5 g of the compound IC-12. (Yield 61%)

(3) the Compound IC-13

[Reaction Formula 8-3]

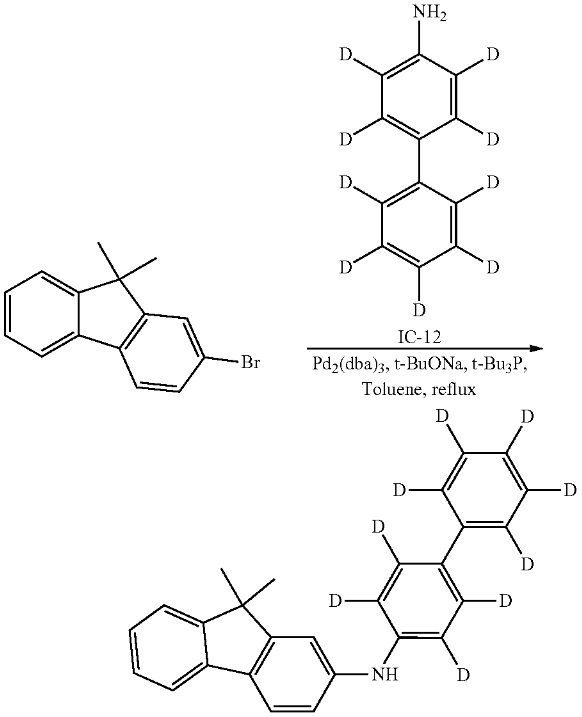

IC-13

After dissolving 5.5 g of 2-bromo-9,9-dimethylfluorene in 60 mL of toluene, 2.87 g of the compound IC-12 was added. Subsequently, 2.1 g of t-BuONa, 0.4 g of (t-Bu) 3P, and 0.92 g of $Pd_2(dba)_3$ were sequentially added. The mixed solution was reacted at 90° C. After the reaction is completed, the solution was filtered and the organic layer was separated. Water remaining in the organic layer was removed using $MgSO_4$. The product was separated by performing column chromatography to the organic layer, and the separated product was purified through recrystallization to obtain 3 g of the compound IC-13. (Yield 40%)

(4) the Compound B-3

[Reaction Formula 8-4]

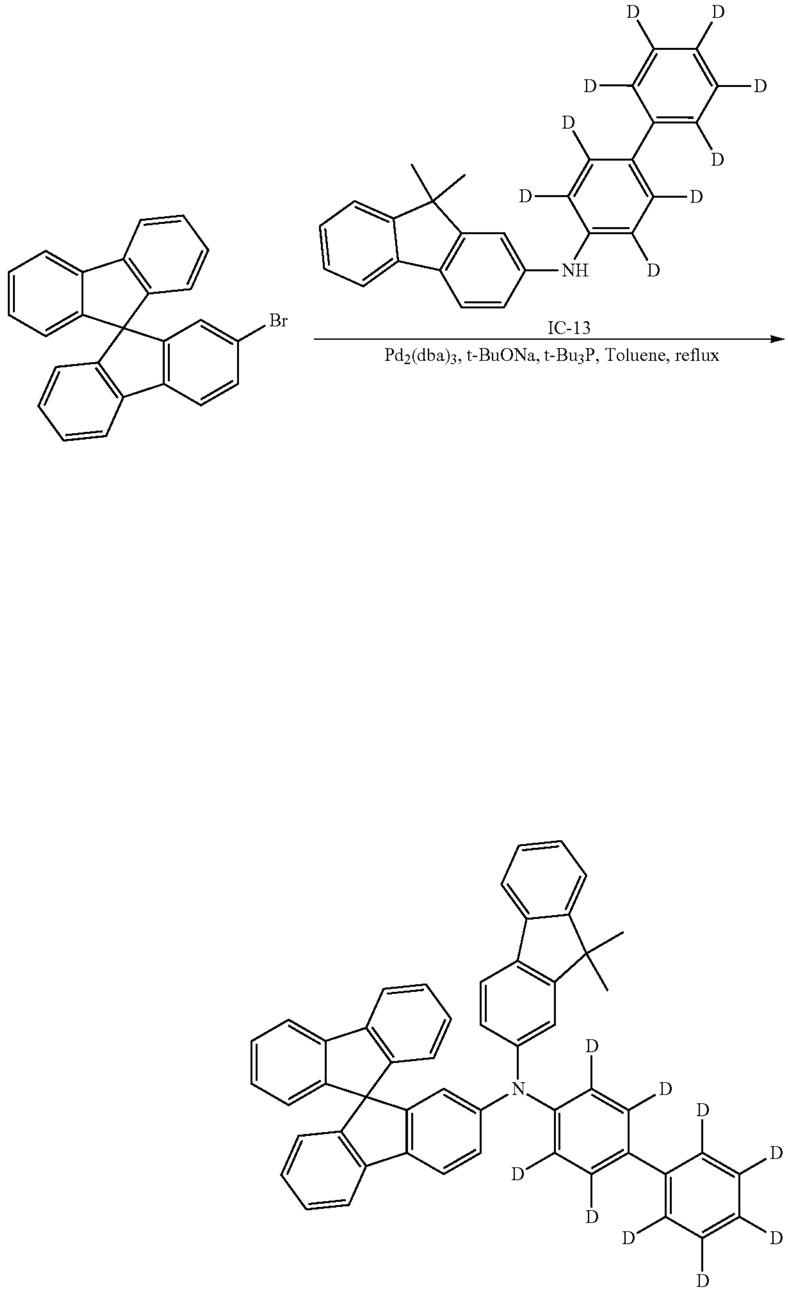

B-3

After dissolving 6 g of 2-bromo-9,9'-spirobilfluorene in 60 mL of toluene, 5.3 g of the compound IC-13 was added. Subsequently, 4.38 g of t-BuONa, 0.31 g of (t-Bu) 3P, and 0.69 g of $Pd_2(dba)_3$ were sequentially added. The mixed solution was reacted while circulating distillation under a nitrogen atmosphere. After the reaction is completed, the solution was filtered and the organic layer was separated. Water remaining in the organic layer was removed using $MgSO_4$. The product was separated by performing column chromatography to the organic layer, and the separated product was purified through recrystallization to obtain 4 g of the compound B-3. (Yield 39%)

9. Synthesis of the Compound B-4

(1) the Compound IC-14

[Reaction Formula 9-1]

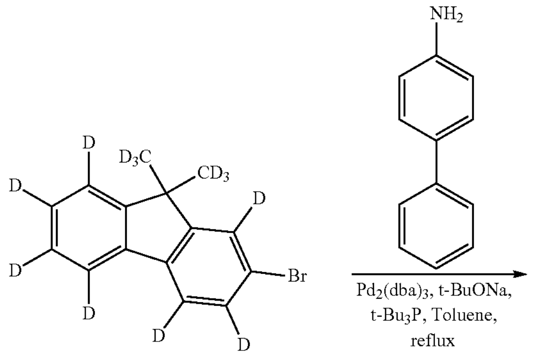

IC-8

-continued

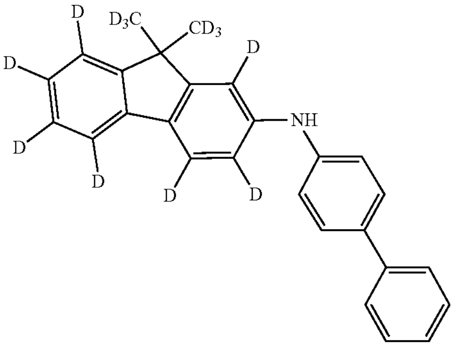

IC-14

After dissolving 3 g of the compound IC-8 in 40 mL of toluene, 1.42 g of [1,1'-biphenyl]-4-amine was added. Subsequently, 1.1 g of t-BuONa, 0.21 g of (t-Bu) 3P, and 0.48 g of $Pd_2(dba)_3$ were sequentially added. The mixed solution was reacted at 90° C. After the reaction is completed, the solution was filtered and the organic layer was separated. Water remaining in the organic layer was removed using $MgSO_4$. The product was separated by performing column chromatography to the organic layer, and the separated product was purified through recrystallization to obtain 1.6 g of the compound IC-14. (Yield 40%)

(2) the Compound B-4

[Reaction Formula 9-2]

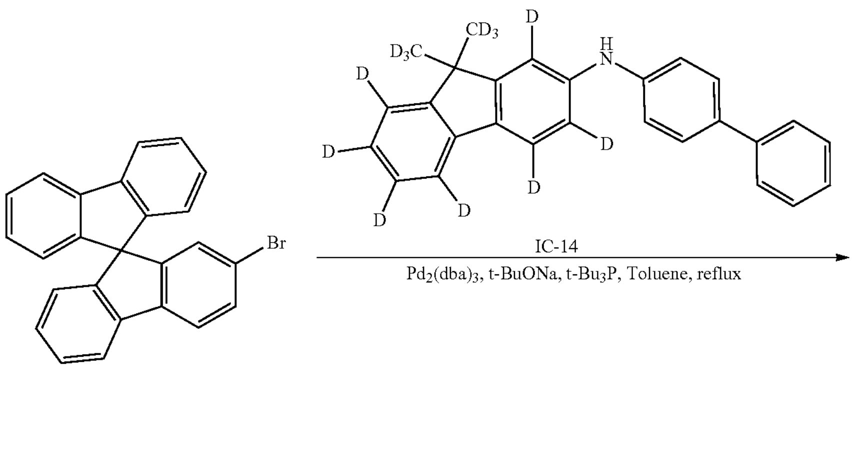

-continued

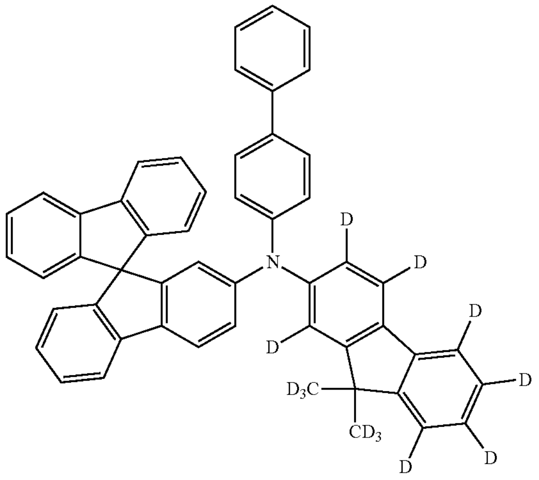

B-4

After dissolving 6 g of 2-bromo-9,9'-spirobilfluorene in 60 mL of toluene, 5.4 g of the compound IC-14 was added. Subsequently, 4.38 g of t-BuONa, 0.31 g of (t-Bu) 3P, and 0.69 g of $Pd_2(dba)_3$ were sequentially added. The mixed solution was reacted while circulating distillation under a nitrogen atmosphere. After the reaction is completed, the solution was filtered and the organic layer was separated. Water remaining in the organic layer was removed using $MgSO_4$. The product was separated by performing column chromatography to the organic layer, and the separated product was purified through recrystallization to obtain 4 g of the compound B-4. (Yield 39%)

10. Synthesis of the Compound B-5

(1) the Compound IC-15

[Reaction Formula 10-1]

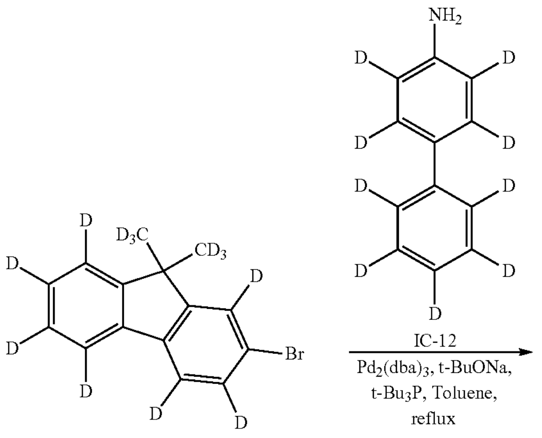

IC-8

-continued

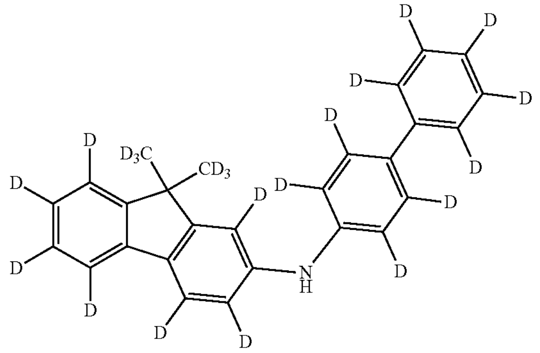

IC-15

After dissolving 3 g of the compound IC-8 in 40 mL of toluene, 1.49 g of the compound IC-12 was added. Subsequently, 1.11 g of t-BuONa, 0.21 g of (t-Bu) 3P, and 0.48 g of $Pd_2(dba)_3$ were sequentially added. The mixed solution was reacted at 90° C. After the reaction is completed, the solution was filtered and the organic layer was separated. Water remaining in the organic layer was removed using $MgSO_4$. The product was separated by performing column chromatography to the organic layer, and the separated product was purified through recrystallization to obtain 1.65 g of the compound IC-15. (Yield 41%)

(2) the Compound B-5

[Reaction Formula 10-2]

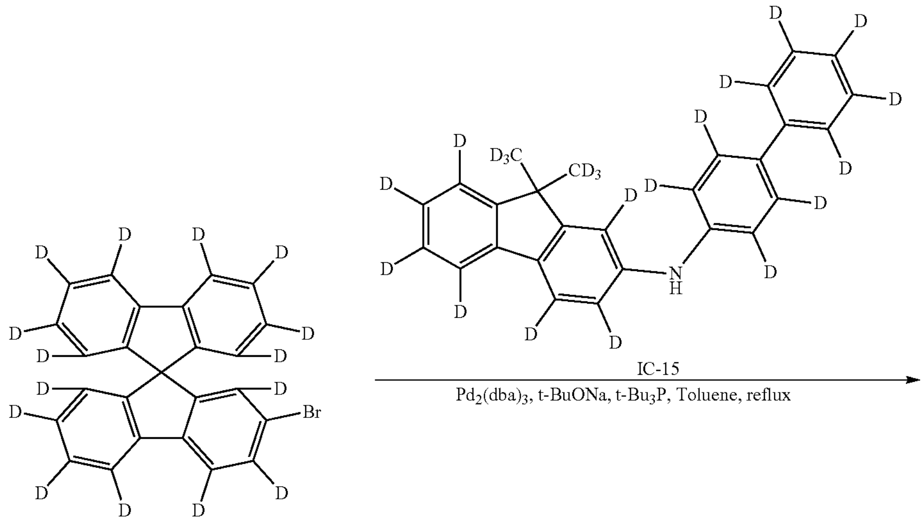

IC-2

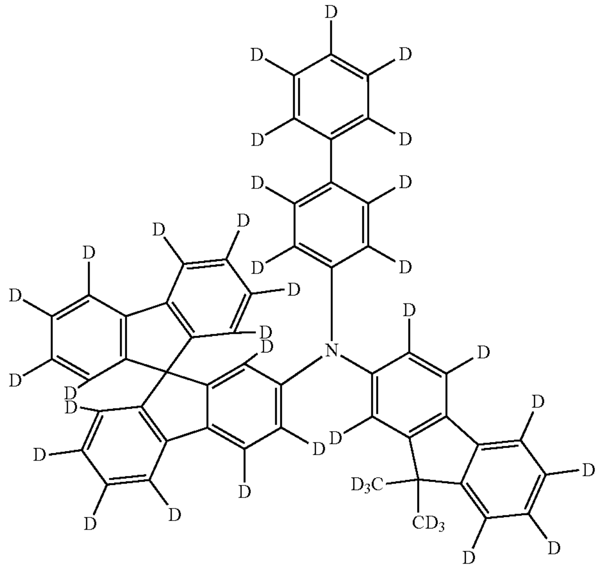

B-5

After dissolving 6 g of the compound IC-2 in 60 mL of toluene, 5.33 g of the compound IC-15 was added. Subsequently, 4.22 g of t-BuONa, 0.30 g of (t-Bu) 3P, and 0.67 g of $Pd_2(dba)_3$ were sequentially added. The mixed solution was reacted while circulating distillation under a nitrogen atmosphere. After the reaction is completed, the solution was filtered and the organic layer was separated. Water remaining in the organic layer was removed using $MgSO_4$. The product was separated by performing column chromatography to the organic layer, and the separated product was purified through recrystallization to obtain 3.73 g of the compound B-5. (Yield 37%)

In the HTL 220 and the red EML 230 being disposed to contact each other, the second compound as the hole transporting material 222 and the first compound as the host 232 have the same or similar chemical structure such that an interfacial property between the HTL 220 and the red EML 230 is improved.

When the hole transporting material 222 in the HTL 220 and the host 232 in the red EML 230 are the compound of Formula 1-1, the hole transporting material 222 in the HTL 220 and the host 232 in the red EML 230 are same or different.

For example, the red dopant 234 can be represented by Formula 5, but it is not limited thereto.

[Formula 5]

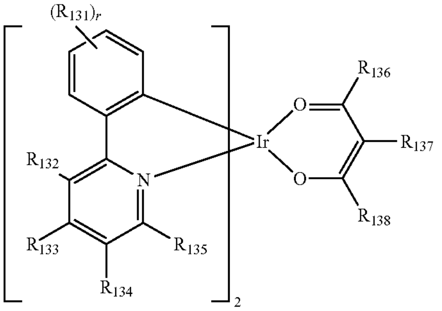

In Formula 5, $R_{131}$ is selected from the group consisting of deuterium, halogen atom, $C_1$ to $C_6$ alkyl group, $C_3$ to $C_6$ cycloalkyl group, $C_6$ to $C_{10}$ aryl group and $C_3$ to $C_{10}$ heteroaryl group, and r is an integer of 0 to 4. Each of $R_{132}$ to $R_{135}$ is independently selected from the group consisting of hydrogen, deuterium, halogen atom, $C_1$ to $C_6$ alkyl group, $C_3$ to $C_6$ cycloalkyl group, $C_6$ to $C_{10}$ aryl group and a $C_3$ to $C_{10}$ heteroaryl group, and at least adjacent two of $R_{132}$ to $R_{135}$ are connected to form a $C_6$ to $C_{10}$ aromatic ring (e.g., a fused ring). Each of $R_{136}$ to $R_{138}$ is independently selected from the group consisting of hydrogen, deuterium and $C_1$ to $C_6$ alkyl group.

In the present disclosure, aryl group can be selected from the group consisting of phenyl group, biphenyl group, terphenyl group, naphthyl group, anthracenyl group, pentalenyl group, indenyl group, indenoindenyl group, heptalenyl group, biphenylenyl group, indacenyl group, phenalenyl group, phenanthrenyl group, benzophenanthrenyl group, dibenzophenanthrenyl group, azulenyl group, pyrenyl group, fluoranthenyl group, triphenylenyl group, chrysenyl group, tetraphenyl group, tetracenyl group, pleiadenyl group, picenyl group, pentaphenyl group, pentacenyl group, fluorenyl group, indenofluorenyl group, and spiro-fluorenyl group without specific definition. In addition to being a divalent group, the above definition of the aryl group can be applied to arylene group.

In the present disclosure, heteroaryl group can be selected from the group consisting of pyrrolyl group, pyridinyl group, pyrimidinyl group, pyrazinyl group, pyridazinyl group, triazinyl group, tetrazinyl group, imidazolyl group, pyrazolyl group, indolyl group, isoindolyl group, indazolyl group, indolizinyl group, pyrrolizinyl group, carbazolyl group, benzocarbazolyl group, dibenzocarbazolyl group, indolocarbazolyl group, indenocarbazolyl group, benzofurocarbazolyl group, benzothienocarbazolyl group, quinolinyl group, isoquinolinyl group, phthalazinyl group, quinoxalinyl group, cinnolinyl group, quinazolinyl group, quinolizinyl group, purinyl group, benzoquinolinyl group, benzoisoquinolinyl group, benzoquinazolinyl group, benzoquinoxalinyl group, acridinyl group, phenanthrolinyl group, perimidinyl group, phenanthridinyl group, pteridinyl group, cinnolinyl group, naphtharidinyl group, furanyl group, pyranyl group, oxazinyl group, oxazolyl group, oxadiazolyl group, triazolyl group, dioxinyl group, benzofuranyl group, dibenzofuranyl group, thiopyranyl group, xanthenyl group, chromaenyl group, isochromenyl group, thioazinyl group, thiophenyl group, benzothiophenyl group, dibenzothiophenyl group, difuropyrazinyl group, benzofurodibenzofuranyl group, benzothienobenzothiophenyl group, benzothienodibenzothiophenyl group, benzothienobenzofuranyl group, and benzothienodibenzofuranyl group without specific definition. In addition to being a divalent group, the above definition of the heteroaryl group can be applied to heteroarylene group.

The red dopant can be one of the compounds in Formula 6, but it is not limited thereto.

[Formula 6]

M1

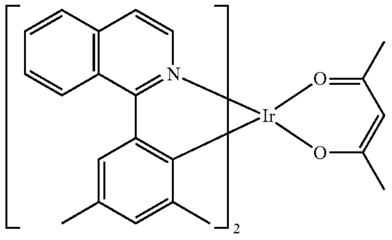

M2

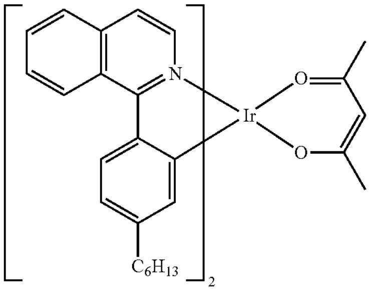

M3

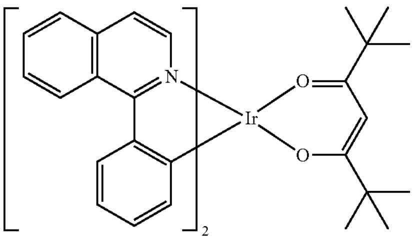

M4

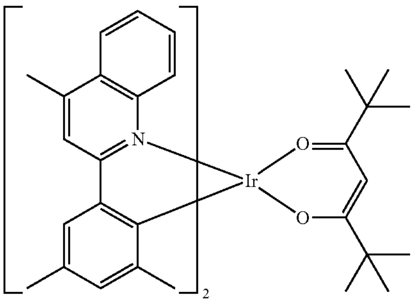

M5

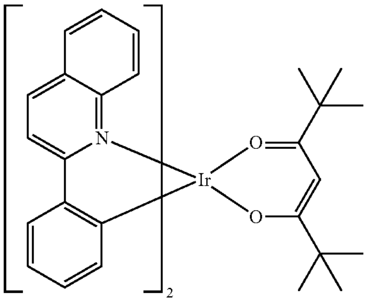

-continued

M6

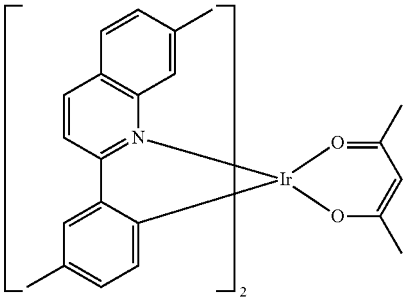

M7

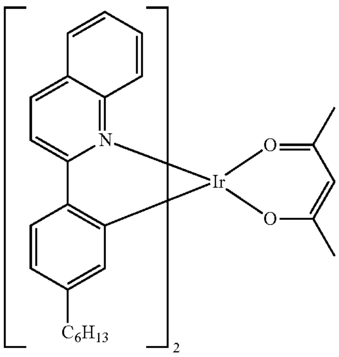

M8

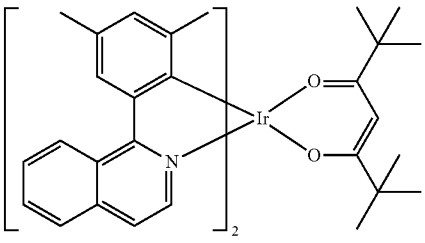

The red EML 230 can further include a second host. Namely, in the red EML 230, the first host 232 can act as a P-type host, and the second host can act as an N-type host.

The second host in the red EML 230 can be a quinazoline-carbazole derivative and can be represented by Formula 7.

[Formula 7]

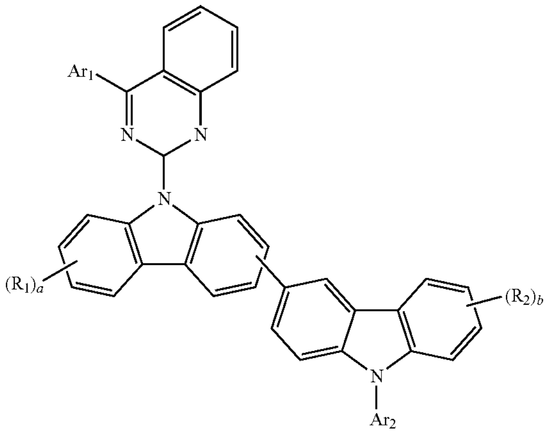

In Formula 7, each of $Ar_1$ and $Ar_2$ is independently selected from the group consisting of hydrogen and $C_6$ to $C_{30}$ aryl group. Each of a and b is independently an integer of 0 to 4. Each of $R_1$ and $R_2$ is independently selected from the group consisting of hydrogen, $C_1$ to $C_{10}$ alkyl group and $C_6$ to $C_{30}$ aryl group, or adjacent two of $R_1$ and/or adjacent two of $R_2$ are connected to each other to form a fused ring.

For example, $Ar_1$ can be phenyl, and $Ar_2$ can be phenyl, biphenylyl, naphthyl or naphthyl-phenyl. $R_1$ can be hydrogen, or adjacent two of $R_1$ can be connected to form the fused ring. $R_2$ can be hydrogen, or adjacent two of $R_2$ can be connected to form the fused ring.

For example, the second host of the red EML 230 can be one of the compounds in Formula 8, but it is not limited thereto.

[Formula 8]

N-1

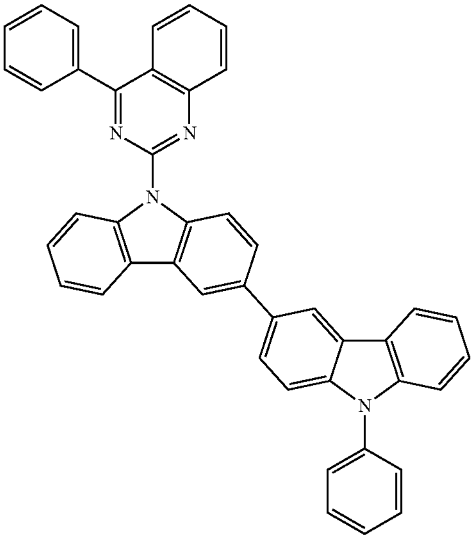

N-2

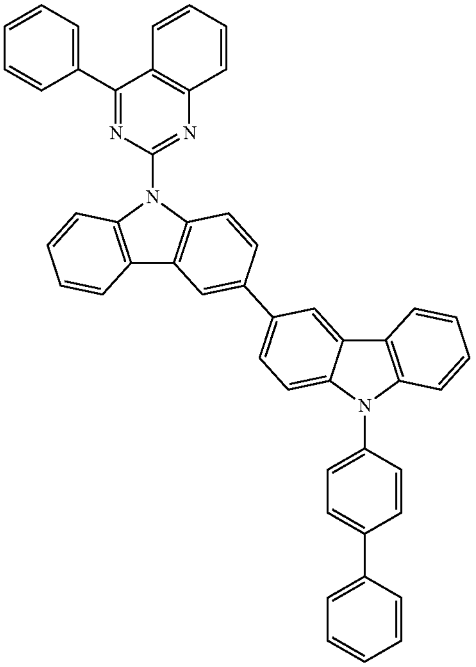

N-3
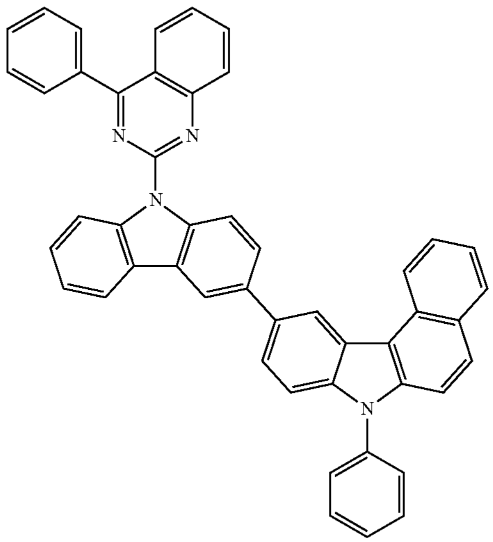
N-4
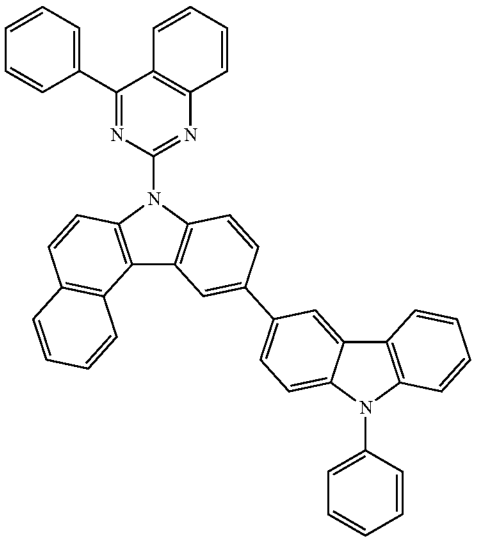
N-5
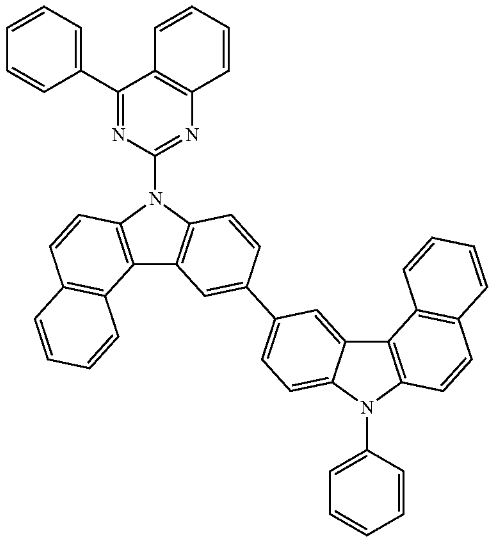
N-6
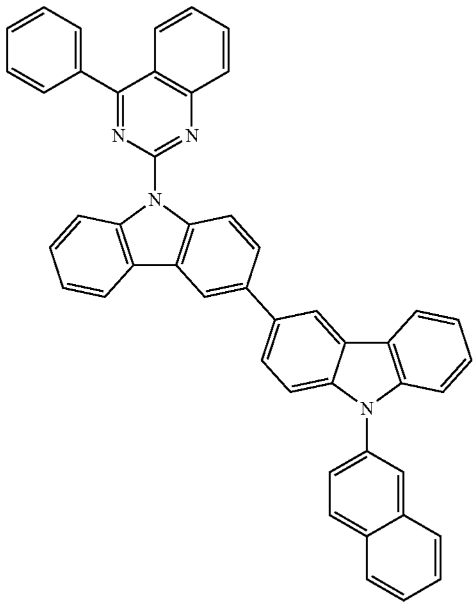
N-7
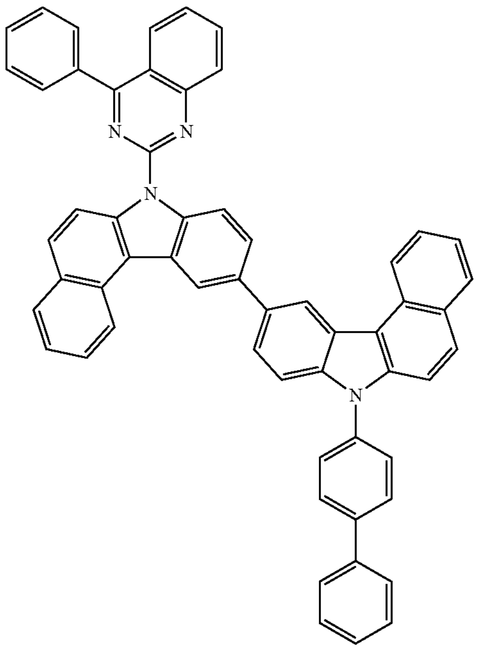

-continued

N-8

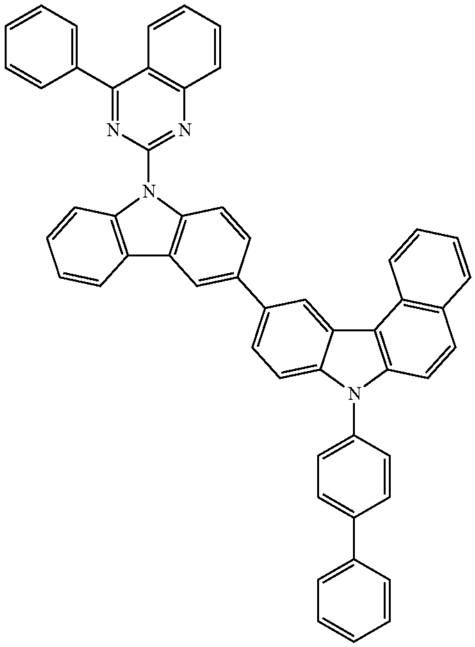

N-9

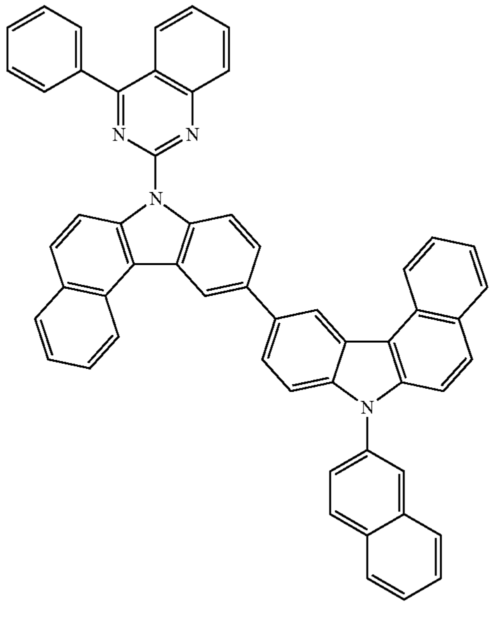

-continued

N-10

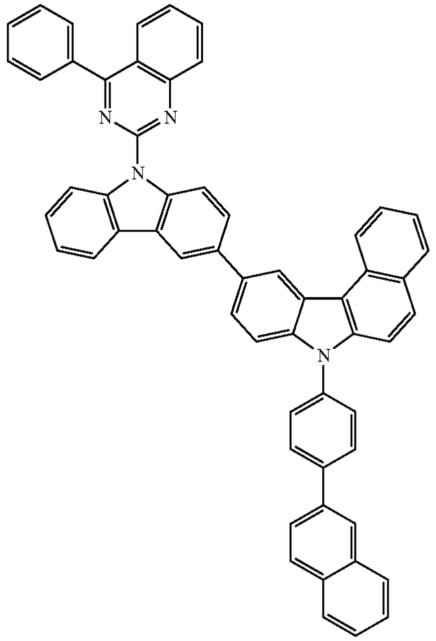

N-11

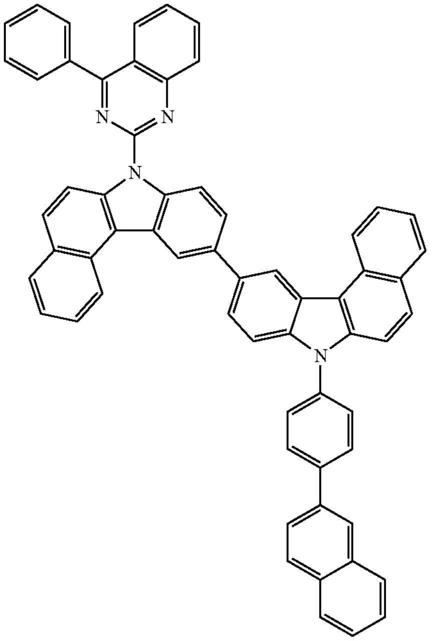

For example, the HIL 210 can include at least one compound selected from the group consisting of 4,4',4"-tris (3-methylphenylamino)triphenylamine (MTDATA), 4,4',4"-tris(N,N-diphenyl-amino)triphenylamine (NATA), 4,4',4"-tris(N-(naphthalene-1-yl)-N-phenyl-amino)triphenylamine (IT-NATA), 4,4',4"-tris(N-(naphthalene-2-yl)-N-phenyl-amino)triphenylamine (2T-NATA), copper phthalocyanine (CuPc), tris(4-carbazoyl-9-yl-phenyl)amine (TCTA), N,N'-diphenyl-N,N'-bis(1-naphthyl)-1,1'-biphenyl-4,4"-diamine (NPB or NPD), 1,4,5,8,9,11-hexaazatriphenylenehexacarbonitrile (dipyrazino [2,3-f: 2'3'-h]quinoxaline-2,3,6,7,10,11-hexacarbonitrile) (HAT-CN), 1,3,5-tris [4-(diphenylamino) phenyl]benzene (TDAPB), poly(3,4-ethylenedioxythiphene) polystyrene sulfonate (PEDOT/

PSS), and N-(biphenyl-4-yl)-9,9-dimethyl-N-(4-(9-phenyl-9H-carbazol-3-yl)phenyl)-9H-fluoren-2-amine.

Alternatively, the HIL 210 can include an anthracene derivative in Formula 9 as a first hole injection material.

[Formula 9]

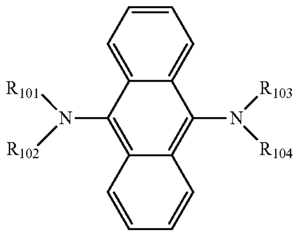

In Formula 9, each of $R_{101}$ to $R_{104}$ can be independently $C_6$ to $C_{30}$ aryl which is optionally substituted with $C_1$ to $C_{10}$ alkyl.

For example, each of $R_{101}$ to $R_{104}$ can be independently selected from the group consisting of phenyl, naphthyl (e.g., 1-naphthyl or 2-naphthyl) and phenanthrenyl and can be substituted with $C_1$ to $C_{10}$ alkyl.

The anthracene derivative in Formula 9 can be one of the compounds in Formula 10, but it is not limited thereto.

[Formula 10]

J1

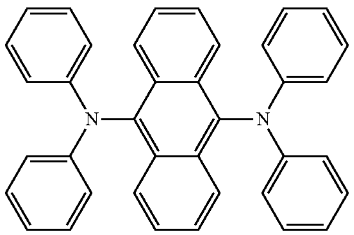

J2

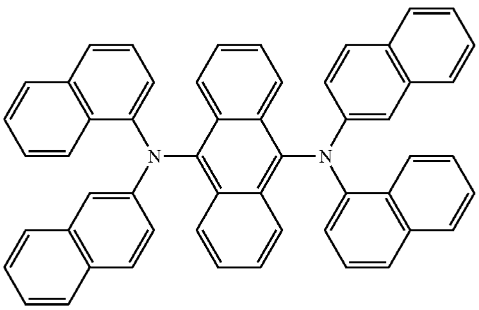

-continued

J3

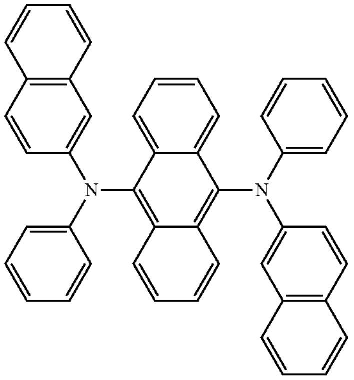

J4

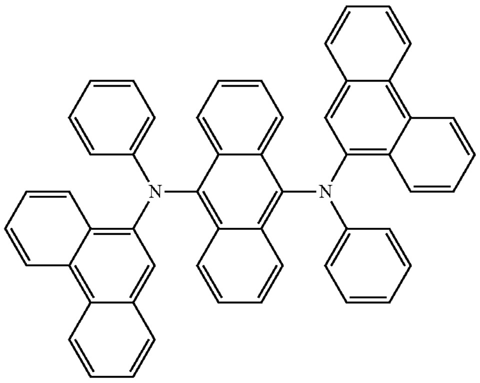

J5

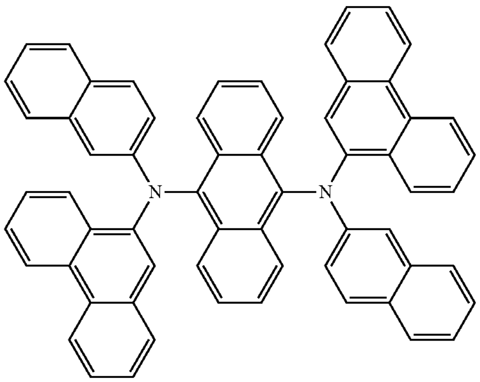

J6

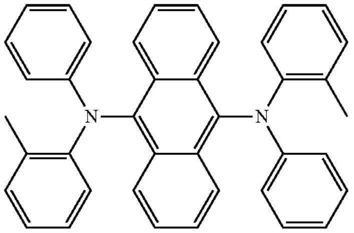

-continued

J7

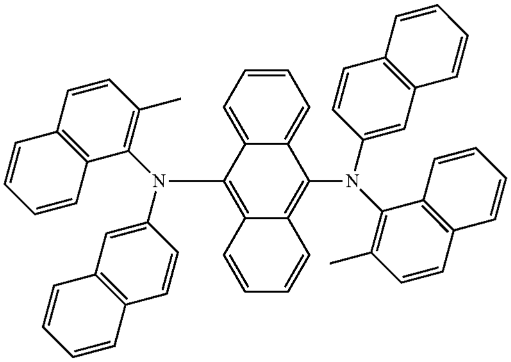

J8

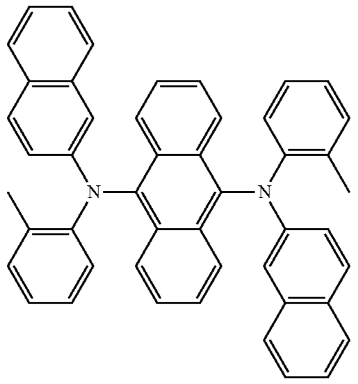

J9

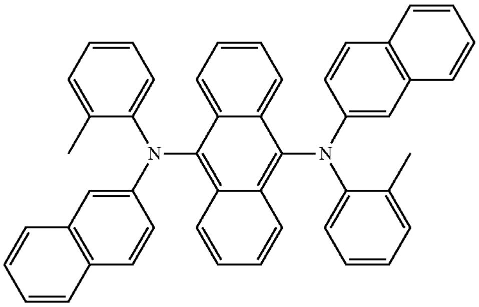

J10

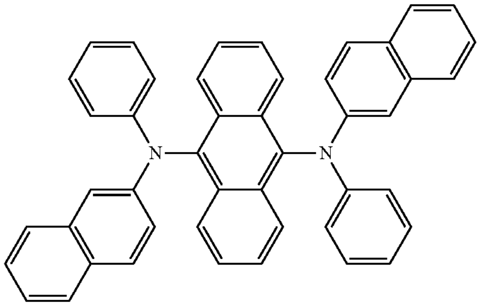

The HIL 210 can further include a halide compound of alkali metal or a halide compound of alkali earth metal as a second hole injection material. For example, the second hole injection material can include at least one of LiF, $MgF_2$, $CaF_2$, NaF and CsF.

In the HIL 210, a weight ratio of the first hole injection material to the second hole injection material can be 8:2 to 5:5, and the HIL 210 can have a thickness of about 10 to 100 Å. However, the present disclosure is not limited thereto.

The ETL 240 can include at least one of 1,3,5-tri (m-pyridin-3-ylphenyl)benzene (TmPyPB), 2,2',2"-(1,3,5-benzen-etriyl)-tris(1-phenyl-1-H benzimidazole) (TPBi), tris(8-hydroxy-quinolinato)aluminum (Alq3), 2-(4-biphenyl)-5-(4-tert-butylphenyl)-1,3,4-oxadiazole (PBD), 3-(4-biphenyl)-4-phenyl-5-tert-butylphenyl-1,2,4-triazole (TAZ), 2-biphenyl-4-yl-4,6-bis-(4'-pyridin-2-yl-biphenyl-4-yl)-[1,3,5]triazine (DPT), bis(2-methyl-8-quinolinolate)-4-(phenylphenolato)aluminum (BAlq), but it is not limited thereto.

Alternatively, the ETL 240 can include at least one of an azine derivative (e.g., an azene derivative) of Formula 11 and a benzimidazole derivative (e.g., an azole derivative) of Formula 12.

[Formula 11]

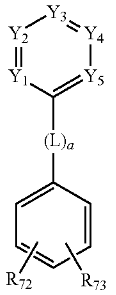

[Formula 12]

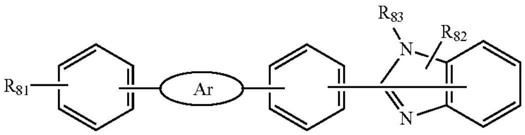

In Formula 11, each of $Y_1$ to $Y_5$ is independently $CR_{71}$ or nitrogen atom (N), and one to three of $Y_1$ to $Y_5$ is N. $R_{71}$ is hydrogen or $C_6$ to $C_{30}$ aryl group, and L is $C_6$ to $C_{30}$ arylene group. Each of $R_{72}$ and $R_{73}$ is independently selected from the group consisting of hydrogen, and C5 to C30 heteroaryl group, and at least one of $R_{72}$ and $R_{73}$ is C5 to C30 heteroaryl group. In addition, a is 0 or 1.

In Formula 12, Ar is C1 to C30 arylene group, and $R_{81}$ is C6 to C30 aryl group or C5 to C30 heteroaryl group, each of the $C_6$-$C_{30}$ aryl and the $C_5$-$C_{30}$ hetero aryl is optionally substituted with $C_1$-$C_{10}$ alkyl. Each of $R_{82}$ and $R_{83}$ is independently hydrogen, $C_1$ to $C_{10}$ alkyl group or $C_6$ to $C_{30}$ aryl group.

In Formula 11, one or two of $Y_1$ to $Y_5$ can be N. $R_{72}$ and $R_{73}$ can be carbazolyl, and L can be phenylene.

In Formula 12, Ar can be naphthylene or anthracenylene, and $R_{81}$ can be phenyl unsubstituted or substituted with $C_1$ to $C_{10}$ alkyl, or benzimidazole group. $R_{82}$ can be methyl, ethyl or phenyl, and $R_{83}$ can be hydrogen, a methyl group or a phenyl group . . .

For example, the compound in Formula 11 as a first electron transporting material can be one of the compounds in Formula 13, and the compound in Formula 12 as a second electron transporting material can be one of the compounds in Formula 14.

[Formula 13]
F1
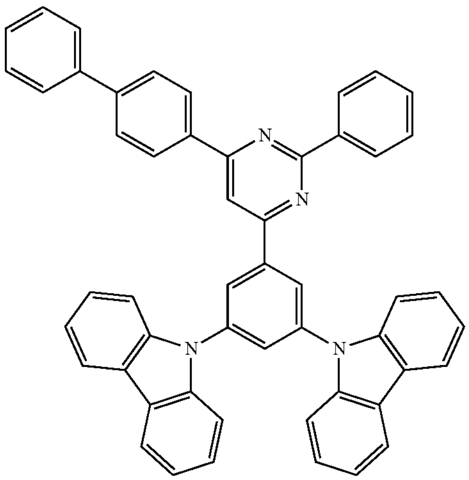
F2
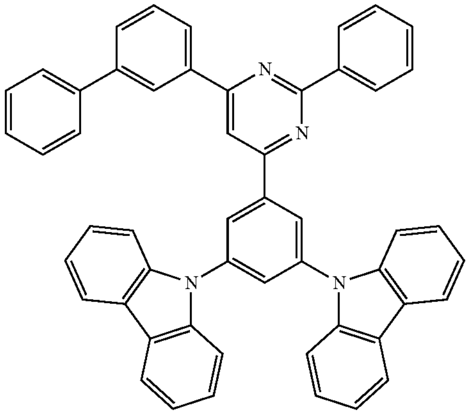
F3
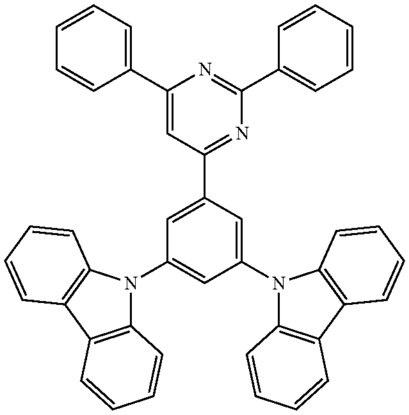
-continued
F4
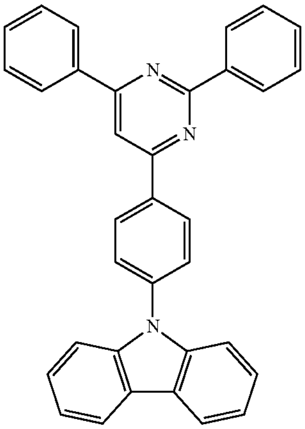
F5
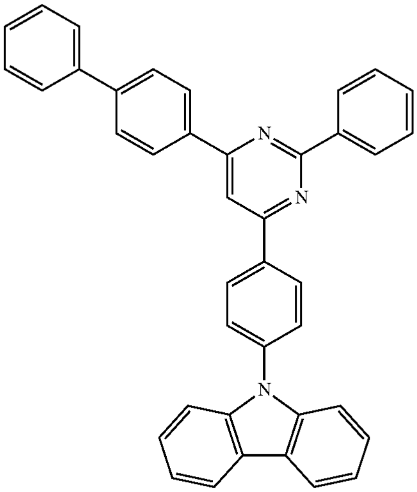
F6
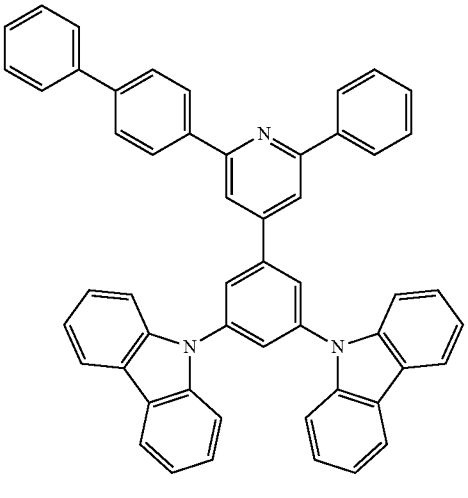

-continued
F7
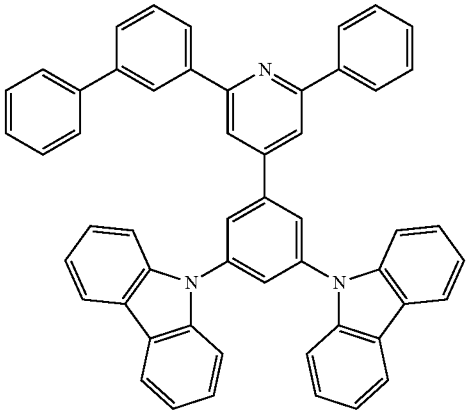
F8
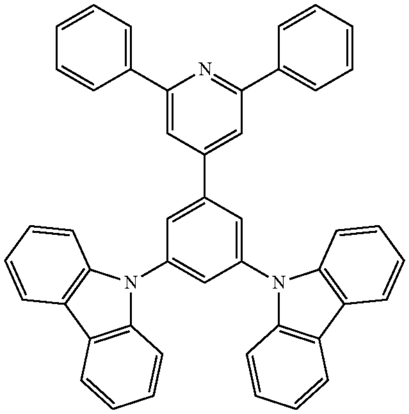
F9
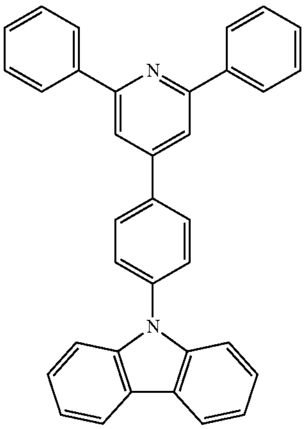
-continued
F10
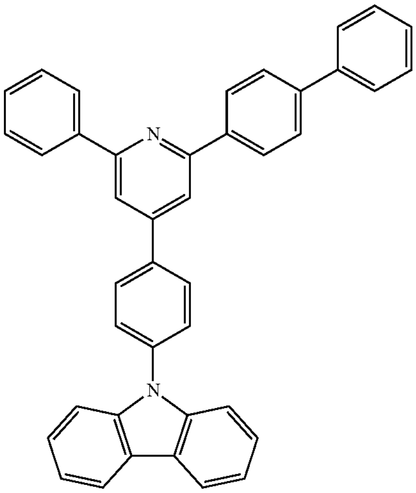
F11
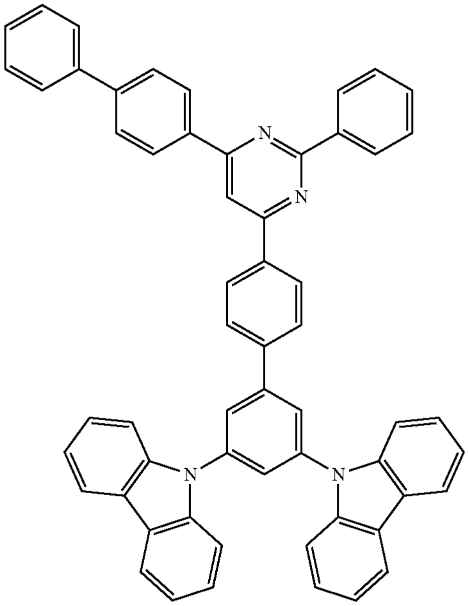
F12
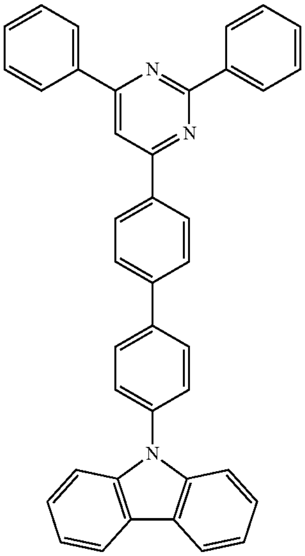

-continued

F13

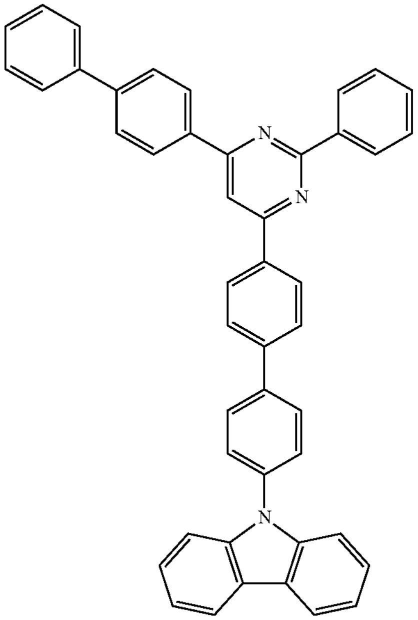

F14

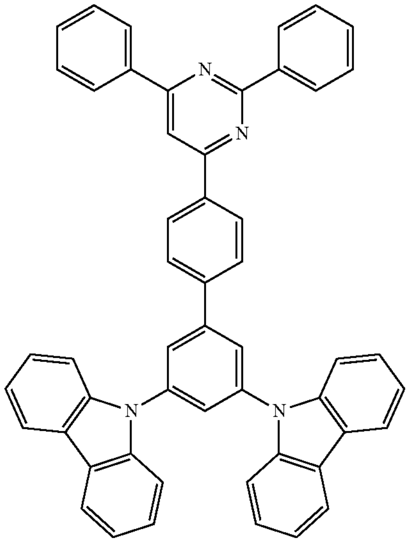

[Formula 14]

G1

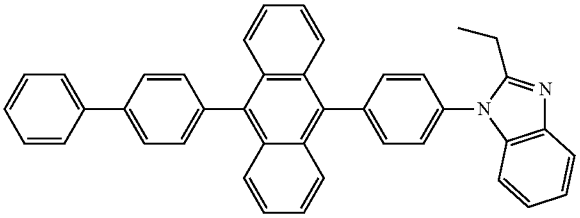

-continued

G2

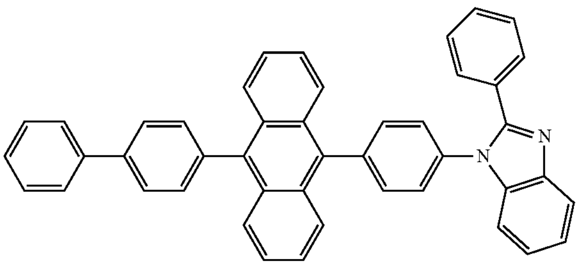

G3

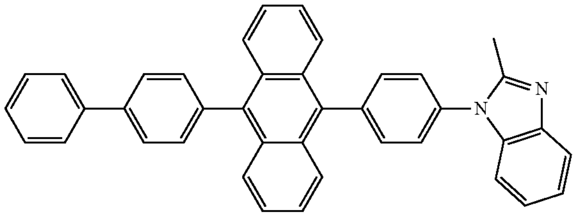

G4

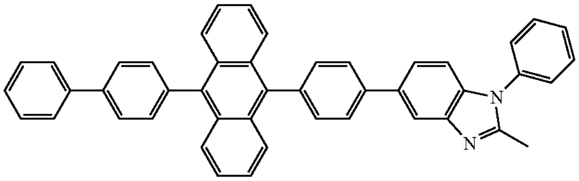

G5

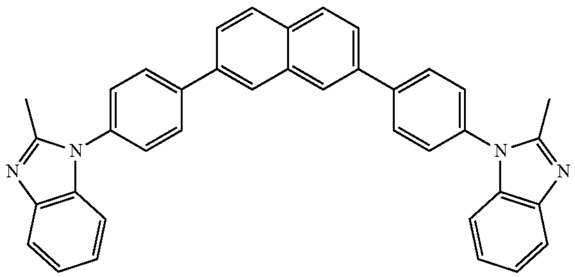

G6

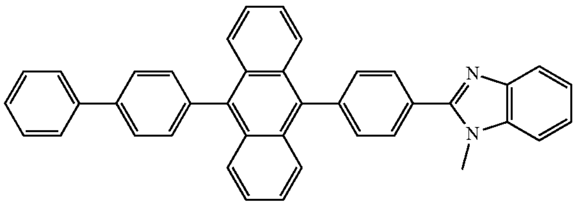

The ETL 240 can have a thickness of about 50 to 350 Å. In addition, when the ETL 240 includes both the compound in Formula 11 and the compound in Formula 12, the compound in Formula 11 and the compound in Formula 12 can have the same weight %.

The EIL 250 is positioned between the second electrode 164 and the ETL 240 to improve the property of the second electrode 164 and the lifespan of the OLED D. For example, the EIL 250 can include at least one of a halide compound of alkali metal or a halide compound of alkali earth metal, such as LiF, CsF, NaF, or $BaF_2$, and an organo-metallic compound, such as Liq, lithium benzoate, or sodium stearate. The EIL 250 can have a thickness of 5 to 100 Å, preferably10 to 50 Å, but it is not limited thereto.

The EBL can include at least one of tris(4-carbazoyl-9-yl-phenyl)amine (TCTA), tris [4-(diethylamino)phenyl] amine, N-(biphenyl-4-yl)-9,9-dimethyl-N-(4-(9-phenyl-9H-carbazol-3-yl)phenyl)-9H-fluoren-2-amine, TAPC, 4,4',4"-tris(3-methylphenylamino)triphenylamine (MTDATA), 1,3-bis(carbazol-9-yl)benzene (mCP), 3,3'-bis(N-carbazolyl)-1,1'-biphenyl (mCBP), copper phthalocyanine (CuPc), N,N'-bis[4-[bis(3-methylphenyl)amino]phenyl]-N,N'-diphenyl-[1,1'-biphenyl]-4,4'-diamine (DNTPD), 1,3,5-tris [4-(diphenylamino)phenyl]benzene (TDAPB), DCDPA, and 2,8-bis(9-phenyl-9H-carbazol-3-yl)dibenzo[b,d]thiophene. For example, the EBL can have a thickness of 10 to 350 Å, preferably100 to 200 Å.

Alternatively, the EBL can include a compound in Formula 15 as an electron blocking material.

[Formula 15]

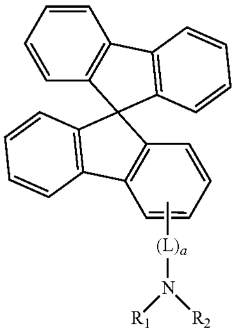

In Formula 15, L is $C_6$ to $C_{30}$ arylene group, and a is 0 or 1. Each of $R_1$ and $R_2$ is independently selected from the group consisting of $C_6$ to $C_{30}$ aryl group and $C_5$ to $C_{30}$ heteroaryl group, wherein each of the $C_6$ to $C_{30}$ aryl group and $C_5$ to $C_{30}$ heteroaryl group is optionally substituted with at least one of $C_1$-$C_{10}$ alkyl and $C_6$-$C_{30}$ aryl, respectively.

For example, L can be phenylene, and each of $R_1$ and $R_2$ can be independently selected from the group consisting of biphenylyl, dimethyl-substituted fluorenyl, phenylcarbazolyl, carbazolylphenyl, dibenzothiophenyl and dibenzofuranyl.

Namely, the electron blocking material is an amine derivative substituted with spirofluorene (e.g., spirofluorene-substituted amine derivative).

The electron blocking material in Formula 15 can be one of the compounds in Formula 16.

[Formula 16]

H1

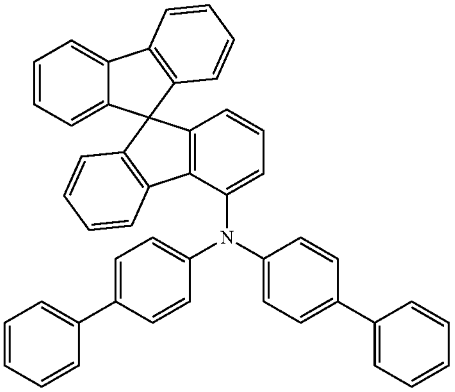

-continued

H2

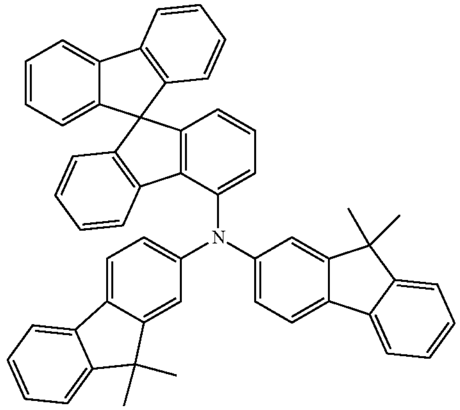

H3

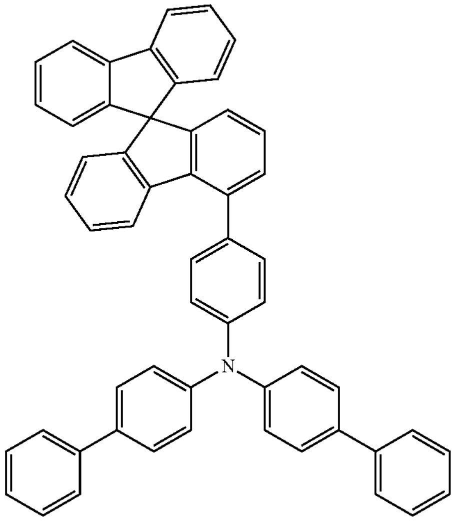

H4

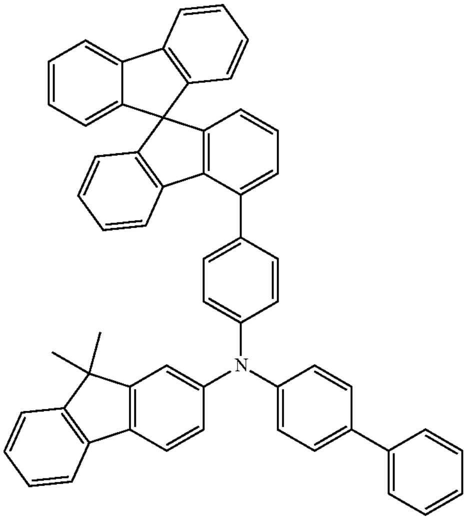

-continued

H5

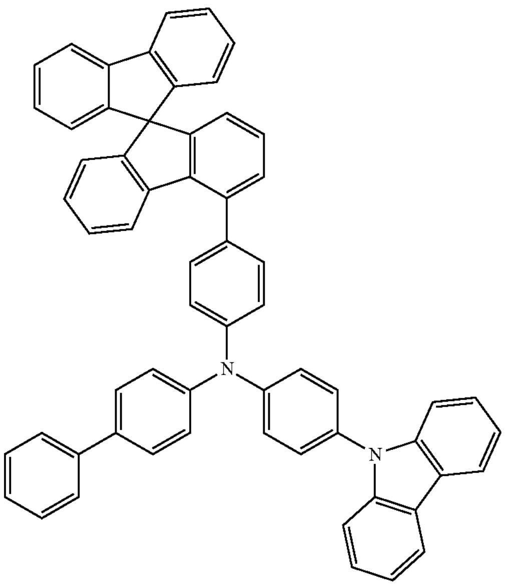

H6

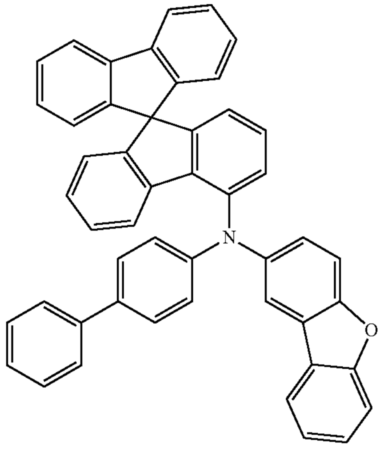

H7

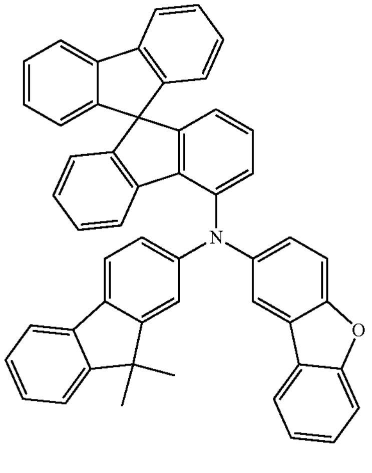

-continued

H8

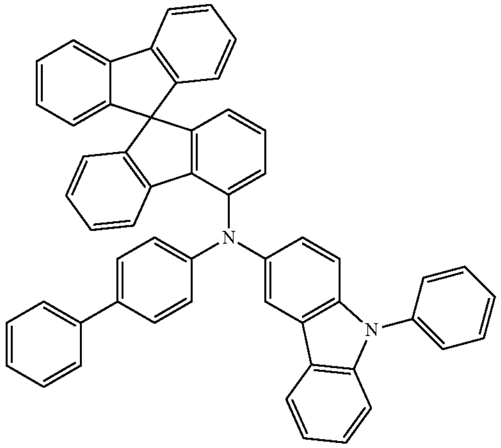

The HBL can include at least one of tris-(8-hydroxy quinoline) aluminum (Alq3), 2-biphenyl-4-yl-5-(4-t-butylphenyl)-1,3,4-oxadiazole (PBD), spiro-PBD, lithium quinolate (Liq), 2,2',2"-(1,3,5-Benzenetriyl)-tris(1-phenyl-1-H benzimidazole) (TPBi), bis(2-methyl-8-quinolinolato-N1,08)-(1,1'-biphenyl-4-olato)aluminum (BAlq), 4,7-diphenyl-1,10-phenanthroline (Bphen), 2,9-bis(naphthalene-2-yl) 4,7-diphenyl-1,10-phenanthroline (NBphen), 2,9-dimethyl-4,7-diphenyl-1,10-phenathroline (BCP), 3-(4-biphenyl)-4-phenyl-5-tert-butylphenyl-1,2,4-triazole (TAZ), 4-(naphthalen-1-yl)-3,5-diphenyl-4H-1,2,4-triazole (NTAZ), 1,3,5-tri (p-pyrid-3-yl-phenyl)benzene (TpPyPB), 2,4,6-tris(3'-(pyridin-3-yl) biphenyl-3-yl)1,3,5-triazine (TmPPPyTz), Poly[9,9-bis(3'-((N,N-dimethyl)-N-ethylammonium)-propyl)-2,7-fluorene]-alt-2,7-(9,9-dioctylfluorene)](PFNBr), tris (phenylquinoxaline (TPQ), and diphenyl-4-triphenylsilyl-phenylphosphine oxide (TSPO1), but it is not limited thereto. For example, the HBL can have a thickness of 10 to 350 Å, preferably 100 to 200 Å.

As described above, in the OLED of the present disclosure, at least one of the host 232 in the red EML 230 and the hole transporting material 222 in the HTL 220 is a compound, which includes a spiro-fluorene moiety (core) and an arylamine moiety and the spiro-fluorene core is partially or wholly deuterated, such that the emitting efficiency and the lifespan of the OLED D and the organic light emitting display device 100 are increased.

In addition, since the spiro-fluorene core except the arylamine moiety is partially or wholly deuterated, the compound includes less deuterium atom, which is very expensive, such that the production cost of the OLED D and the organic light emitting display device 100 is reduced.

Figure 4:
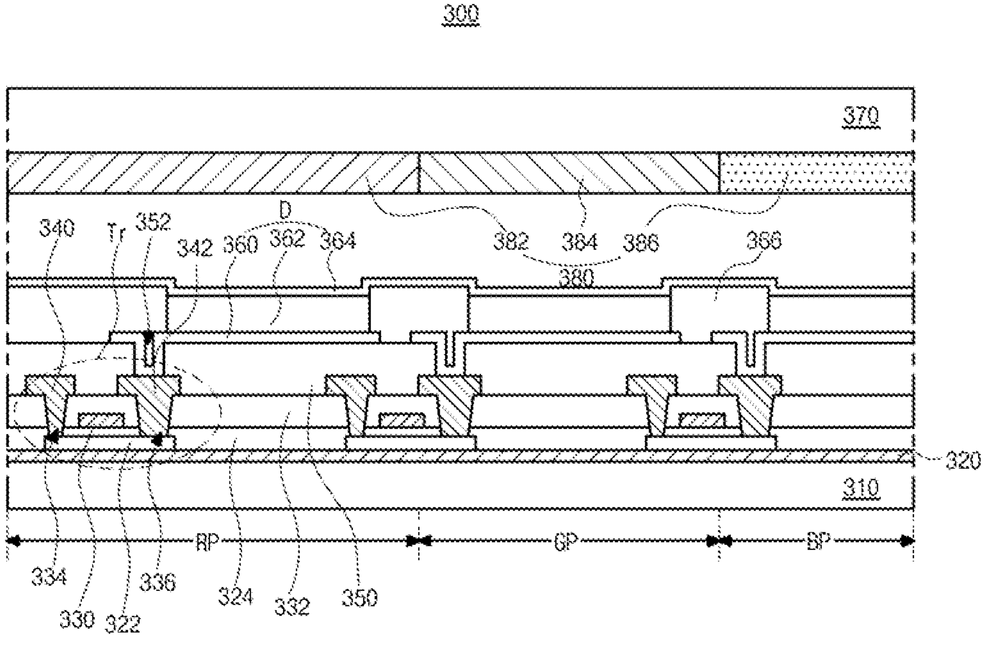
FIG. 4 is a schematic cross-sectional view illustrating an organic light emitting display device according to a third embodiment of the present disclosure.
Figure 5:
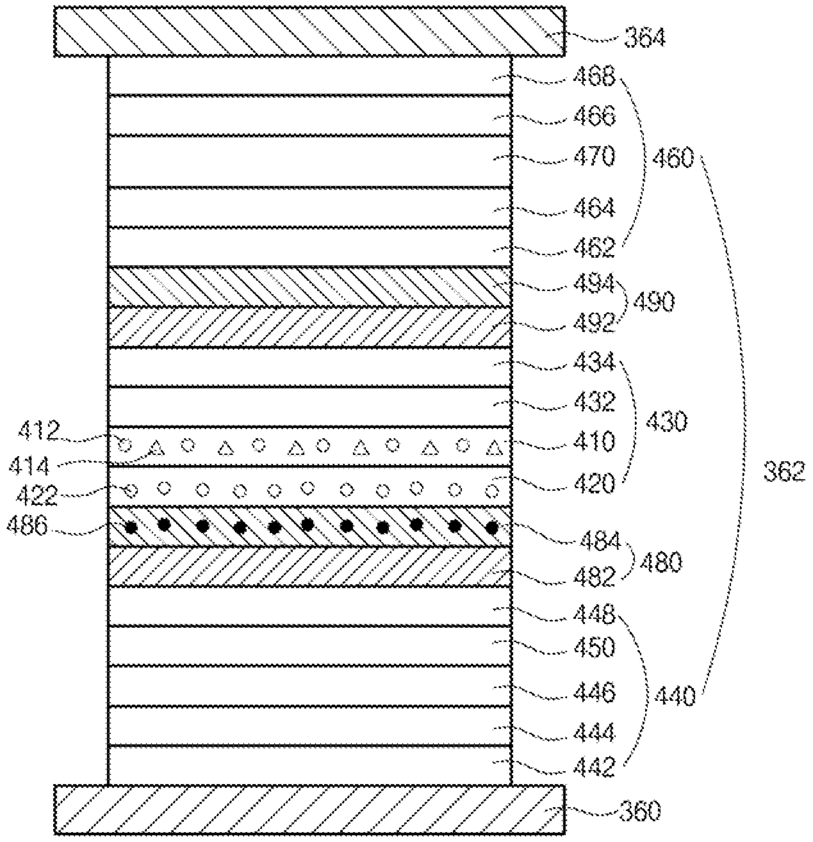
FIG. 5 is a schematic cross-sectional view illustrating an OLED according to a fourth embodiment of the present disclosure.
Figure 6:
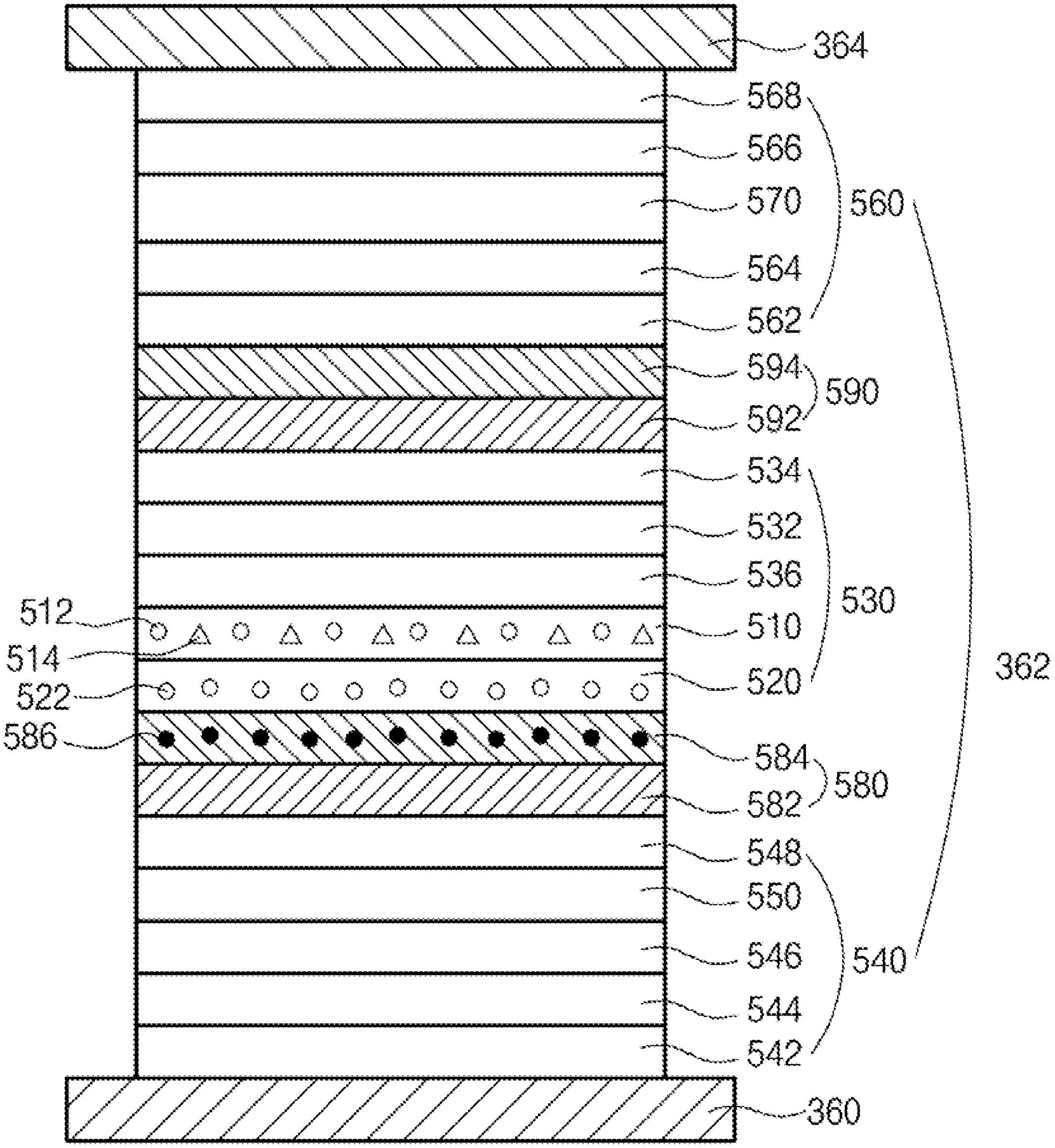
FIG. 6 is a schematic cross-sectional view illustrating an OLED according to a fifth embodiment.

FIG. 4 is a schematic cross-sectional view illustrating an organic light emitting display device according to a third embodiment of the present disclosure. FIG. 5 is a schematic cross-sectional view illustrating an OLED according to a fourth embodiment of the present disclosure, and FIG. 6 is a schematic cross-sectional view illustrating an OLED according to a fifth embodiment.

As shown in FIG. 4, the organic light emitting display device 300 includes a first substrate 310, where a red pixel region RP, a green pixel region GP and a blue pixel region BP are defined, a second substrate 370 facing the first substrate 310, an OLED D, which is positioned between the first and second substrates 310 and 370 and providing white emission, and a color filter layer 380 between the OLED D and the second substrate 370.

Each of the first and second substrates 310 and 370 can be a glass substrate or a flexible substrate. For example, the flexible substrate can be a polyimide (PI) substrate, a polyethersulfone (PES) substrate, a polyethylenenaphthalate (PEN) substrate, a polyethylene terephthalate (PET) substrate or a polycarbonate (PC) substrate.

A buffer layer 320 is formed on the first substrate 310, and the TFT Tr corresponding to each of the red, green and blue pixel regions RP, GP and BP is formed on the buffer layer 320. The buffer layer 320 can be omitted.

A semiconductor layer 322 is formed on the buffer layer 320. The semiconductor layer 322 can include an oxide semiconductor material or polycrystalline silicon.

A gate insulating layer 324 is formed on the semiconductor layer 322. The gate insulating layer 324 can be formed of an inorganic insulating material such as silicon oxide or silicon nitride.

A gate electrode 330, which is formed of a conductive material, e.g., metal, is formed on the gate insulating layer 324 to correspond to a center of the semiconductor layer 322.

An interlayer insulating layer 332, which is formed of an insulating material, is formed on the gate electrode 330. The interlayer insulating layer 332 can be formed of an inorganic insulating material, e.g., silicon oxide or silicon nitride, or an organic insulating material, e.g., benzocyclobutene or photo-acryl.

The interlayer insulating layer 332 includes first and second contact holes 334 and 336 exposing both sides of the semiconductor layer 322. The first and second contact holes 334 and 336 are positioned at both sides of the gate electrode 330 to be spaced apart from the gate electrode 330.

A source electrode 340 and a drain electrode 342, which are formed of a conductive material, e.g., metal, are formed on the interlayer insulating layer 332.

The source electrode 340 and the drain electrode 342 are spaced apart from each other with respect to the gate electrode 330 and respectively contact both sides of the semiconductor layer 322 through the first and second contact holes 334 and 336.

The semiconductor layer 322, the gate electrode 330, the source electrode 340 and the drain electrode 342 constitute the TFT Tr. The TFT Tr serves as a driving element. Namely, the TFT Tr can correspond to the driving TFT Td (of FIG. 1).

The gate line and the data line cross each other to define the pixel region, and the switching TFT is formed to be connected to the gate and data lines. The switching TFT is connected to the TFT Tr as the driving element.

In addition, the power line, which can be formed to be parallel to and spaced apart from one of the gate and data lines, and the storage capacitor for maintaining the voltage of the gate electrode of the TFT Tr in one frame can be further formed.

A planarization layer 350, which includes a drain contact hole 352 exposing the drain electrode 342 of the TFT Tr, is formed to cover the TFT Tr.

A first electrode 360, which is connected to the drain electrode 342 of the TFT Tr through the drain contact hole 352, is separately formed in each pixel region and on a planarization layer 350. The first electrode 360 can be an anode and can include a transparent conductive layer being formed of a conductive material having a relatively high work function, e.g., a transparent conductive oxide (TCO). The first electrode 360 can further include a reflection electrode or a reflection layer. For example, the reflection electrode or the reflection layer can be formed of silver (Ag) or aluminum-palladium-copper (APC) alloy. In the top-emission organic light emitting display device 300, the first electrode 360 can have a triple-layered structure of ITO/Ag/ITO or ITO/APC/ITO.

A bank layer 366 covering an edge of the first electrode 360 is formed on the planarization layer 350. The bank layer 366 is positioned at a boundary of the red, green and blue pixel regions RP, GP and BP and exposes a center of the first electrode 360 in the red, green and blue pixel regions RP, GP and BP. Since the OLED D emits the white light in the red, green and blue pixel regions RP, GP and BP, the organic emitting layer 362 can be formed as a common layer in the red, green and blue pixel regions RP, GP and BP without separation in the red, green and blue pixel regions RP, GP and BP. The bank layer 366 can be formed to prevent the current leakage at an edge of the first electrode 360 and can be omitted.

An organic emitting layer 362 is formed on the first electrode 360.

Referring to FIG. 5, the organic emitting layer 362 includes a first emitting part 430 including a red EML 410 and a first HTL 420, a second emitting part 440 including a first blue EML 450 and a third emitting part 460 including a second blue EML 470. In addition, the organic emitting layer 362 can further include a first charge generation layer (CGL) 480 between the first and second emitting parts 430 and 440 and a second CGL 490 between the first and third emitting parts 430 and 460. Moreover, the first emitting part 430 can further include a green EML 432.

The second emitting part 440 is positioned between the first electrode 360 and the first emitting part 430, and the third emitting part 460 is positioned between the first emitting part 430 and the second electrode 364. In addition, the second emitting part 440 is positioned between the first electrode 360 and the first CGL 480, and the third emitting part 460 is positioned between the second CGL 490 and the second electrode 364. Namely, the second emitting part 440, the first CGL 480, the first emitting part 430, the second CGL 490 and the third emitting part 460 are sequentially stacked on the first electrode 360.

In the first emitting part 430, the first HTL 420 is disposed under the red EML 410, and the green EML 432 is disposed on the red EML 410. In addition, the first emitting part 430 can further include a first ETL 434 over the red EML 410. When the first emitting part 430 includes the green EML 432, the first ETL 434 is disposed on the green EML 432.

The second emitting part 440 can further include at least one of a second HTL 444 under the first blue EML 450 and a second ETL 448 on the first blue EML 450. In addition, the second emitting part 440 can further include an HIL 442 between the first electrode 360 and the second HTL 444. Moreover, the second emitting part 440 can further include a first EBL 446 between the second HTL 444 and the first blue EML 450.

The second emitting part 440 can further include a first HBL between the second ETL 448 and the first blue EML 450.

The third emitting part 460 can further include at least one of a third HTL 462 under the second blue EML 470 and a third ETL 466 on the second blue EML 470. In addition, the third emitting part 460 can further include an EIL 468 between the second electrode 364 and the third ETL 466. Moreover, the third emitting part 460 can further include a second EBL 464 between the third HTL 462 and the second blue EML 470.

The third emitting part 460 can further include a second HBL between the third ETL 466 and the second blue EML 470.

As described above, the red EML 410 includes the first compound as the host 412, e.g., a first host. In addition, the red EML 410 can further include the red dopant 414, e.g., a red emitter. In the red EML 410, the weight % of the host 412 being the first compound can be greater than that of the red dopant 414. The red dopant 414 can be one of the red phosphorescent compound, the red fluorescent compound and the red delayed-fluorescent compound.

In the red EML 410, the first compound as the host 412 can be represented by Formula 1-1, and the red dopant 414 can be represented by Formula 5.

In addition, the red EML 410 can further include a second host being an N-type host. For example, the second host can be represented by Formula 7.

When the red EML 410 includes the first host 412, the second host and the red dopant 414, a weight ratio of the first host 412 to the second host can be 1:9 to 9:1, preferably 2:8 to 8:2, more preferably3:7 to 7:3. For example, the weight % of the first host can be smaller than that of the second host. The weight ratio of the first host 412 to the second host can be 1:9 to 4:6, preferably3:7.

In the red EML 410, the red dopant 414 can have a weight % of 1 weight % to weight %, preferably1 weight % to weight %, but it is not limited thereto. The red EML 410 can have a thickness of 30 to 400 Å, preferably100 to 250 Å, but it is not limited thereto.

The first HTL 420 includes the hole transporting material represented by Formula 1-1 or Formula 3-1.

Namely, the first host 412 in the red EML 410 is a compound, in which the spiro-fluorene moiety except the arylamine moiety is partially or wholly deuterated, e.g., the compound in Formula 1-1, and the hole transporting material 422 in the first HTL 420 is one of a compound, in which the spiro-fluorene moiety except the arylamine moiety is partially or wholly deuterated, e.g., the compound in Formula 1-1, and a compound, which is not deuterated, or in which the arylamine moiety except the spiro-fluorene moiety is partially or wholly deuterated, or in which the spiro-fluorene moiety and the arylamine moiety are partially or wholly deuterated, e.g., the compound in Formula 3-1.

Alternatively, the hole transporting material 422 in the first HTL 420 can be the compound in Formula 1-1, and the first host 412 in the red EML 410 can be the compound in Formula 3-1.

When both of the first host 412 in the red EML 410 and the hole transporting material 422 in the first HTL 420 are the compound in Formula 1-1, the first host 412 and the hole transporting material 422 can be same or different.

In the first emitting part 430, the green EML 432 includes a host and a green dopant.

The host in the green EML 432 can include at least one of a P-type green host and an N-type green host. When the green EML 432 includes both the P-type green host and the N-type green host, a weight ratio of the P-type green host to the N-type green host can be 1:9 to 9:1, preferably2:8 to 8:2, more preferably3:7 to 7:3. For example, the weight % of the P-type green host can be greater than that of the N-type green host. The weight ratio of the P-type green host to the N-type green host can be 9:1 to 6:4, preferably7:3.

The P-type green host can be a biscarbazole-based organic compound and can be represented by Formula 17.

[Formula 17]

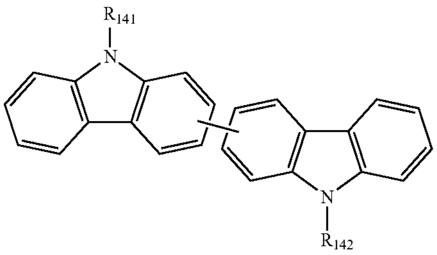

In Formula 17, each of $R_{141}$ and $R_{142}$ is independently selected from unsubstituted or substituted $C_6$ to $C_{30}$ aryl group.

Aryl group can be unsubstituted or substituted with $C_6$ to $C_{10}$ aryl. For example, each of $R_{141}$ and $R_{142}$ can be independently selected from phenyl and naphthyl, and each of phenyl and naphthyl can be unsubstituted or substituted with phenyl or naphthyl.

The P-type green host in Formula 17 can be one of the compounds in Formula 18, but it is not limited thereto.

[Formula 18]

P1

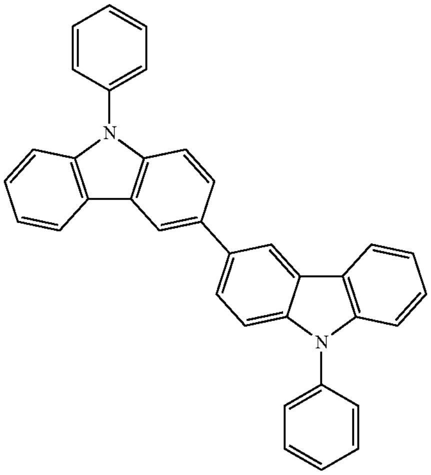

-continued
P2
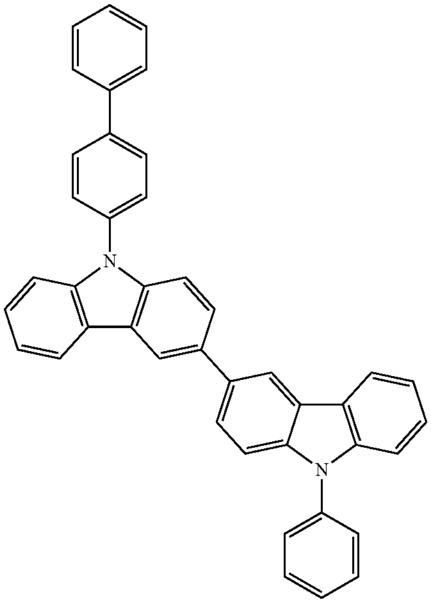
P3
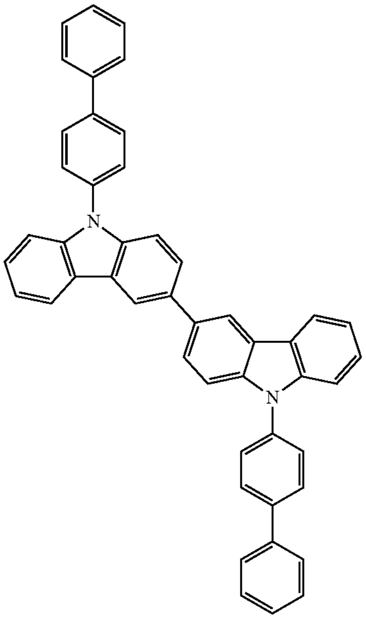
-continued
P4
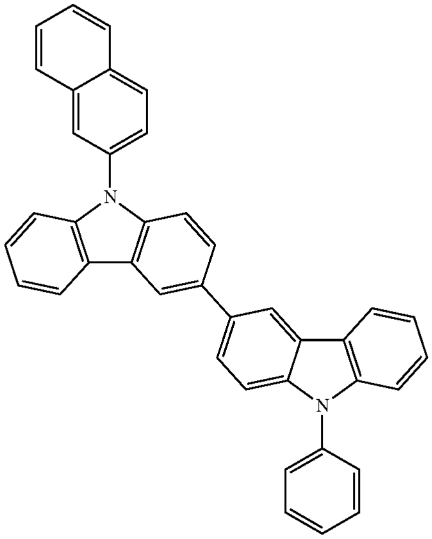
P5
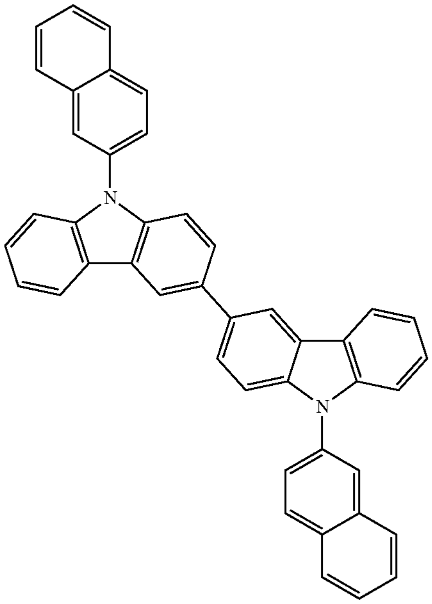

-continued
P6
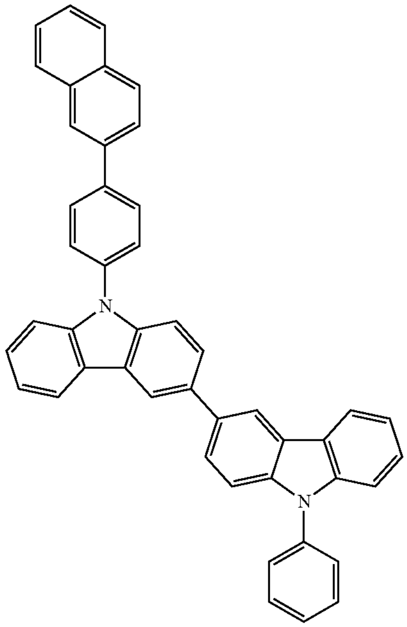
P7
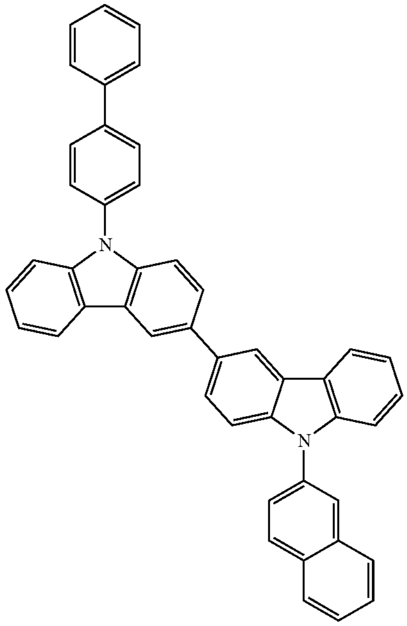
-continued
P8
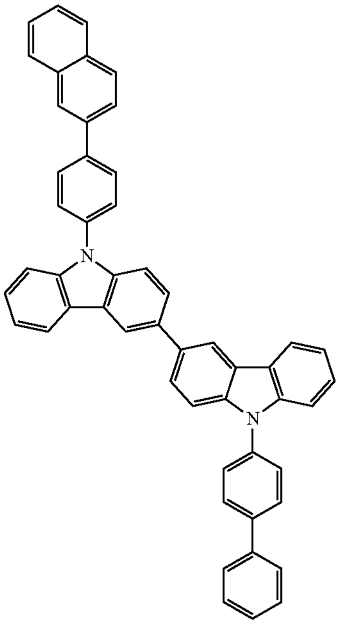
P9
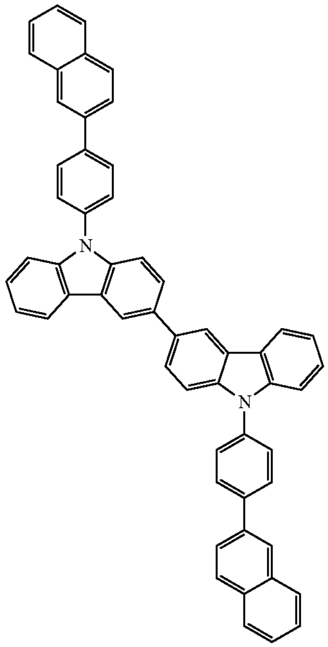
The N-type green host can be a triazine-based organic compound and can be represented by Formula 19.
[Formula 19]
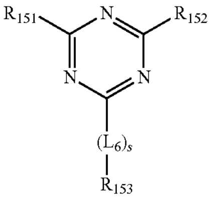

In Formula 19, each of $R_{151}$ and $R_{152}$ is independently selected from unsubstituted or substituted $C_6$ to $C_{30}$ aryl group, and $R_{153}$ is unsubstituted or substituted $C_{10}$ to C20 fused-heteroaryl group. $L_6$ is C6 to C30 arylene group, and s is 0 or 1.

Aryl group and fused-heteroaryl group can be unsubstituted or substituted with C10 to C20 fused-aryl.

For example, each of $R_{151}$ and $R_{152}$ can be independently phenyl, and $R_{153}$ can be dibenzofuranyl or dibenzothiophenyl. Each of dibenzofuranyl and dibenzothiophenyl can be substituted with triphenylene or phenanthrenyl, and $L_6$ can be phenylene.

The N-type green host in Formula 19 can be one of the compounds in Formula 20, but it is not limited thereto.

[Formula 20]

Q1

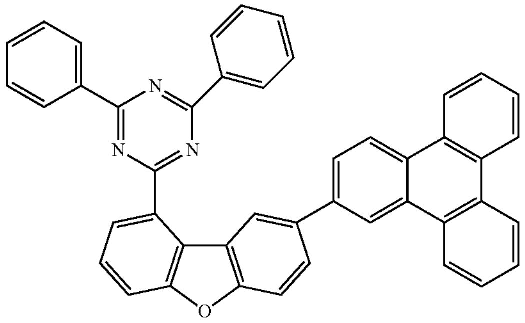

Q2

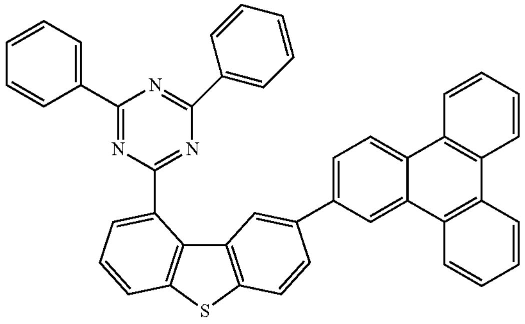

Q3

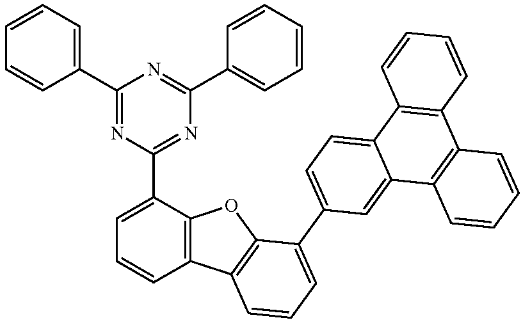

-continued

Q4

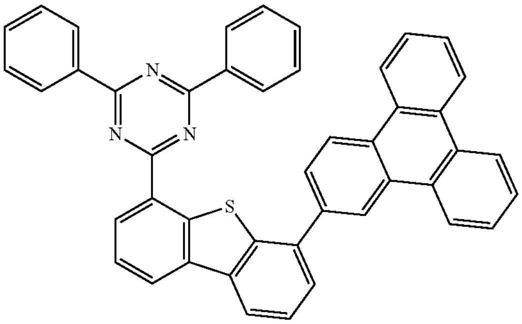

Q5

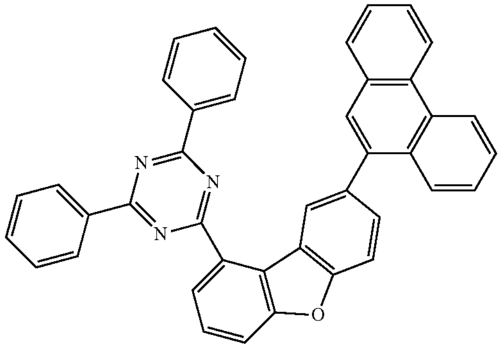

Q6

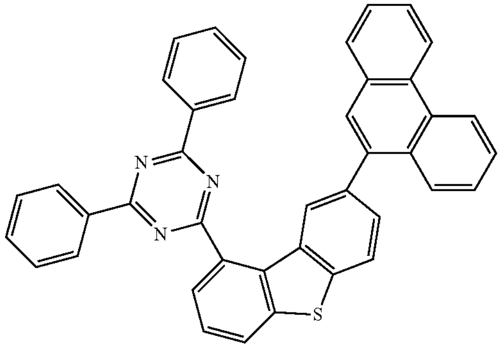

Q7

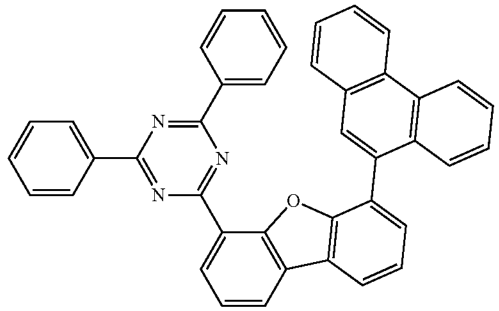

-continued
Q8
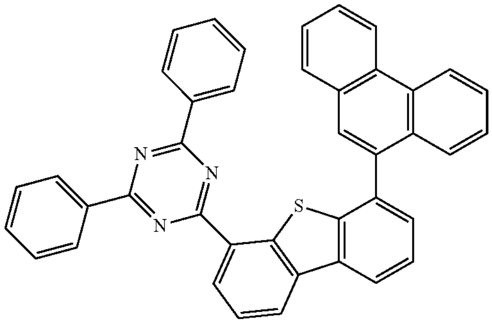
Q9
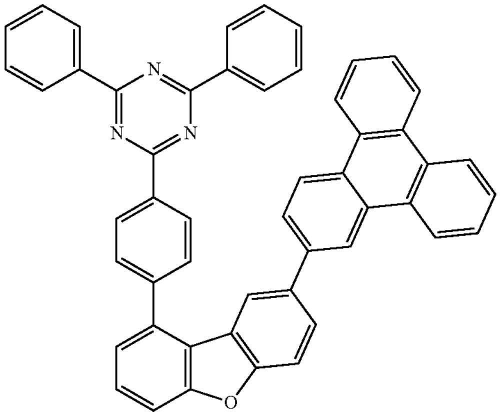
Q10
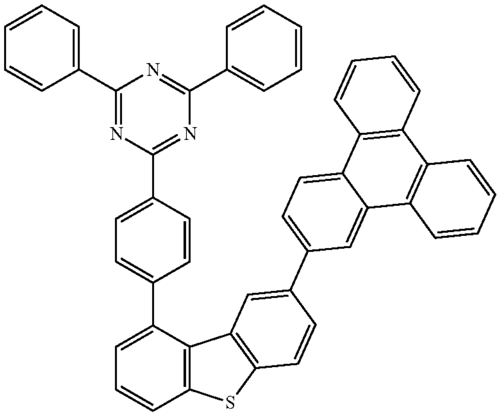
Q11
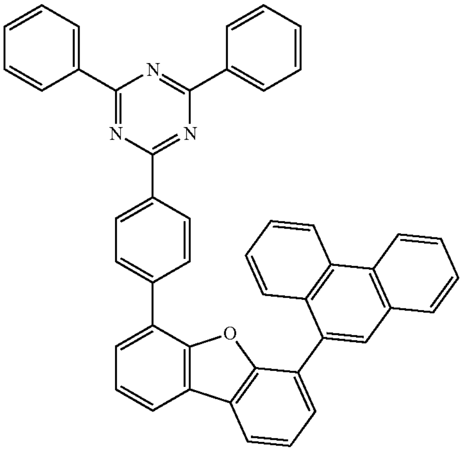
-continued
Q12
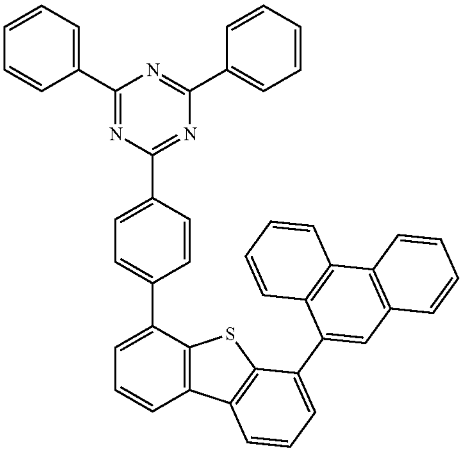
Q13
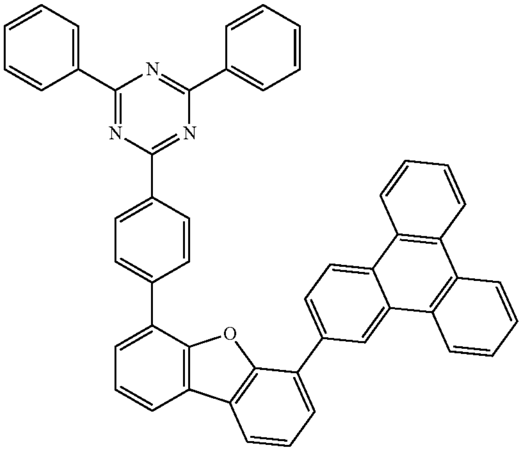
Q14
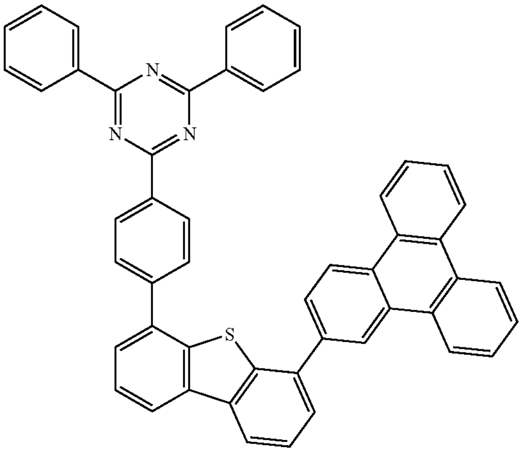

-continued

Q15

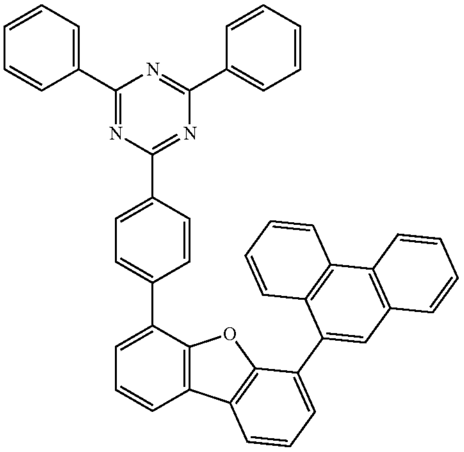

Q16

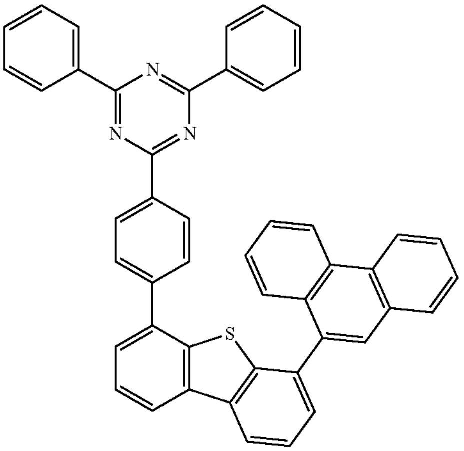

The green dopant can include at least one of a green phosphorescent compound, a green fluorescent compound and a green delayed-fluorescent compound. For example, the green dopant can be represented by Formula 21.

[Formula 21]

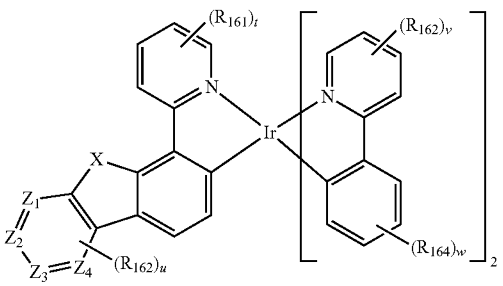

In Formula 21, each of $R_{161}$ to $R_{164}$ is independently selected from the group consisting of deuterium, halogen atom, C1 to C6 alkyl group, C3 to C6 cycloalkyl group, C6 to C10 aryl group and C3 to C10 heteroaryl group. Each of t, v and w is independently an integer of 0 to 4, and u is an integer of 0 to 3. X is oxygen atom or sulfur atom. Each of $Z_1$ to $Z_4$ is independently nitrogen or $CR_{165}$, and $R_{165}$ is selected from hydrogen, deuterium, halogen atom, C1 to C6 alkyl group, C3 to C6 cycloalkyl group, C6 to C10 aryl group and C3 to C10 heteroaryl group. (t, u, v and w are the number of substituents).

The green dopant can be one of the compounds in Formula 22, but it is not limited thereto.

[Formula 22]

S1

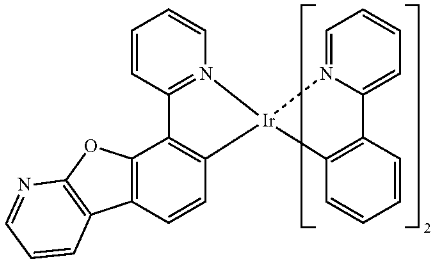

S2

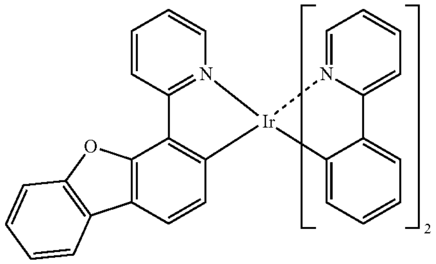

S3

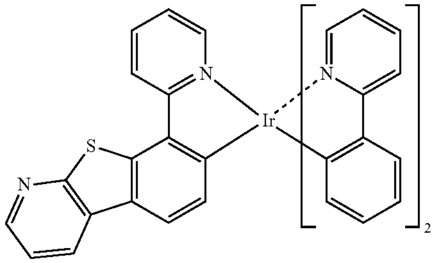

S4

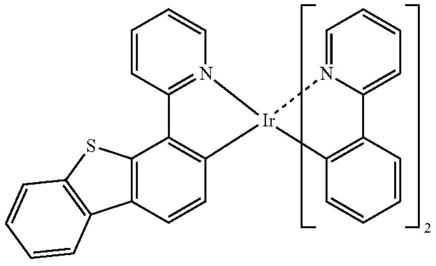

In the green EML 432, the green dopant can have a weight % of 2 weight % to 20 weight %, preferably5 weight % to 15 weight %, but it is not limited thereto. The green EML 432 can has a thickness of 30 to 600 Å, preferably50 to 400 Å, but it is not limited thereto.

For example, in the first emitting part 430, a thickness of the red EML 410 can be smaller than that of the green EML 432. In addition, a weight % of the red dopant 414 in the red EML 410 can be smaller than that of the green dopant in the green EML 432.

The first blue EML 450 in the second emitting part 440 includes a first blue host and a first blue dopant, and the second blue EML 470 in the third emitting part 460 includes a second blue host and a second blue dopant. Each of the first and second blue hosts can be an anthracene derivative, and each of the first and second blue dopants can be a boron derivative. For example, each of the first and second blue hosts can be represented by Formula 23-1.

[Formula 23-1]

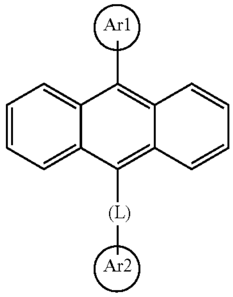

In Formula 23-1, each of Ar1 and Ar2 is independently C6 to C20 aryl group, and L is C6 to C20 arylene group.

For example, in Formula 23-1, each of Ar1 and Ar2 can be selected from the group consisting of phenyl, naphthyl and anthracenyl, and L can be selected from the group consisting of phenylene and naphthylene. Ar1 can be 1-naphtyl, Ar2 can be 2-naphthyl, and L can be phenylene.

In this instance, a part or all of hydrogens can be substituted by deuterium. Namely, the anthracene derivative can be partially or wholly deuterated. The first blue host included in the first blue EML 450 being closer to the first electrode 360 as the anode is an anthracene derivative having a first deuteration ratio, and the second blue host included in the second blue EML 470 being closer to the second electrode 364 as the cathode is an anthracene derivative having a second deuteration ratio. For example, the second deuteration ratio can be smaller than the first deuteration ratio.

The first blue host in the first blue EML 450 can be represented by Formula 23-2, and the second blue host in the second blue EML 470 can be represented by Formula 23-3.

[Formula 23-2]

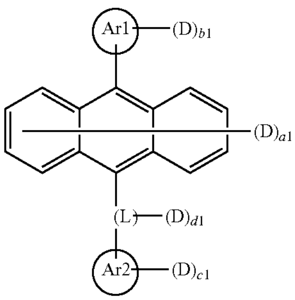

-continued

[Formula 23-3]

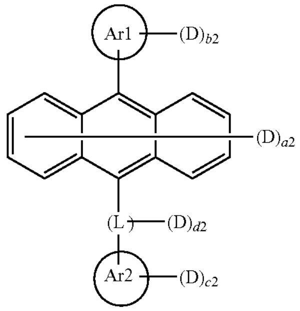

In Formulas 23-2 and 23-3, each of Ar1 and Ar2 is independently C6 to C20 aryl group, and L is C6 to C20 arylene group. Each of a1 and a2 is independently an integer of 0 to 8, and each of b1, b2, c1, c2, d1 and d2 is independently an integer of 0 to 20. A summation of a1, b1, c1 and d1 is greater than a summation of a2, b2, c2 and d2. Here, D is deuterium, and each of a1, a2, b1, b2, c1, c2, d1 and d2 is a number of deuterium.

Namely, the first blue host in the first blue EML 450 and the second blue host in the second blue EML 470 can be an anthracene derivative having the same chemical structure (or chemical formula) and have a difference in a deuteration ratio. In other words, the first blue host in the first blue EML 450 has a first deuteration ratio, and the second blue host in the second blue EML 470) has a second deuteration ratio being smaller than the first deuteration ratio.

The first blue host in the first blue EML 450 can be represented by Formula 23-4, and the second blue host in the second blue EML 470 can be represented by Formula 23-5.

[Formula 23-4]

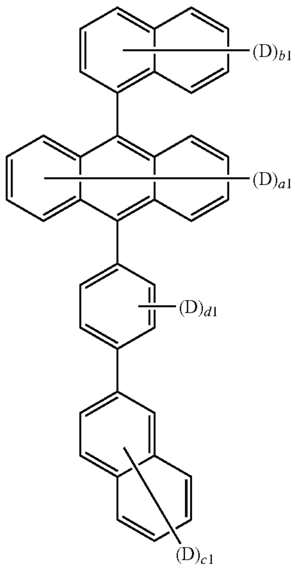

-continued

[Formula 23-5]

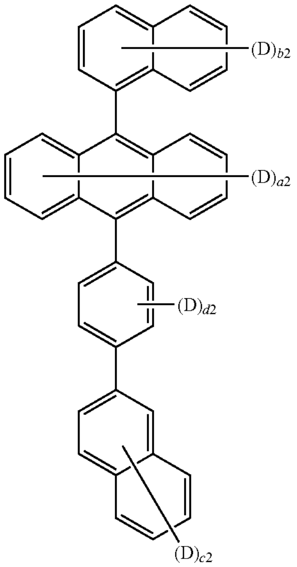

In Formulas 23-4 and 23-5, each of a1 and a2 is independently an integer of 0 to 8, each of b1, b2, c1 and c2 is independently an integer of 0 to 7, and each of d1 and d2 is independently an integer of 0 to 4. A summation of a1, b1, c1 and d1 is greater than a summation of a2, b2, c2 and d2.

For example, in Formula 23-4, a1 is 8, b1 is 7, c1 is 7, and d1 is 4, thus the first blue host in the first blue EML 450 can be a compound in Formula 24-1. Namely, the first blue host in the first blue EML 450 can be an anthracene derivative, in which all hydrogens are deuterated (e.g., a wholly-deuterated anthracene derivative).

[Formula 24-1]

Host 1-5

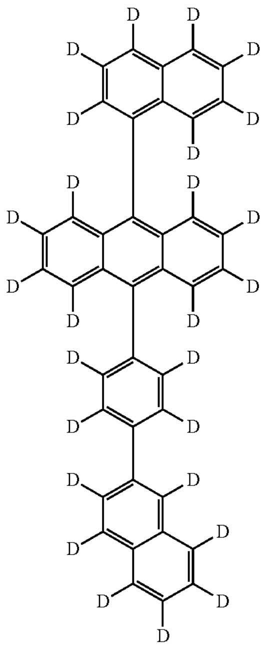

For example, in Formula 23-5, at least one of a2, b2, c2 and d2 is 0, thus the second blue host in the second blue EML 470 can be one of compounds in Formula 24-2. Namely, the second blue host in the second blue EML 470 can be an anthracene derivative, in which no hydrogen is deuterated (e.g., a non-deuterated anthracene derivative) or a part of hydrogens are deuterated (e.g., a partially-deuterated anthracene derivative).

[Formula 24-2]

Host 1-1

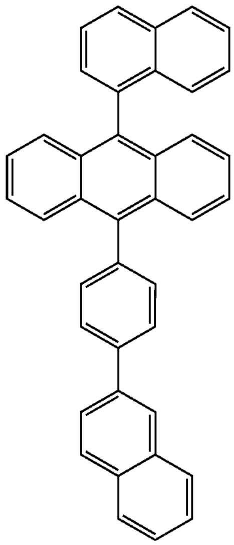

Host 1-2

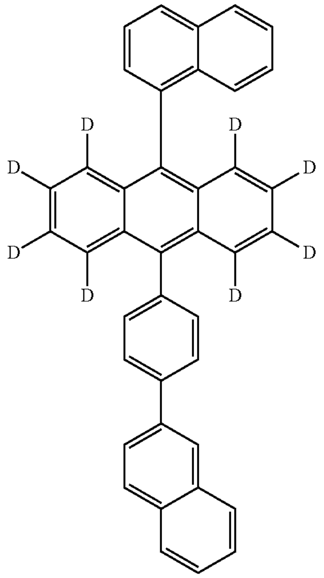

-continued

Host 1-3

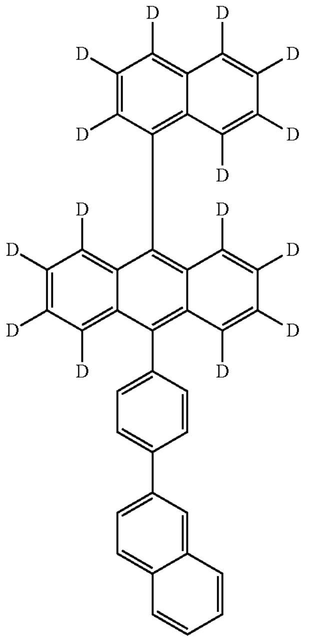

Host 1-4

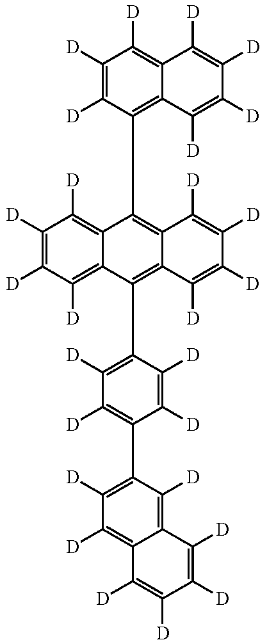

Namely, the first blue host in the first blue EML 450 being closer to the first electrode 360 as the anode can have a first deuteration ratio, e.g., 100%, and the second blue host in the second blue EML 470 being closer to the second electrode 364 as the cathode can have a second deuteration ratio, e.g., 0%, about 30%, about 52%, or about 70%, being smaller than the first deuteration ratio.

In addition, the first blue host in the first blue EML 450 can further include the anthracene derivative in Formula 23-3, 23-5 and 24-2.

For example, the first blue EML 450 being closer to the first electrode 360 as the anode can include a non-deuterated anthracene derivative, e.g., the compound Host1-1, and a wholly-deuterated anthracene derivative, e.g., the compound Host1-5, and the second blue EML 470 being closer to the second electrode 364 as the cathode can include a non-deuterated anthracene derivative, e.g., the compound Host1-1. In this case, in the first blue EML 450, a weight % of the wholly-deuterated anthracene derivative, e.g., the compound Host1-5, can be greater than that of the non-deuterated anthracene derivative, e.g., the compound Host1-1. For example, in the first blue EML 450, the weight ratio of the wholly-deuterated anthracene derivative, e.g., the compound Host1-5, to the non-deuterated anthracene derivative, e.g., the compound Host1-1, can be 7:3 to 9:1.

Each of the first blue dopant in the first blue EML 450 and the second blue dopant in the second blue EML 470 can be a boron derivative represented by Formula 25.

[Formula 25]

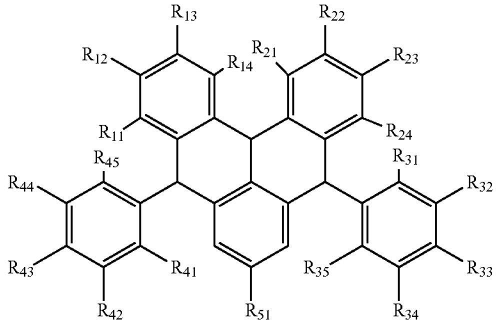

In Formula 25, each of $R_{11}$ to $R_{14}$, each of $R_{21}$ to $R_{24}$, each of $R_{31}$ to $R_{35}$ and each of $R_{41}$ to $R_{45}$ is selected from the group of hydrogen, deuterium (D), C1 to C10 alkyl group, C6 to C30 aryl group, C12 to C30 arylamine group unsubstituted or substituted with C1 to C10 alkyl group and C5 to C30 heteroaryl group, or adjacent two of $R_{11}$ to $R_{14}$, adjacent two of $R_{21}$ to $R_{24}$, adjacent two of $R_{31}$ to Ras and adjacent two of $R_{41}$ to $R_{45}$ are connected (combined) to each other to form a fused ring unsubstituted or substituted with C1 to C10 alkyl group, e.g., an aryl ring or a heteroaryl ring. $R_{81}$ is selected from the group consisting of hydrogen, deuterium, C1 to C10 alkyl group and C3 to C15 cycloalkyl group, C6 to C30 aryl group, C5 to C30 heteroaryl group unsubstituted or substituted with deuterium and C6 to C30 arylamine group unsubstituted or substituted with deuterium or C1 to C10 alkyl group.

Each of $R_{11}$ to $R_{14}$, each of $R_{21}$ to $R_{24}$, each of $R_{31}$ to $R_{35}$ and each of $R_{41}$ to $R_{45}$ can be same or different.

In the boron derivative being the first and second blue dopant, the benzene ring, which is connected to boron atom and two nitrogen atoms, is substituted with unsubstituted or C1 to C10 alkyl group-substituted (e.g., deuterium-substituted) C12 to C30 arylamine group or unsubstituted or deuterium-substituted C5 to C30 heteroaryl group such that the emitting property of the OLED D can be further improved. Namely, when $R_{51}$ in Formula 25 is unsubstituted or C1 to C10 alkyl group-substituted C12 to C30 arylamine group or unsubstituted or deuterium-substituted C5 to C30 heteroaryl group, e.g., carbazole, the emitting property of the OLED D can be further improved.

For example, C1 to C10 alkyl group can be one of methyl, ethyl, propyl, butyl, and pentyl (amyl). The substituted or unsubstituted C6 to C30 aryl group can be one of phenyl and naphthyl and can be substituted with D or C1~ C10 alkyl. In addition, C12 to C30 arylamine group can be one of diphenylamine group, phenyl-biphenylamine group, phenyl-naphthylamine group, and dinaphthylamine group, and C5 to C30 heteroaryl group can be one of pyridyl, quinolinyl, carbazolyl, dibenzofuranyl, and dibenzothiophenyl. In this instance, arylamine group, aryl group, alkyl group, and heteroaryl group can be substituted with D.

Each of $R_{11}$ to $R_{14}$, each of $R_{21}$ to $R_{24}$, each of $R_{31}$ to $R_{35}$ and each of $R_{41}$ to $R_{45}$ can be independently selected from the group consisting of hydrogen, deuterium, methyl, ethyl, propyl, butyl, and pentyl (amyl). $R_{81}$ can be selected from the group consisting of unsubstituted or deuterium-substituted diphenylamine group, unsubstituted or deuterium-substituted phenyl-biphenylamine group, unsubstituted or deuterium-substituted phenyl-naphthylamine group, unsubstituted or deuterium-substituted biphenyl-naphthylamine group, and unsubstituted or deuterium-substituted carbazoyl.

In one embodiment, one of $R_{11}$ to $R_{14}$, one of $R_{21}$ to $R_{24}$, one of $R_{31}$ to $R_{35}$ and one of $R_{41}$ to $R_{45}$ can be tert-butyl or tert-pentyl (or tert-amyl), and the rest of $R_{11}$ to $R_{14}$, the rest of $R_{21}$ to $R_{24}$, the rest of $R_{31}$ to $R_{35}$ and the rest of $R_{41}$ to $R_{45}$ can be hydrogen or deuterium, and $R_{81}$ can be deuterium-substituted diphenylamine group. When the compound is used as the first and second blue dopants, the emitting efficiency and the color sense of the OLED are improved.

The first and second blue dopant can be same or different and can be independently one of the compounds in Formula 26.

[Formula 26]

Dopant 1

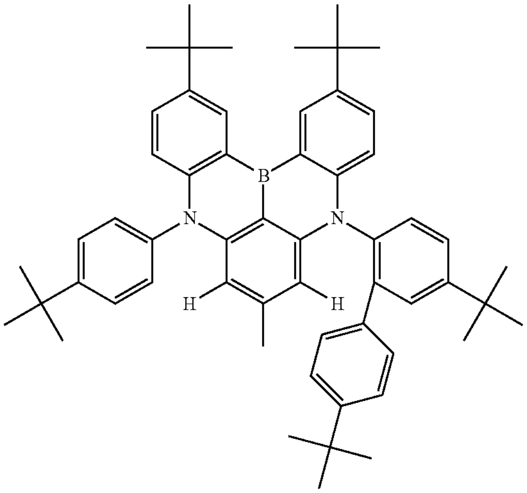

-continued

Dopant 2

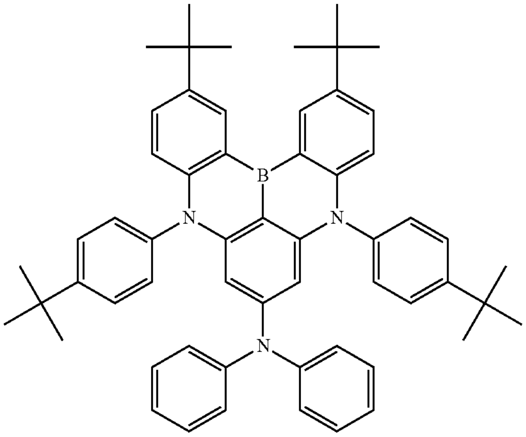

Dopant 3

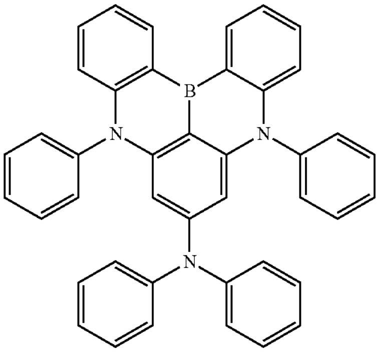

Dopant 4

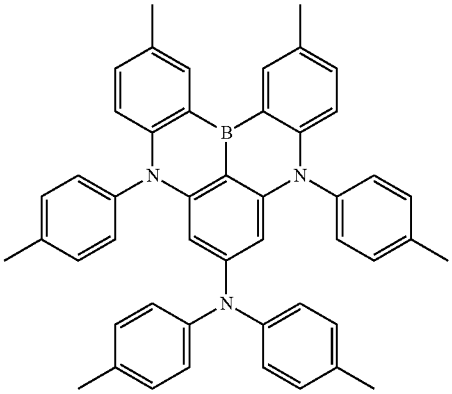

-continued
Dopant 5
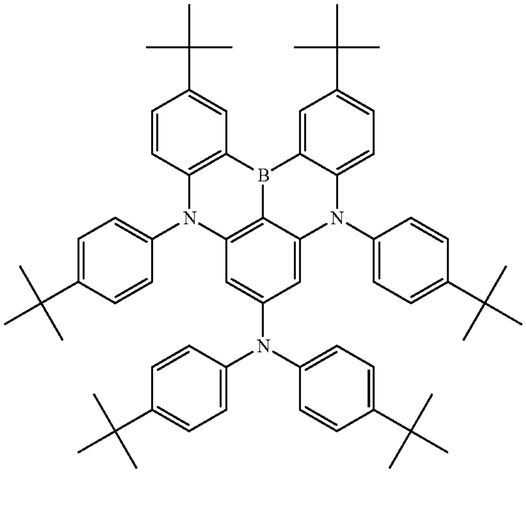
Dopant 6
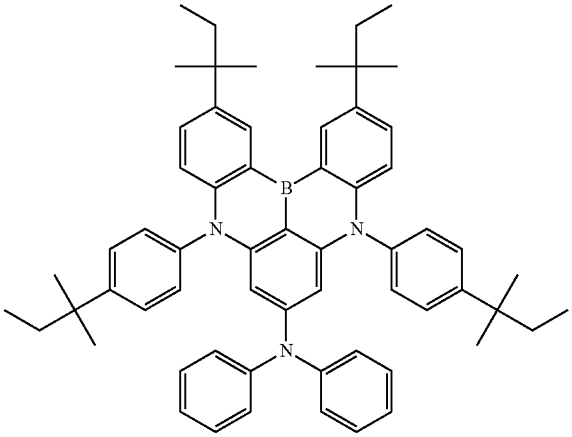
Dopant 7
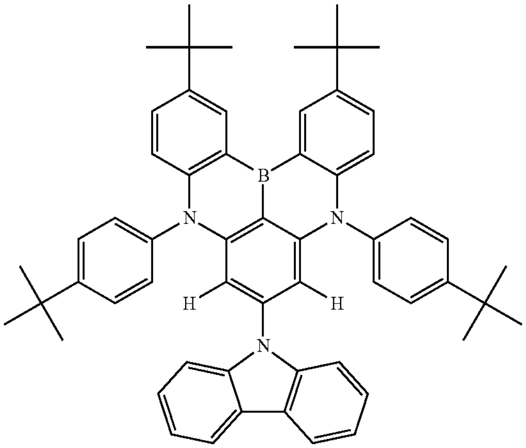
-continued
Dopant 8
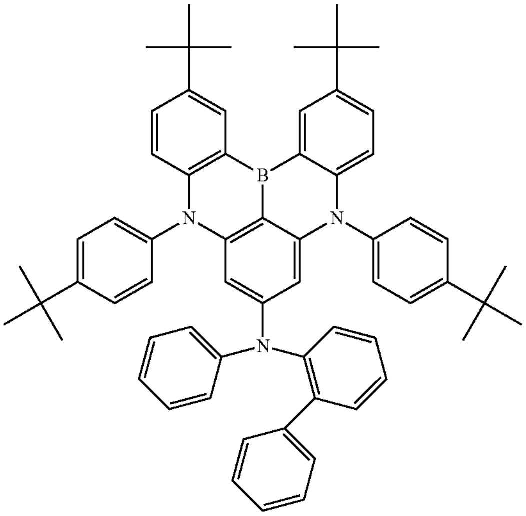
Dopant 9
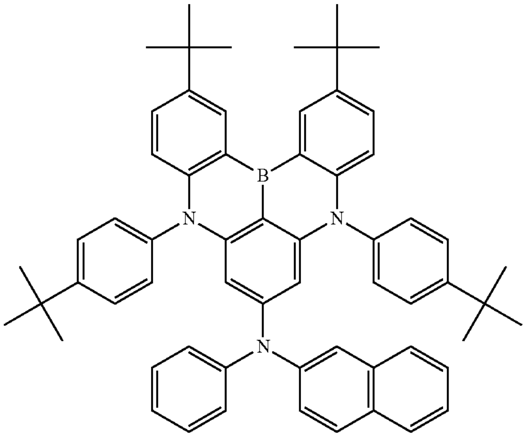
Dopant 10
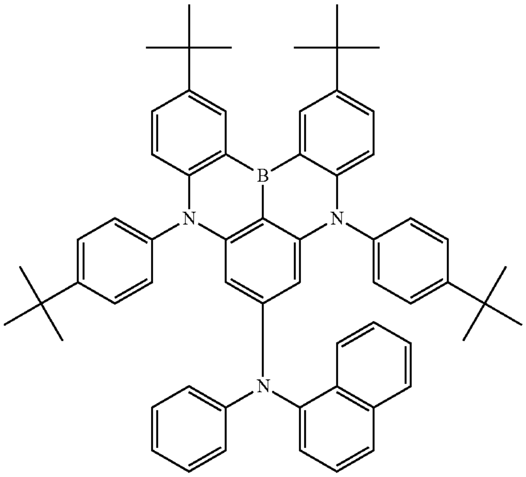

-continued
Dopant 11
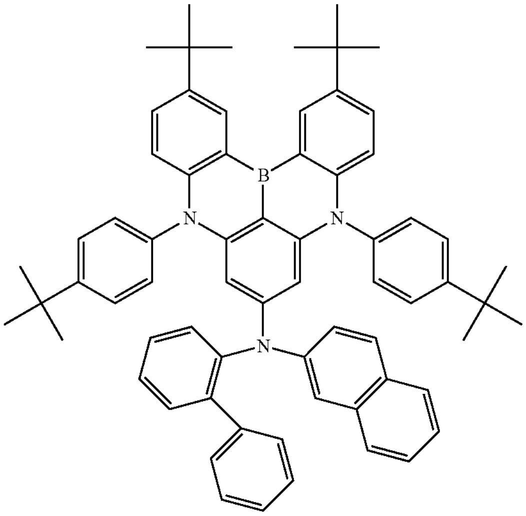
Dopant 12
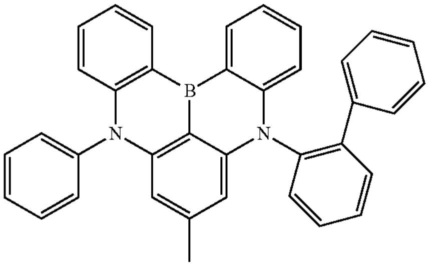
Dopant 13
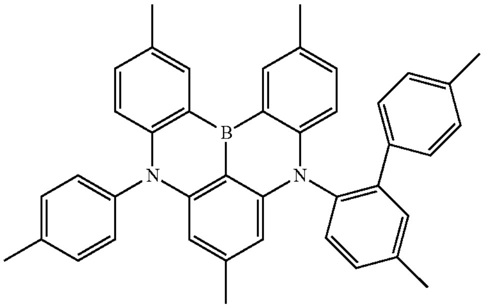
Dopant 14
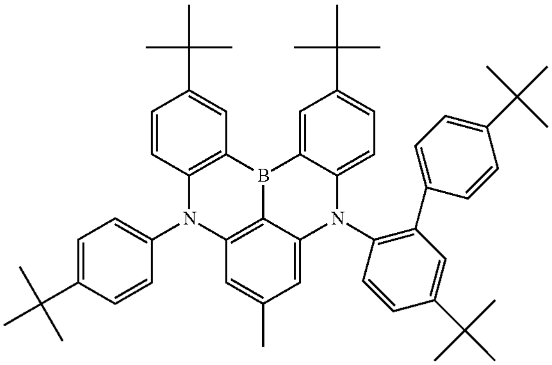
-continued
Dopant 15
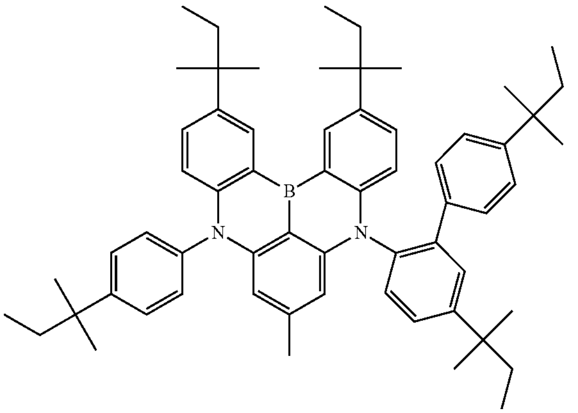
Dopant 16
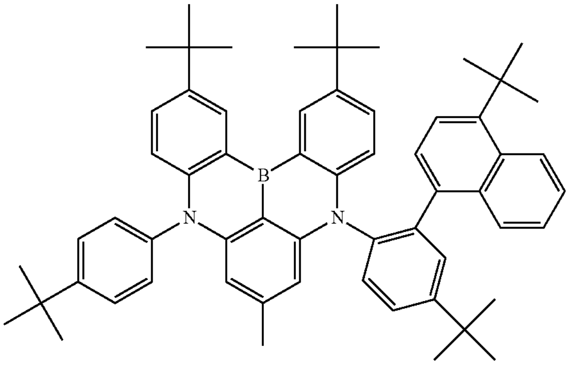
Dopant 17
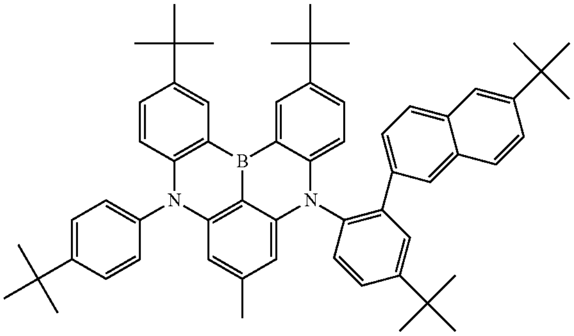
Dopant 18
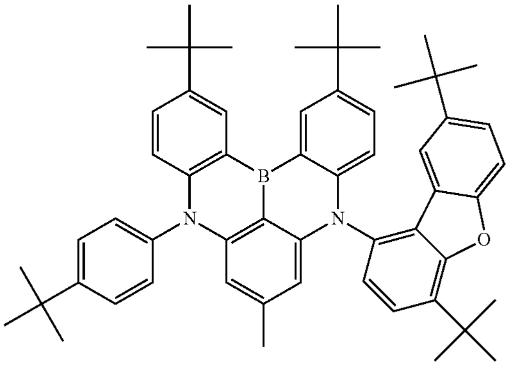

-continued

Dopant 19

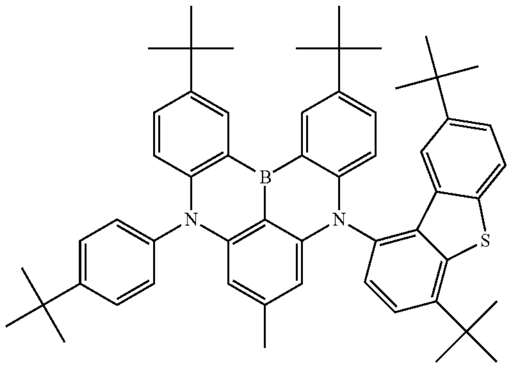

The first blue dopant can have a weight % of 0.1 weight % to 10 weight %, e.g., 1 weight % to 5 weight %, in the first blue EML 450, and the second blue dopant can have a weight % of 0.1 weight % to 10 weight %, e.g., 1 weight % to 5 weight %, in the second blue EML 470. For example, the weight % of the first blue dopant in the first blue EML 450 can be equal to or greater than that of the second blue dopant in the second blue EML 470.

Each of the first and second blue EMLs 450 and 470 can have a thickness of 100 to 1000 Å, e.g., 100 to 500 Å, but it is not limited thereto. For example, the thickness of the first blue EML 450 can be equal to or smaller than that of the second blue EML 470.

For example, the thickness of the first blue EML 450 can be smaller than that of the second blue EML 470, and the weight % of the first blue dopant in the first blue EML 450 can be greater than that of the second blue dopant in the second blue EML 470.

The HIL 442 in the second emitting part 440 includes the anthracene derivative, e.g., a first hole injection material, in Formula 9. In addition, the HIL 442 can further include a halide compound of alkali metal or a halide compound of alkali earth metal, i.e., a second hole injection material.

In the HIL 442, a weight ratio of the first hole injection material to the second hole injection material can be 8:2 to 5:5, and the HIL 442 can have a thickness of about 10 to 100 Å.

Each of the second HTL 444 in the second emitting part 440 and the third HTL 462 in the third emitting part 460 can include the compound in Formula 1-1 or the compound in Formula 3-1.

For example, a thickness of the third HTL 462 can be equal to or smaller than that of the second HTL 444 and can be greater than the first HTL 420. The first HTL 420 can have a thickness of about 10 to 150 Å, the second HTL 444 can have a thickness of about 500 to 1000 Å, and the third HTL 462 can have a thickness of about 500 to 900 Å.

Each of the first to third ETL 434, 448 and 466 can include at least one of the azine-based organic compound in Formula 11 and the benzimidazole-based organic compound in Formula 12.

For example, each of the first and third ETL 434 and 466 can include the electron transporting material in Formula 12, and the second ETL 448 can include the electron transporting material in Formula 11. The third ETL 466 can further include the electron transporting material in Formula 11. Namely, the first ETL 434 can include a single material of the electron transporting material in Formula 12, the second ETL 448 can include a single material of the electron transporting material in Formula 11, while the third ETL 466 can include two materials of the electron transporting materials in Formulas 11 and 12. In the third ETL 466, the electron transporting material in Formula 11 and the electron transporting material in Formula 12 can have the same weight %.

Each of the first EBL 446 in the second emitting part 440 and the second EBL 464 in the third emitting part 460 can include the electron blocking material in formula 15. Each of the first and second EBLs 446 and 464 can independently have a thickness of about 50 to 250 Å and can have the same thickness.

The first CGL 480 is positioned between the first emitting part 430 and the second emitting part 440, and the second CGL 490 is positioned between the first emitting part 430 and the third emitting part 460. Namely, the first and second emitting parts 430 and 440 are connected through the first CGL 480, and the first and third emitting parts 430 and 460 are connected through the second CGL 490. The first CGL 480 can be a P-N junction CGL of an N-type CGL 482 and a P-type CGL 484, and the second CGL 490 can be a P-N junction CGL of an N-type CGL 492 and a P-type CGL 494.

In the first CGL 480, the N-type CGL 482 is positioned between the first HTL 420 and the second ETL 448, and the P-type CGL 484 is positioned between the N-type CGL 482 and the first HTL 420.

In the second CGL 490, the N-type CGL 492 is positioned between the first ETL 434 and the third HTL 462, and the P-type CGL 494 is positioned between the N-type CGL 492 and the third HTL 462.

Each of the N-type CGL 482 in the first CGL 480 and the N-type CGL 492 in the second CGL 490 can include a phenanthroline-based compound of Formula 27 as an N-type charge generation material.

[Formula 27]

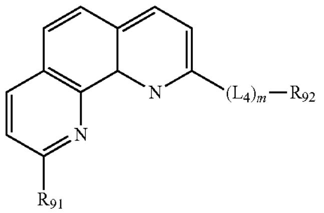

In Formula 27, $R_{91}$ is hydrogen or C6 to C30 aryl group, and $R_{92}$ is C6 to C30 aryl group. $L_4$ is C6 to C30 arylene group and/or C5 to C30 heteroarylene group, and m is 1 or 2.

In this instance, aryl group, arylene group and heteroarylene group can be unsubstituted or substituted with C1 to C10 alkyl.

For example, in Formula 27, $R_{91}$ can be hydrogen, phenyl unsubstituted or substituted with methyl, or naphthyl unsubstituted or substituted with methyl, and $R_{92}$ can be phenyl unsubstituted or substituted with methyl, naphthyl unsubstituted or substituted with methyl or phenanthrenyl unsubstituted or substituted with methyl. La can be phenylene, naphthylene, anthracenylene or phenanthrenylene.

The N-type charge generation material in Formula 27 can be one of the compounds in Formula 28.

[Formula 28]

H1

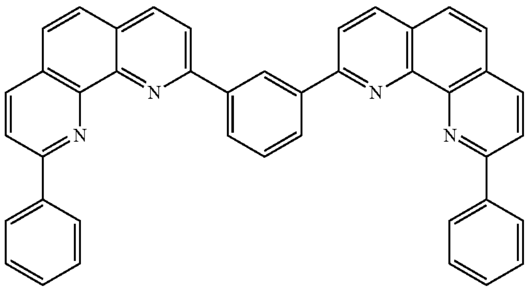

H2

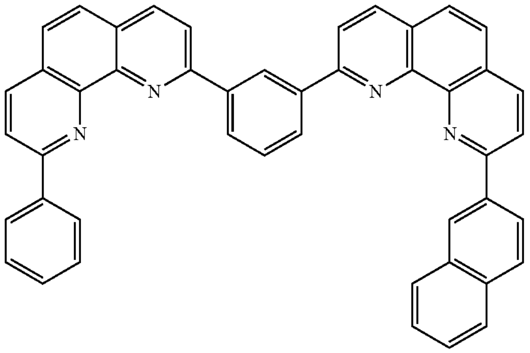

H3

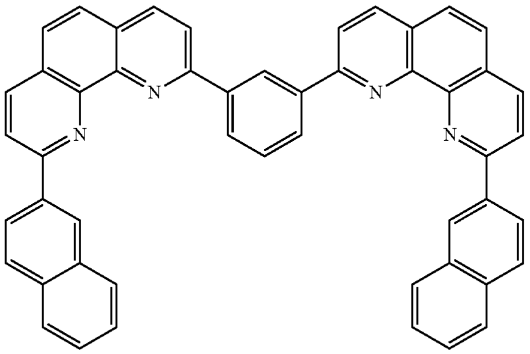

H4

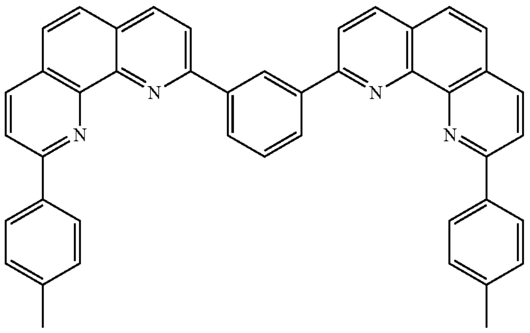

-continued

H5

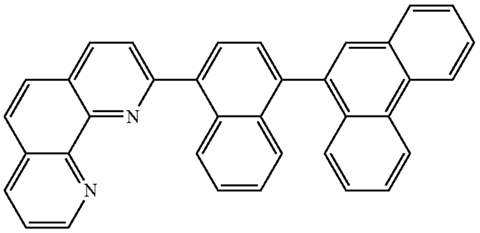

H6

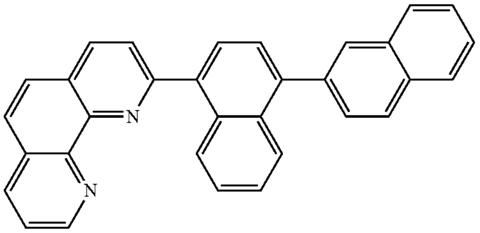

H7

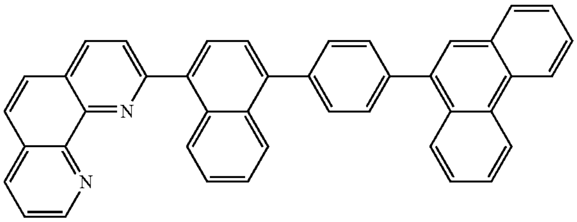

H8

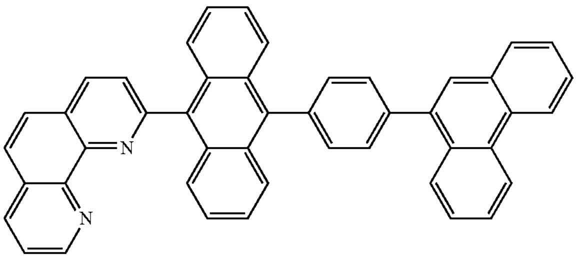

Each of the N-type CGL 482 in the first CGL 480 and the N-type CGL 492 in the second CGL 490 can further include a dopant being one of alkali metal, e.g., Li, Na, K or Cs, and alkali earth metal, e.g., Mg, Sr, Ba or Ra. In this instance, the electron generation property and/or the electron injection property of the N-type CGLs 482 and 492 can be improved. In each of the N-type CGLs 482 and 492, the dopant can have a weight % of 0.1 weight % to 10 weight %. In addition, each of the N-type CGLs 482 and 492 can have a thickness of 30 to 500 Å, preferably50 to 300 Å. For example, the weight % of the dopant in the N-type CGL 482 in the first CGL 480 can be greater than that of the dopant in the N-type CGL 492 in the second CGL 490, and the thickness of the N-type CGL 482 in the first CGL 480 can be smaller than that of the N-type CGL 492 in the second CGL 490.

Each of the P-type CGL 484 in the first CGL 480 and the P-type CGL 494 in the second CGL 490 can include a compound in Formula 29-1.

[Formula 29-1]

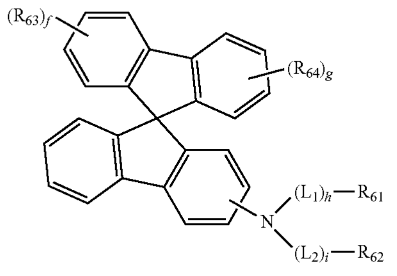

In Formula 29-1, each of $R_{61}$ and $R_{62}$ is independently selected from the group consisting of C6 to C30 aryl group and C3 to C30 heteroaryl group, and each of $R_{63}$ and $R_{64}$ is independently C1 to C20 alkyl group. Each of f and g is a number of substituent and is independently an integer of 0 to 4. Each of Li and $L_2$ is independently C6 to C30 arylene group, and each of h and i is 0 or 1.

In Formula 29-1, each of the aryl group, the heteroaryl group and the arylene group can be unsubstituted or substituted with at least one of C1 to C10 alkyl and C6 to C20 aryl.

For example, in Formula 29-1, each of $L_1$ and $L_2$ can be phenylene unsubstituted or substituted with C1 to C10 alkyl or C6 to C20 aryl, e.g., phenyl, and each of $R_{61}$ and $R_{62}$ can be independently selected from the group consisting of phenyl, naphthyl, fluorenyl, dibenzofuranly and carbazolyl, each of which can be unsubstituted or substituted with C1 to C10 alkyl or C6 to C20 aryl, e.g., phenyl.

In Formula 29-1, f, g, h and i can be 0 (zero), $R_{61}$ can be biphenylyl, and $R_{62}$ can be dimethyl-substituted fluorenyl. Namely, the compound in Formula 29-1 can be represented by Formula 29-2.

[Formula 29-2]

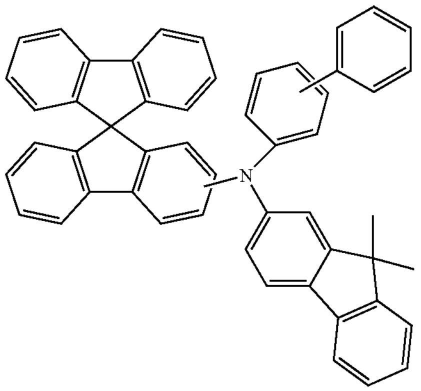

For example, the compound in Formula 29-1 or Formula 29-2 can be one of the compounds in Formula 30, but it is not limited thereto.

[Formula 30]

E1

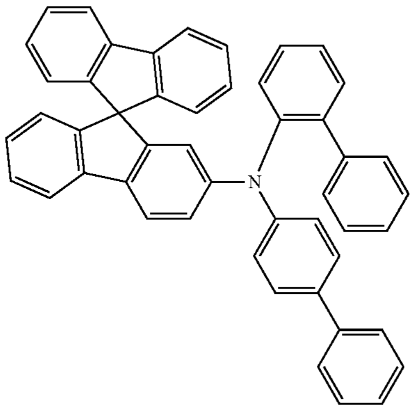

E2

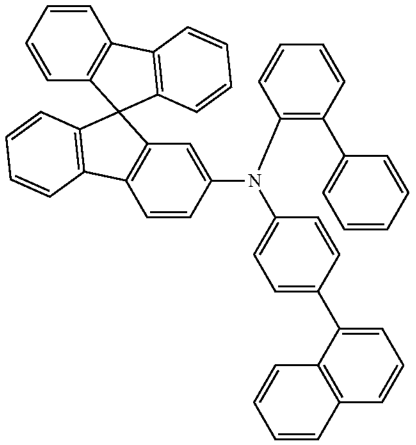

E3

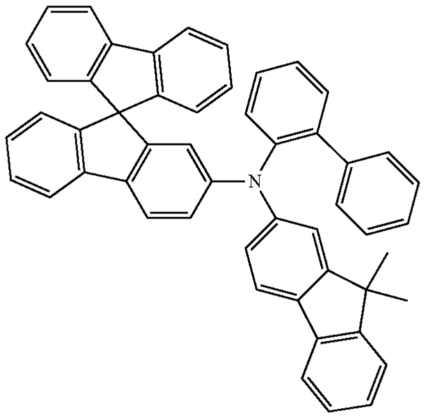

-continued
E4
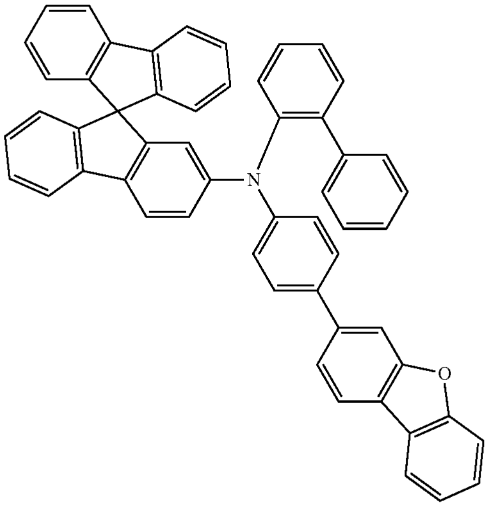
E5
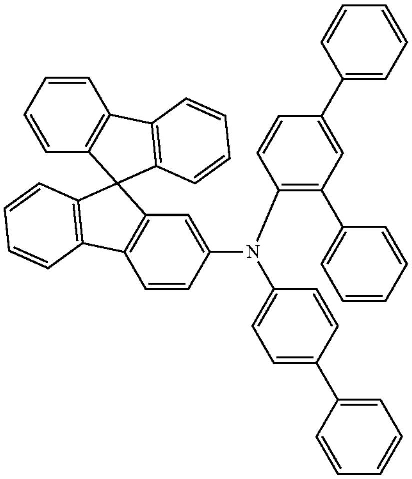
E6
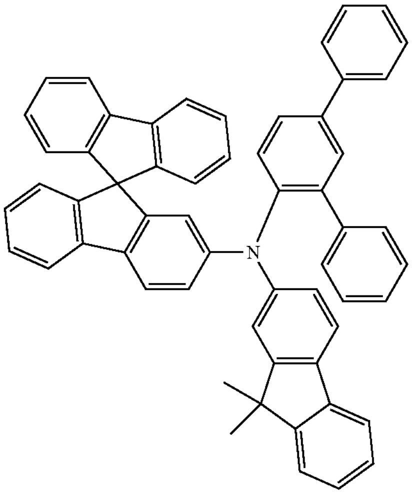
-continued
E7
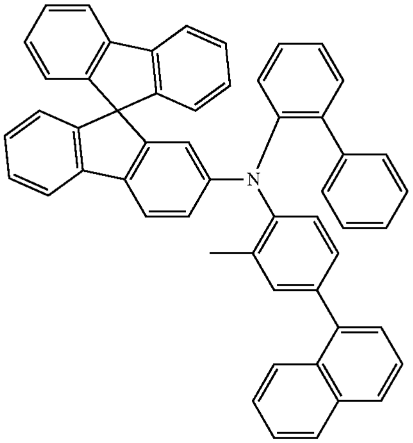
E8
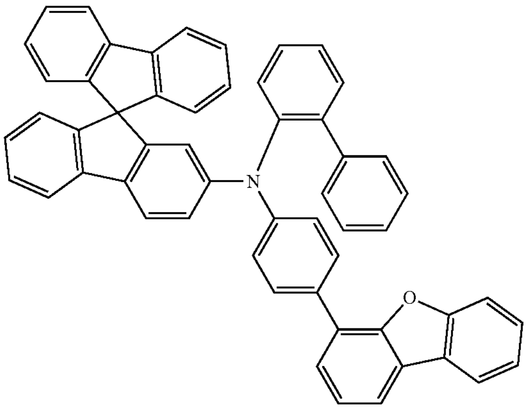
E9
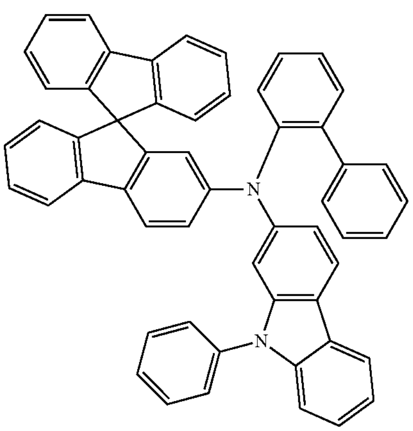

-continued
E10
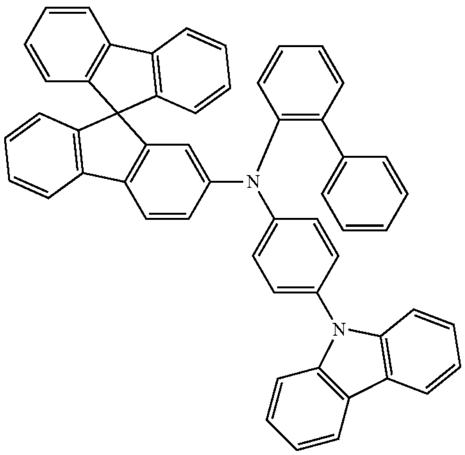
E11
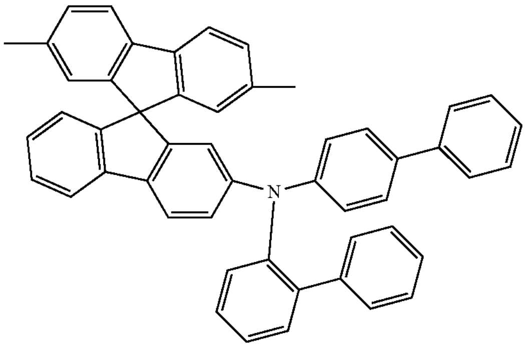
E12
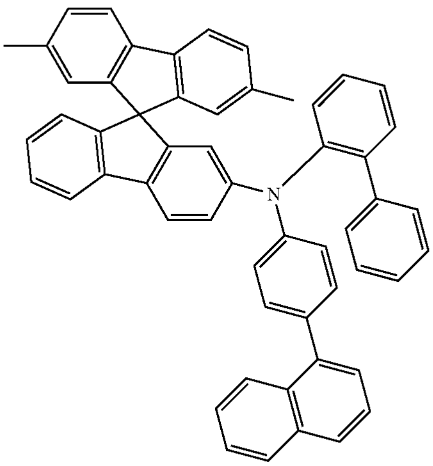
-continued
E13
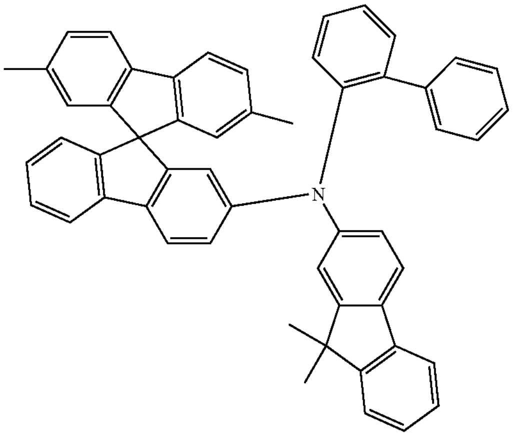
E14
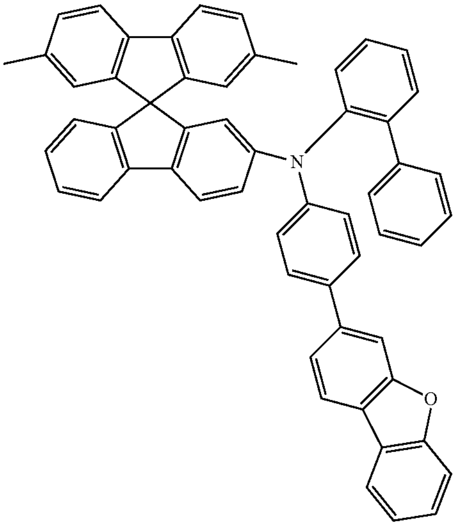
E15
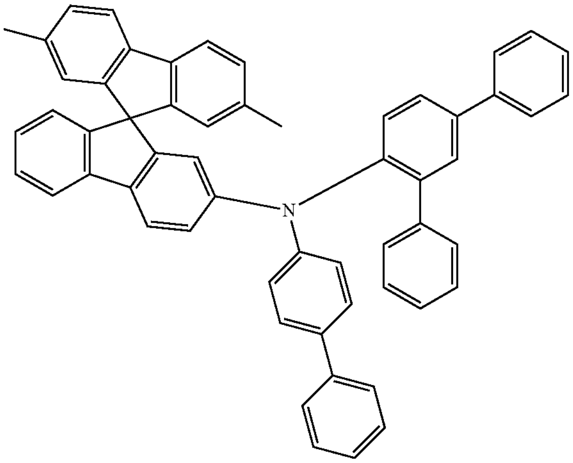

-continued

E16

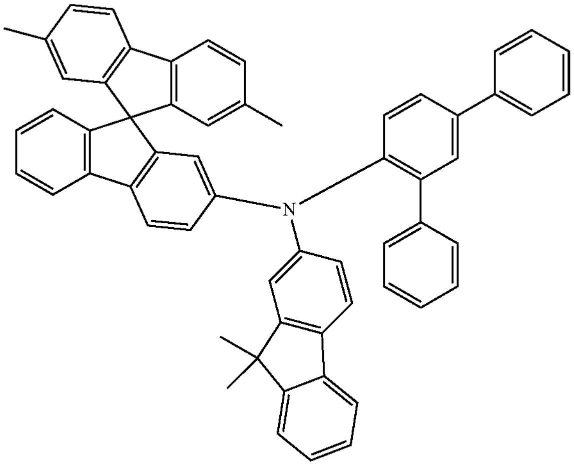

E17

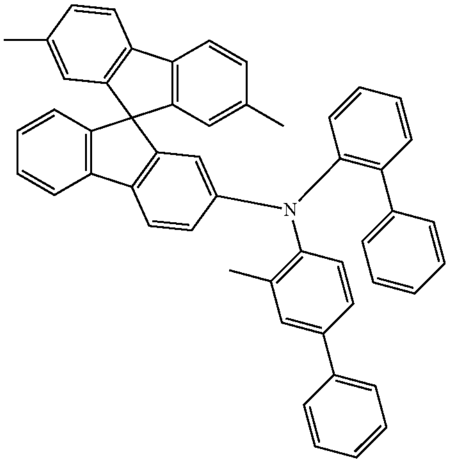

E18

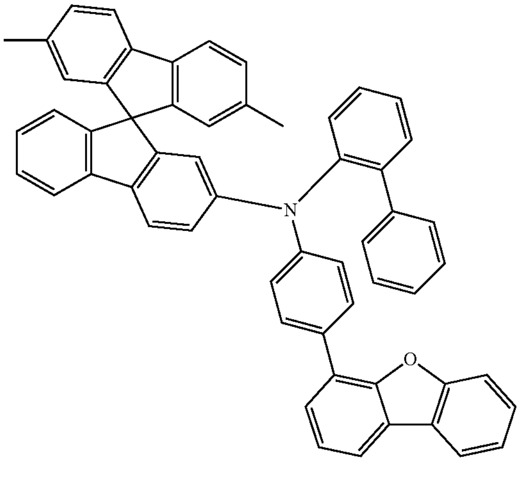

-continued

E19

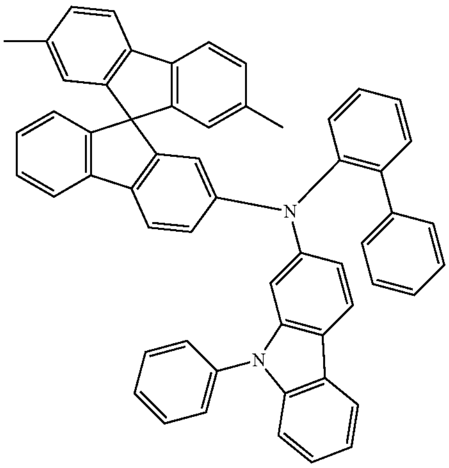

E20

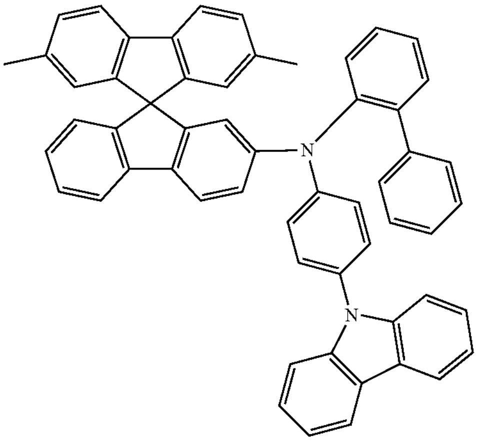

For example, in the P-type CGL 484 in the first CGL 480 being closer to the first HTL 420 in the first emitting part 430, the P-type charge generation material 486 can have the same structure as the hole transporting material in the first HTL 420 and the first host 412 in the red EML 410 but can be not deuterated.

In addition, a hole transporting material of each the second HTL 444 in the second emitting part 440 and the third HTL 462 in the third emitting part 460 can be represented by Formula 29-1 and can be selected from the compounds in Formula 30.

As described below, although the deuterated compound as Formula 1-1 is used as the P-type charge generation material 486 in the P-type CGL 484, the emitting efficiency and the lifespan of the OLED D are not improved. Accordingly, it is preferred that the non-deuterated compound as Formula 29-1 is used as the P-type charge generation material 486 in the first P-type CGL 484.

On the other hand, the P-type charge generation material 486 in the P-type CGL 484 can be the compound in Formula 1-1 or Formula 3-1.

In addition, the P-type CGL 484 in the first CGL 480 and the P-type CGL 494 in the second CGL 490 can further include a compound having a radialene structure in Formula 31 as a dopant.

[Formula 31]

I1

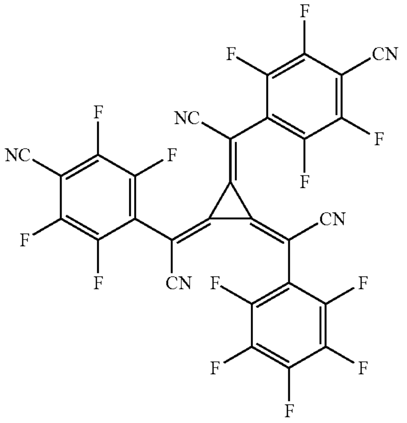

I2

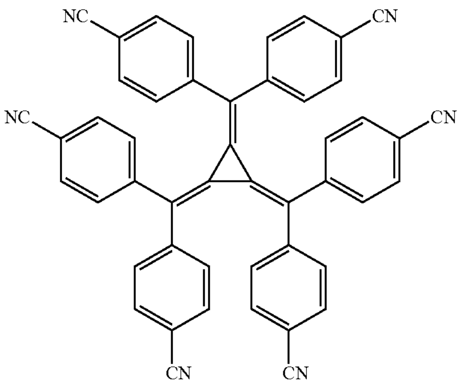

I3

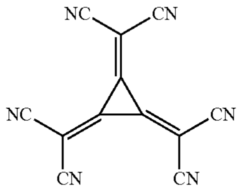

I4

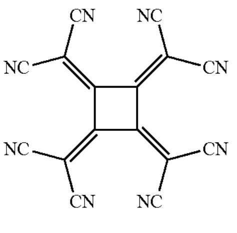

I5

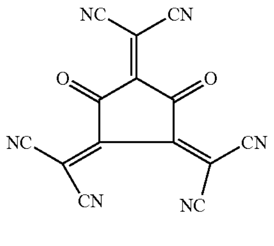

-continued

I6

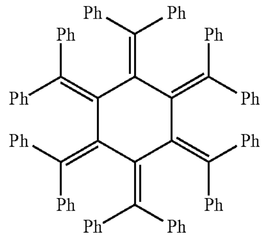

In each of the P-type CGL 484 in the first CGL 480 and the P-type CGL 494 in the second CGL 490, the dopant can have a weight % of 1 weight % to 40 weight %, preferably3 weight % to 30 weight %. In addition, each of the P-type CGL 484 in the first CGL 480 and the P-type CGL 494 in the second CGL 490 can have a thickness of 30 to 500 Å, preferably50 to 200 Å.

For example, the weight % of the dopant in the P-type CGL 484 in the first CGL 480 can be same as that of the dopant in the P-type CGL 494 in the second CGL 490, and the thickness of the P-type CGL 484 in the first CGL 480 can be smaller than that of the P-type CGL 494 in the second CGL 490.

As described above, the OLED D of the present disclosure includes the first emitting part 430 including the red EML 410, the green EML 432 and the first HTL 420, the second emitting part 440 including the first blue EML 450 and the third emitting part 460 including the second blue EML 470. Accordingly, the OLED D emits the white light.

In this instance, at least one of the first host 412 in the red EML 410 and the hole transporting material 422 in the first HTL 420 includes the compound in which the spiro-fluorene moiety is partially or wholly deuterated. Accordingly, the emitting efficiency and the lifespan of the OLED D and the organic light emitting display device 300 are increased.

In addition, the first blue EML 450 includes the first blue host being the anthracene derivative having a first deuteration ratio, and the second blue EML 470 includes the second blue host being the anthracene derivative having a second deuteration ratio, which is smaller than the first deuteration ratio. Accordingly, the emitting efficiency and the lifespan of the OLED D and the organic light emitting display device 300 are further increased.

Referring to FIG. 6, the organic emitting layer 362 includes a first emitting part 530, which includes a red EML 510, a green EML 532, a yellow-green EML 536 and a first HTL 520, a second emitting part 540 including a first blue EML 550, and a third emitting part 560 including a second blue EML 570. In addition, the organic emitting layer 362 can further include a first CGL 580 between the first and second emitting parts 530 and 540 and a second CGL 590 between the first and third emitting parts 530 and 560.

The second emitting part 540 is positioned between the first electrode 360 and the first emitting part 530, and the third emitting part 560 is positioned between the first emitting part 530 and the second electrode 364. In addition, the second emitting part 540 is positioned between the first electrode 360 and the first CGL 580, and the third emitting part 560 is positioned between the second CGL 590 and the second electrode 364. Namely, the second emitting part 540, the first CGL 580, the first emitting part 530, the second CGL 590 and the third emitting part 560 are sequentially stacked on the first electrode 360.

In the first emitting part 530, the red EML 510 is disposed under the yellow-green EML 536, and the green EML 532 is disposed over the yellow-green EML 536. Namely, the EML having a double-layered structure is included in the first emitting part 430 of the OLED in FIG. 5, while the EML having a triple-layered structure is included in the first emitting part 530 of the OLED in FIG. 6.

The first HTL 520 is disposed under the red EML 510. The first emitting part can further include a first ETL 534 over the green EML 532.

The second emitting part 540 can further include at least one of a second HTL 544 under the first blue EML 550 and a second ETL 548 on the first blue EML 550. In addition, the second emitting part 540 can further include an HIL 542 between the first electrode 360 and the second HTL 544. Moreover, the second emitting part 540 can further include a first EBL 546 between the second HTL 544 and the first blue EML 550.

The second emitting part 540 can further include a first HBL between the second ETL 548 and the first blue EML 550.

The third emitting part 560 can further include at least one of a third HTL 562 under the second blue EML 570 and a third ETL 566 on the second blue EML 570. In addition, the third emitting part 560 can further include an EIL 568 between the second electrode 364 and the third ETL 566. Moreover, the third emitting part 560 can further include a second EBL 564 between the third HTL 562 and the second blue EML 570.

The third emitting part 560 can further include a second HBL between the third ETL 566 and the second blue EML 570.

As described above, the red EML 510 includes the first compound as the host 512, e.g., a first host. In addition, the red EML 510 can further include the red dopant 514, e.g., a red emitter. In the red EML 510, the weight % of the host 512 being the first compound can be greater than that of the red dopant 514. The red dopant 514 can be one of the red phosphorescent compound, the red fluorescent compound and the red delayed-fluorescent compound.

In the red EML 510, the first compound as the host 512 can be represented by Formula 1-1, and the red dopant 514 can be represented by Formula 5.

In addition, the red EML 510 can further include a second host being an N-type host. For example, the second host can be represented by Formula 7.

When the red EML 510 includes the first host 512, the second host and the red dopant 514, a weight ratio of the first host 512 to the second host can be 1:9 to 9:1, preferably 2:8 to 8:2, more preferably3:7 to 7:3. For example, the weight % of the first host can be smaller than that of the second host. The weight ratio of the first host 512 to the second host can be 1:9 to 4:6, preferably3:7.

In the red EML 510, the red dopant 514 can have a weight % of 1 weight % to 10 weight %, preferably1 weight % to 5 weight %, but it is not limited thereto. The red EML 510 can have a thickness of 30 to 400 Å, preferably100 to 250 Å, but it is not limited thereto.

The first HTL 520 includes the hole transporting material represented by Formula 1-1 or Formula 3-1.

Namely, the first host 512 in the red EML 510 is a compound, in which the spiro-fluorene moiety except the arylamine moiety is partially or wholly deuterated, e.g., the compound in Formula 1-1, and the hole transporting material 522 in the first HTL 520 is one of a compound, in which the spiro-fluorene moiety except the arylamine moiety is partially or wholly deuterated, e.g., the compound in Formula 1-1, and a compound, which is not deuterated, or in which the arylamine moiety except the spiro-fluorene moiety is partially or wholly deuterated, or in which the spiro-fluorene moiety and the arylamine moiety are partially or wholly deuterated, e.g., the compound in Formula 3-1.

Alternatively, the hole transporting material 522 in the first HTL 520 can be the compound in Formula 1-1, and the first host 512 in the red EML 510 can be the compound in Formula 3-1.

When both of the first host 512 in the red EML 510 and the hole transporting material 522 in the first HTL 520 are the compound in Formula 1-1, the first host 512 and the hole transporting material 522 can be same or different.

In the first emitting part 530, the green EML 532 includes a host and a green dopant.

The host in the green EML 532 can include at least one of a P-type green host and an N-type green host. When the green EML 532 includes both the P-type green host and the N-type green host, a weight ratio of the P-type green host to the N-type green host can be 1:9 to 9:1, preferably2:8 to 8:2, more preferably3:7 to 7:3. For example, the weight % of the P-type green host can be greater than that of the N-type green host. The weight ratio of the P-type green host to the N-type green host can be 9:1 to 6:4, preferably7:3.

The P-type green host can be the compound represented by Formula 17, and the N-type green host can be the compound represented by Formula 19.

The green dopant can include at least one of a green phosphorescent compound, a green fluorescent compound and a green delayed-fluorescent compound. For example, the green dopant can be the compound represented by Formula 21.

In the green EML 532, the green dopant can have a weight % of 2 weight % to 20 weight %, preferably5 weight % to 15 weight %, but it is not limited thereto. The green EML 532 can has a thickness of 30 to 600 Å, preferably50 to 400 Å, but it is not limited thereto.

The yellow-green EML 536 can include a first yellow-green host and a yellow-green dopant. In addition, the yellow-green EML 536 can further include a second yellow-green host.

The first yellow-green host can be a P-type host and can be represented by Formula 32.

[Formula 32]

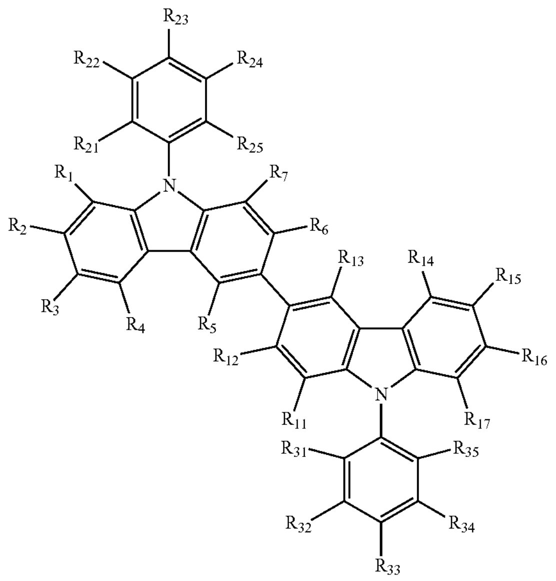

In Formula 32, each of $R_1$ to $R_7$ and $R_{11}$ to $R_1$ z is independently hydrogen or deuterium. Each of $R_{21}$ to $R_{25}$ and $R_{31}$ to $R_{35}$ is independently selected from the group consisting of hydrogen, deuterium, C1 to C10 alkyl group and C6 to C30 aryl group unsubstituted or substituted with deuterium, or adjacent two of $R_{21}$ to $R_2$s and/or adjacent two of $R_{31}$ to $R_{35}$ are combined (or linked) to each other to form a fused ring. For example, the fused ring can be an aromatic ring.

The first yellow-green host in Formula 32 can be one of the compounds in Formula 33.

[Formula 33]

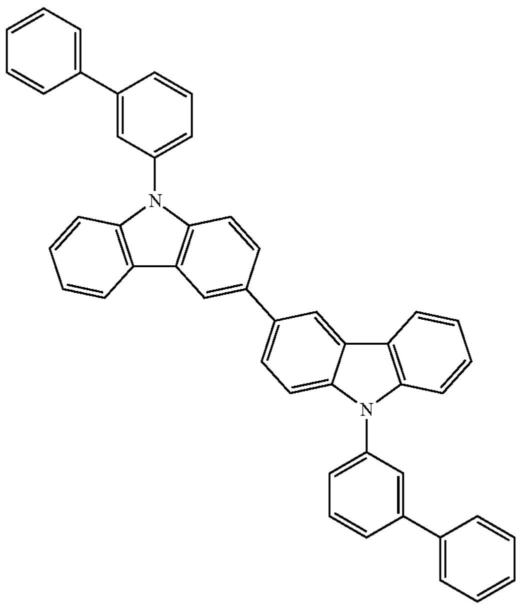

-continued

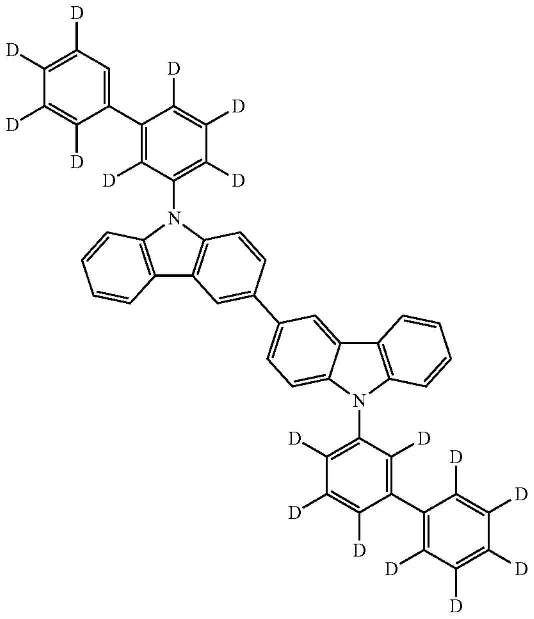

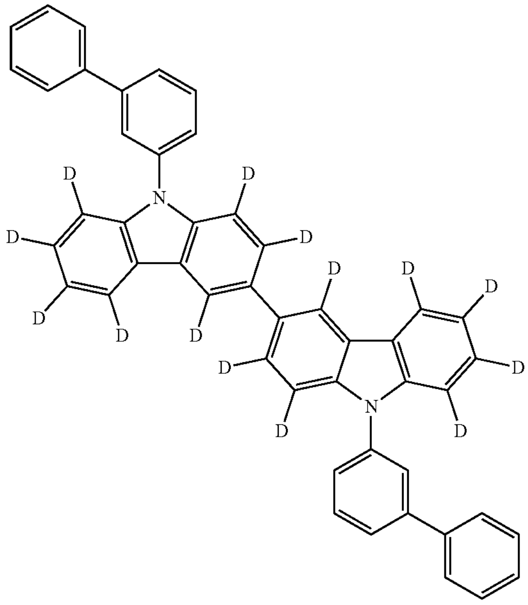

-continued
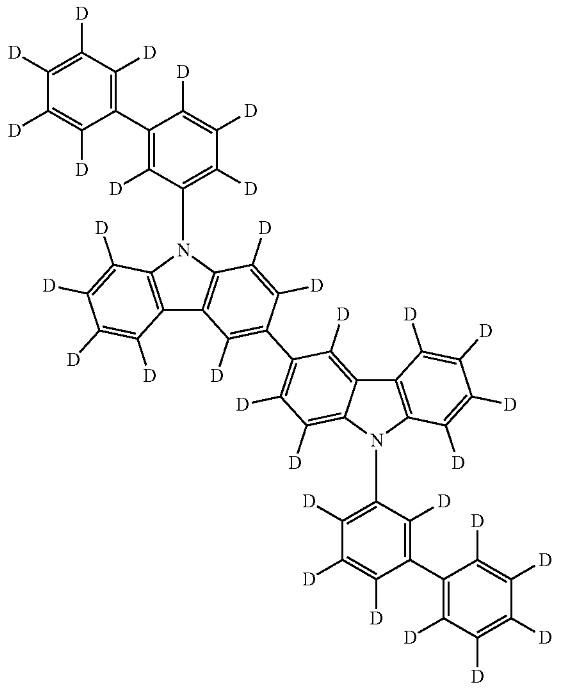
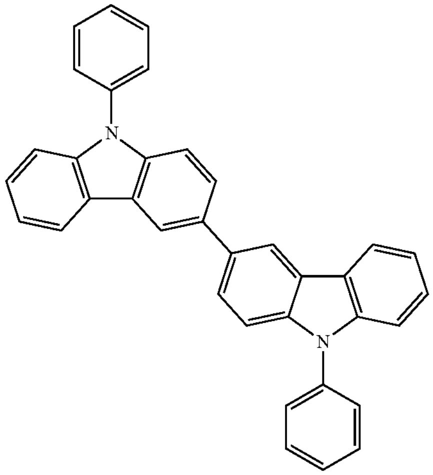
-continued
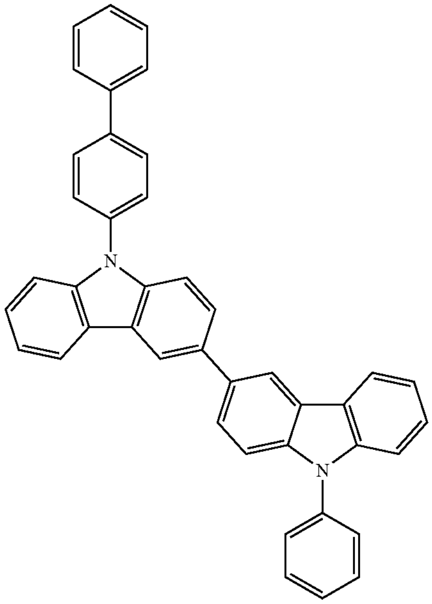
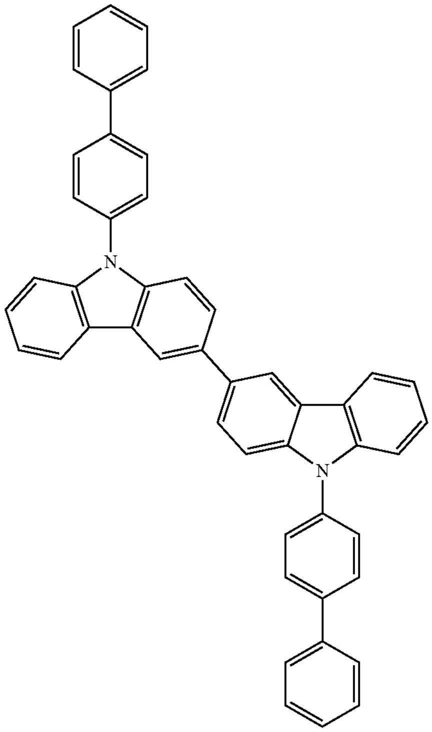

-continued
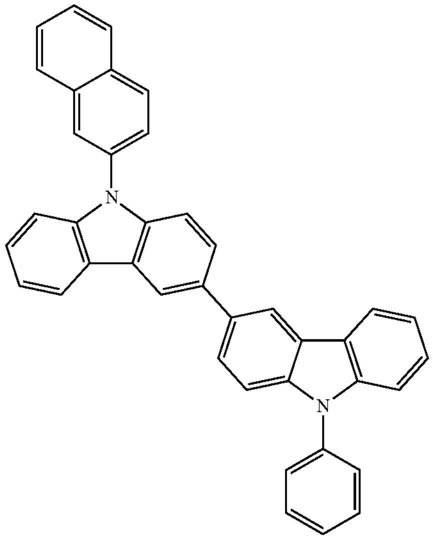
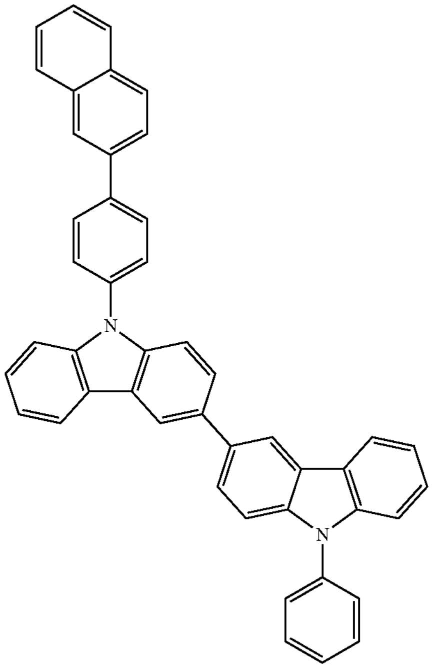
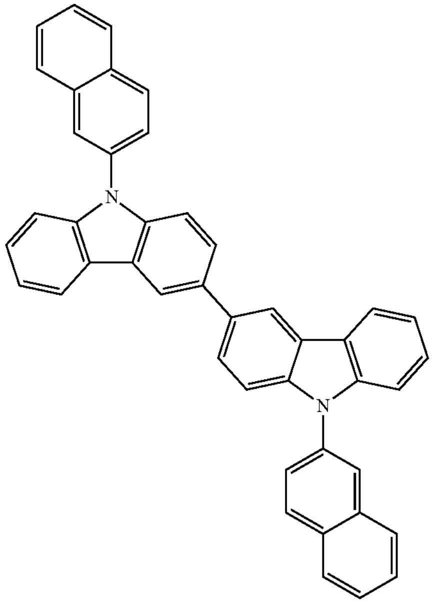
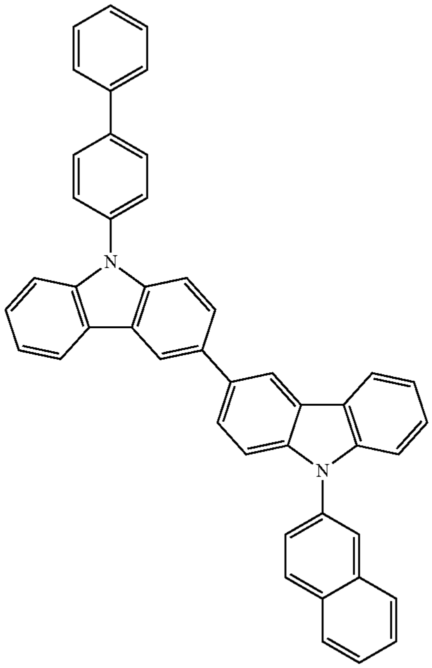

-continued

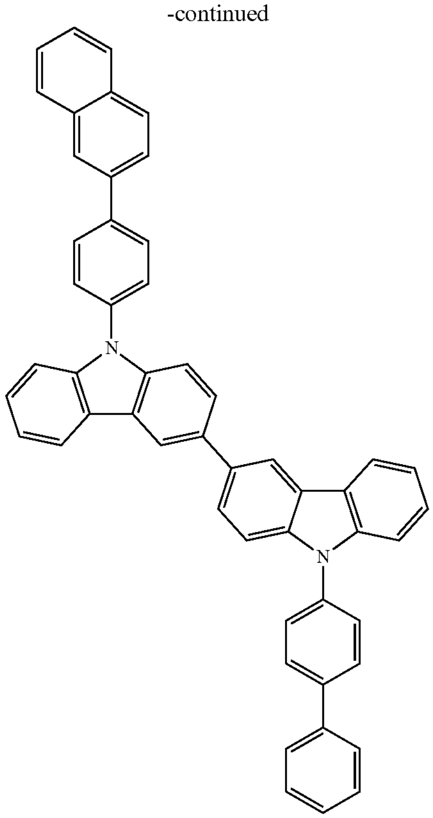

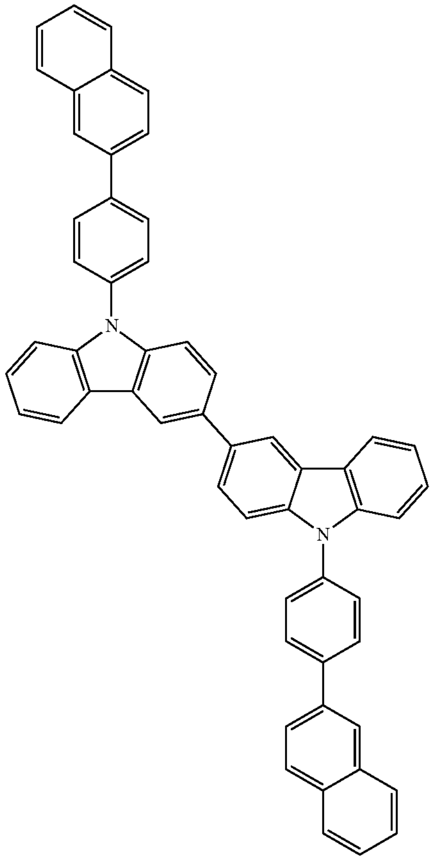 [SMILES: c1ccc2cc(-c3ccc(-n4c5ccccc5c5cc(-c6ccc7c(c6)c6ccccc6n7-c6ccc(-c7ccc8ccccc8c7)cc6)ccc54)cc3)ccc2c1]

The second yellow-green host can be an N-type host and can be represented by Formula 34.

[Formula 34]

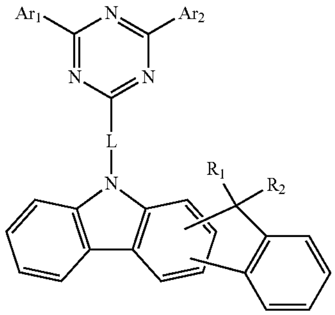

In Formula 34, each of Ar1 and Ar2 is independently C6 to C30 aryl group, each of $R_1$ and $R_2$ is independently selected from the group consisting of hydrogen, C1 to C10 alkyl group and C6 to C30 aryl group, and L is C6 to C30 arylene group.

For example, each of Ar1 and Ar2 can be independently phenyl or naphthyl, each of $R_1$ and $R_2$ can be C1 to C10 alkyl, and L can be phenylene or naphthylene.

The second yellow-green host in Formula 34 can be one of the compounds in Formula 35.

[Formula 35]

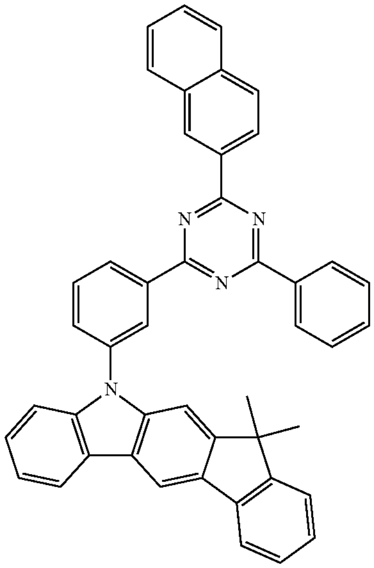

-continued
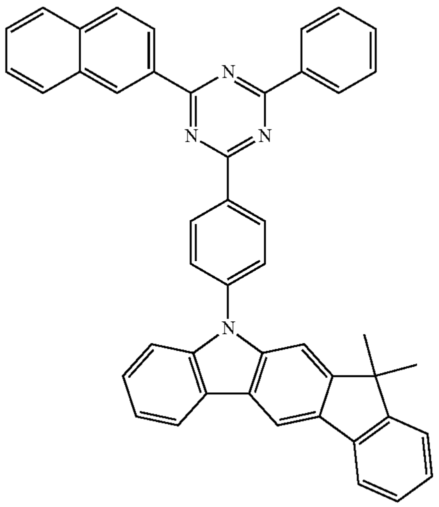
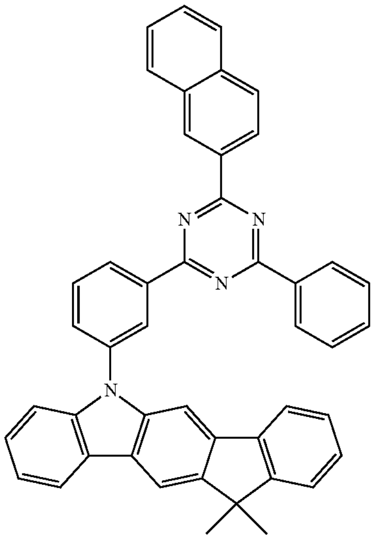
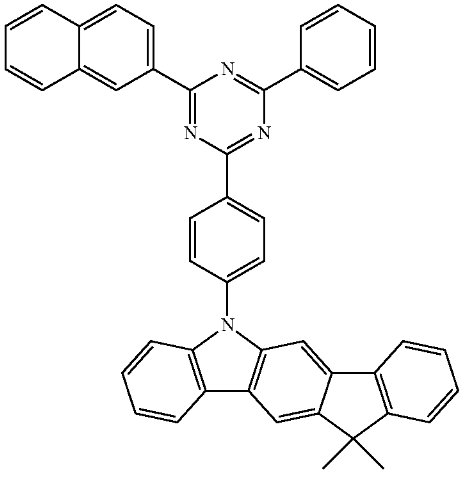
-continued
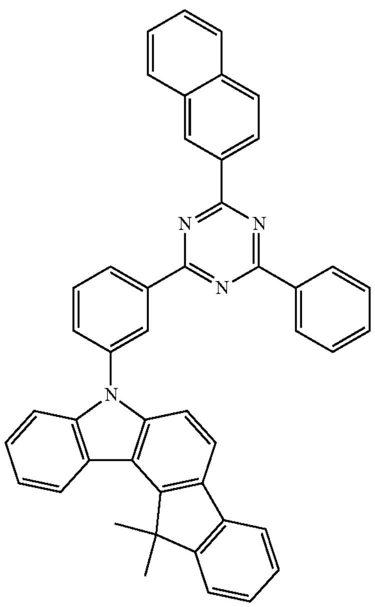
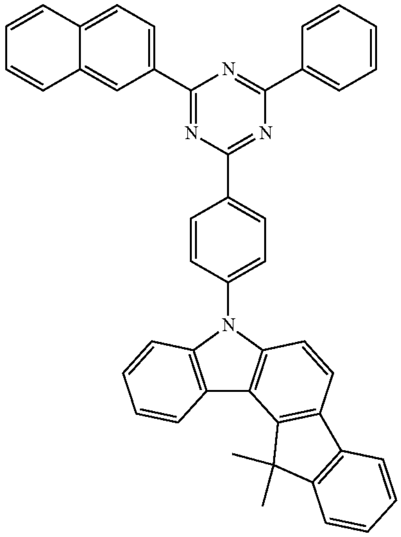

-continued
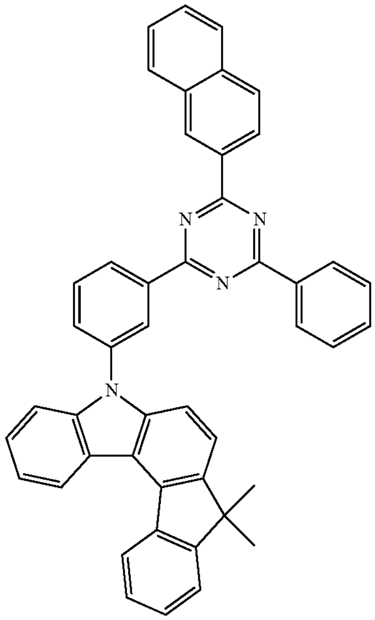
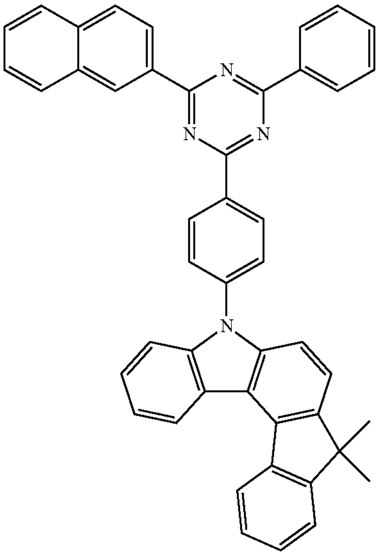
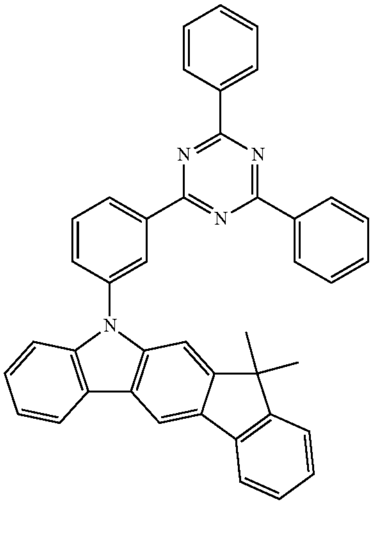
-continued
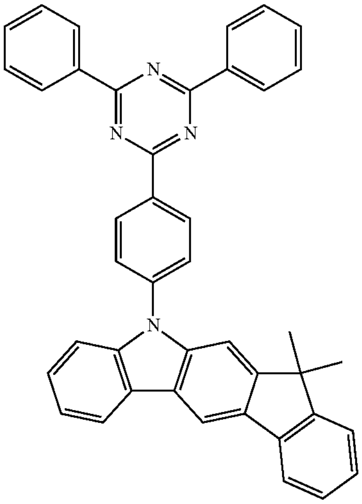
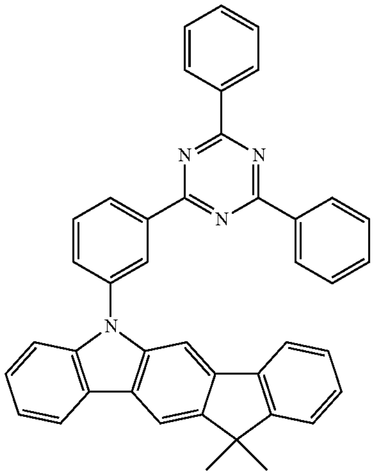
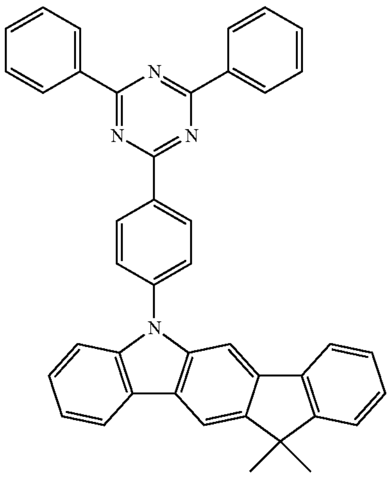

-continued
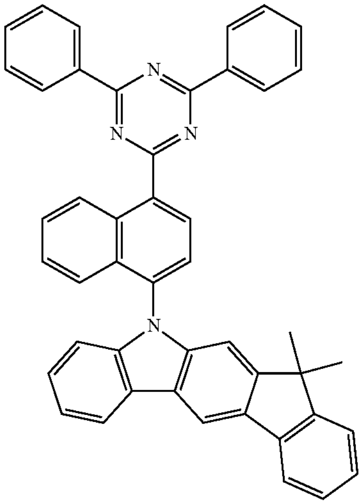
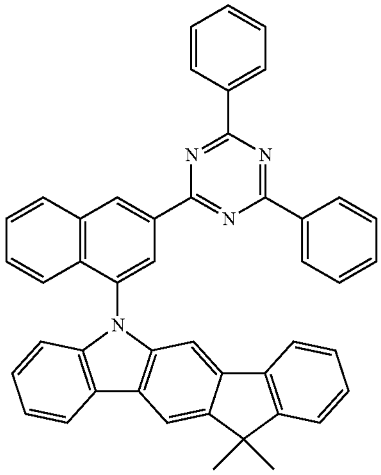
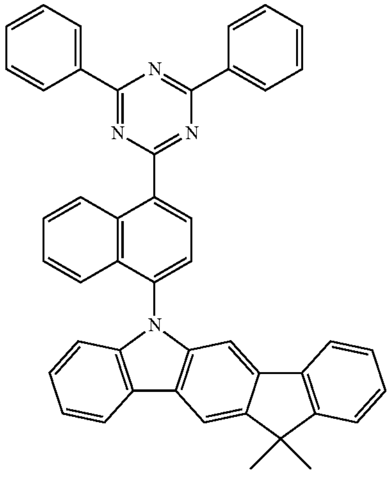
-continued
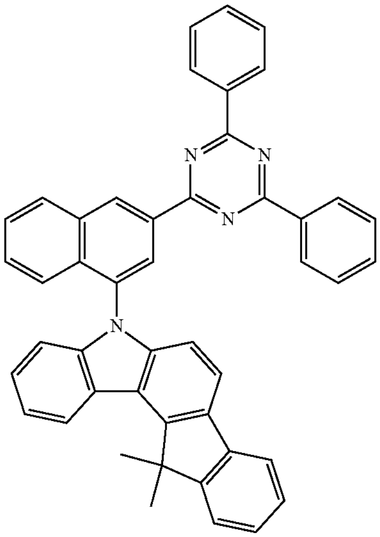
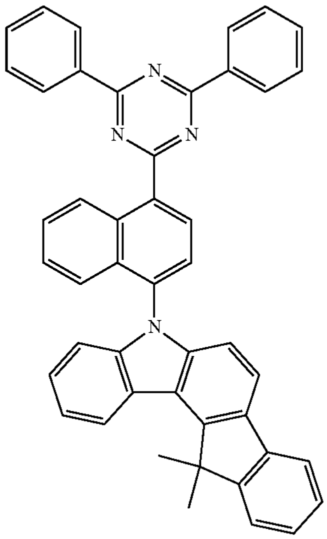
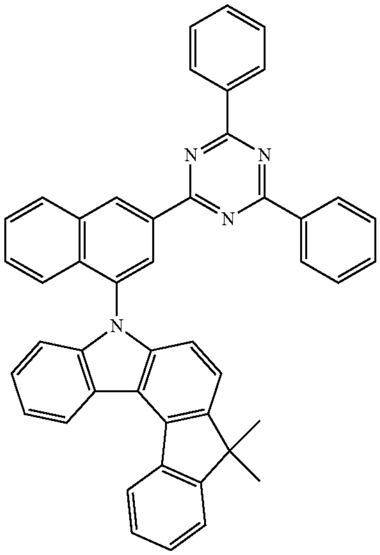

-continued
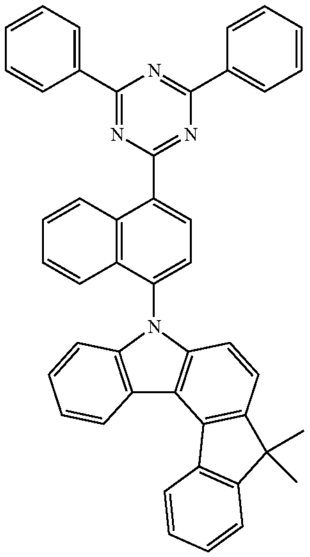
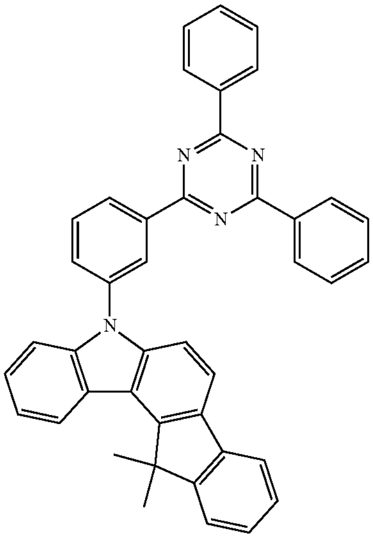
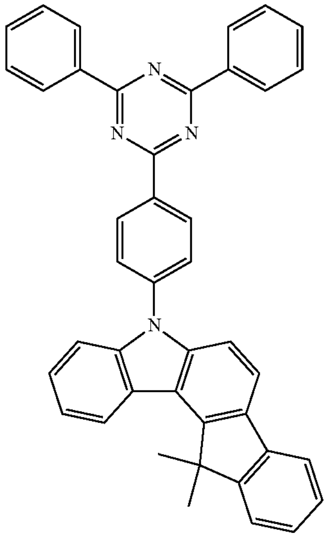
-continued
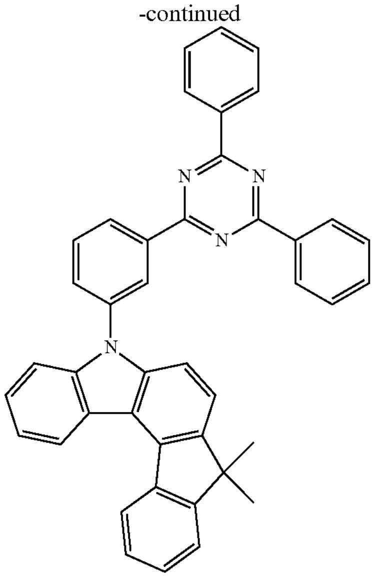
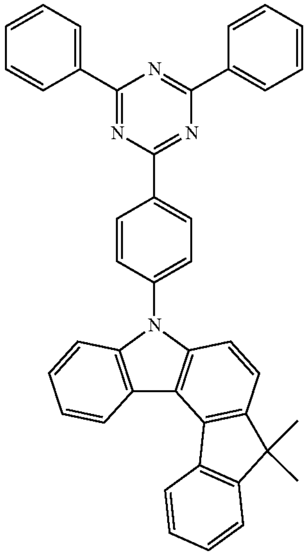
The yellow-green dopant can be represented by Formula 36.
[Formula 36]
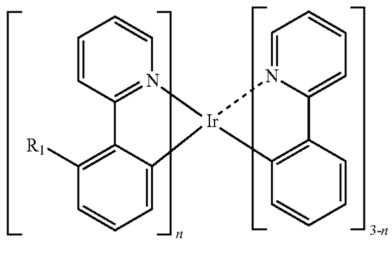
In Formula 36, $R_1$ is C6 to C30 aryl group, and n is an integer of 0 to 3.
The yellow-green dopant can be the compound in Formula 37.

[Formula 37]

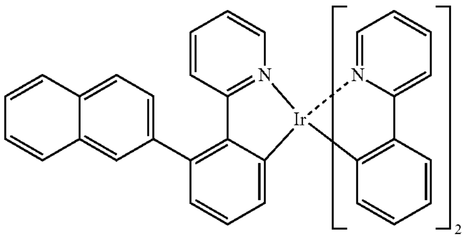

In the yellow-green EML 536, the yellow-green dopant can have a weight % of 3 weight % to 30 weight %. The yellow-green EML 536 can have a thickness of 50 to 400 Å.

When the yellow-green EML 536 includes the first yellow-green host and the second yellow-green host, a weight ratio of the first yellow-green host to the second yellow-green host can be 1:9 to 9:1, preferably2:8 to 8:2, and more preferably3:7 to 7:3. For example, the yellow-green EML 536 can have a thickness of 300 Å, the first yellow-green host and the second yellow-green host can have the same weight %, and the yellow-green dopant can be doped by 15 weight %.

The first blue EML 550 in the second emitting part 540 includes a first blue host and a first blue dopant, and the second blue EML 570 in the third emitting part 560 includes a second blue host and a second blue dopant. Each of the first and second blue hosts can be an anthracene derivative, and each of the first and second blue dopants can be a boron derivative.

For example, the first blue host in the first blue EML 550 can be represented by Formula 23-2 or Formula 23-4, and the second blue host in the second blue EML 570 can be represented by Formula 23-3 or Formula 23-5.

Namely, the first blue host in the first blue EML 550 and the second blue host in the second blue EML 570 can be the anthracene derivative having the same structure and can have a difference in a deuteration ratio. In other words, the first blue host in the first blue EML 550 can have a first deuteration ratio, and the second blue host in the second blue EML 570 can have a second deuteration ratio being smaller than the first deuteration ratio.

Each of the first blue dopant in the first blue EML 550 and the second blue dopant in the second blue EML 570 can be represented by Formula 25.

The first blue dopant can have a weight % of 0.1 weight % to 10 weight %, e.g., 1 weight % to 5 weight %, in the first blue EML 550, and the second blue dopant can have a weight % of 0.1 weight % to 10 weight %, e.g., 1 weight % to 5 weight %, in the second blue EML 570. For example, the weight % of the first blue dopant in the first blue EML 550 can be equal to or greater than that of the second blue dopant in the second blue EML 570.

Each of the first and second blue EMLs 550 and 570 can have a thickness of 100 to 1000 Å, e.g., 100 to 500 Å, but it is not limited thereto. For example, the thickness of the first blue EML 550 can be equal to or smaller than that of the second blue EML 570.

For example, the thickness of the first blue EML 550 can be smaller than that of the second blue EML 570, and the weight % of the first blue dopant in the first blue EML 550 can be greater than that of the second blue dopant in the second blue EML 570.

The HIL 542 in the second emitting part 540 includes the anthracene derivative, e.g., a first hole injection material, in Formula 9. In addition, the HIL 542 can further include a halide compound of alkali metal or a halide compound of alkali earth metal, i.e., a second hole injection material.

In the HIL 542, a weight ratio of the first hole injection material to the second hole injection material can be 8:2 to 5:5, and the HIL 542 can have a thickness of about 10 to 100 Å.

Each of the second HTL 544 in the second emitting part 540 and the third HTL 562 in the third emitting part 560 can include the compound in Formula 1-1 or the compound in Formula 3-1. Alternatively, the hole transporting material in each of the second HTL 544 in the second emitting part 540 and the third HTL 562 in the third emitting part 560 can be represented by Formula 29-1 and can be selected from the compounds in Formula 30.

For example, a thickness of the third HTL 562 can be equal to or smaller than that of the second HTL 544 and can be greater than the first HTL 520. The first HTL 520 can have a thickness of about 10 to 150 Å, the second HTL 544 can have a thickness of about 500 to 1000 Å, and the third HTL 562 can have a thickness of about 500 to 900 Å.

Each of the first to third ETL 534, 548 and 566 can include at least one of the azine-based organic compound in Formula 11 and the benzimidazole-based organic compound in Formula 12.

For example, each of the first and third ETL 534 and 566 can include the electron transporting material in Formula 12, and the second ETL 548 can include the electron transporting material in Formula 11. The third ETL 566 can further include the electron transporting material in Formula 11. Namely, the first ETL 534 can include a single material of the electron transporting material in Formula 12, the second ETL 548 can include a single material of the electron transporting material in Formula 11, while the third ETL 566 can include two materials of the electron transporting materials in Formulas 11 and 12. In the third ETL 566, the electron transporting material in Formula 11 and the electron transporting material in Formula 12 can have the same weight %.

Each of the first EBL 546 in the second emitting part 540 and the second EBL 564 in the third emitting part 560 can include the electron blocking material in formula 15. Each of the first and second EBLs 546 and 564 can independently have a thickness of about 50 to 250 Å and can have the same thickness.

The first CGL 580 is positioned between the first emitting part 530 and the second emitting part 540, and the second CGL 590 is positioned between the first emitting part 530 and the third emitting part 560. Namely, the first and second emitting parts 530 and 540 are connected through the first CGL 580, and the first and third emitting parts 530 and 560 are connected through the second CGL 590. The first CGL 580 can be a P-N junction CGL of an N-type CGL 582 and a P-type CGL 584, and the second CGL 590 can be a P-N junction CGL of an N-type CGL 592 and a P-type CGL 594.

In the first CGL 580, the N-type CGL 582 is positioned between the first HTL 520 and the second ETL 548, and the P-type CGL 584 is positioned between the N-type CGL 582 and the first HTL 520.

In the second CGL 590, the N-type CGL 592 is positioned between the first ETL 534 and the third HTL 562, and the P-type CGL 594 is positioned between the N-type CGL 592 and the third HTL 562.

Each of the N-type CGL 582 in the first CGL 580 and the N-type CGL 592 in the second CGL 590 can include the phenanthroline-based compound of Formula 27.

Each of the N-type CGL 582 in the first CGL 580 and the N-type CGL 592 in the second CGL 590 can further include a dopant being one of alkali metal, e.g., Li, Na, K or Cs, and alkali earth metal, e.g., Mg, Sr, Ba or Ra. In this instance, the electron generation property and/or the electron injection property of the N-type CGLs 582 and 592 can be improved. In each of the N-type CGLs 582 and 592, the dopant can have a weight % of 0.1 weight % to 10 weight %. In addition, each of the N-type CGLs 582 and 592 can have a thickness of 30 to 500 Å, preferably50 to 300 Å. For example, the weight % of the dopant in the N-type CGL 582 in the first CGL 580 can be greater than that of the dopant in the N-type CGL 592 in the second CGL 590, and the thickness of the N-type CGL 582 in the first CGL 580 can be smaller than that of the N-type CGL 592 in the second CGL 590.

Each of the P-type CGL 584 in the first CGL 580 and the P-type CGL 594 in the second CGL 590 can include the compound in Formula 29-1.

For example, in the P-type CGL 584 in the first CGL 580 being closer to the first HTL 520 in the first emitting part 530, the P-type charge generation material 586 can have the same structure as the hole transporting material in the first HTL 520 and the first host 512 in the red EML 510 but can be not deuterated.

As described below, although the deuterated compound as Formula 1-1 is used as the P-type charge generation material 586 in the P-type CGL 584, the emitting efficiency and the lifespan of the OLED D are not improved. Accordingly, it is preferred that the non-deuterated compound as Formula 29-1 is used as the P-type charge generation material 586 in the P-type CGL 584.

On the other hand, the P-type charge generation material 586 in the P-type CGL 584 can be the compound in Formula 1-1 or Formula 3-1.

In addition, the P-type CGL 584 in the first CGL 580 and the P-type CGL 594 in the second CGL 590 can further include the compound having a radialene structure in Formula 31 as a dopant.

In each of the P-type CGL 584 in the first CGL 580 and the P-type CGL 594 in the second CGL 590, the dopant can have a weight % of 1 weight % to 40 weight %, preferably3 weight % to 30 weight %. In addition, each of the P-type CGL 584 in the first CGL 580 and the P-type CGL 594 in the second CGL 590 can have a thickness of 30 to 500 Å, preferably50 to 200 Å.

For example, the weight % of the dopant in the P-type CGL 584 in the first CGL 580 can be same as that of the dopant in the P-type CGL 594 in the second CGL 590, and the thickness of the P-type CGL 584 in the first CGL 580 can be smaller than that of the P-type CGL 594 in the second CGL 590.

As described above, the OLED D of the present disclosure includes the first emitting part 530 including the red EML 510, the green EML 532, the yellow-green EML 536 and the first HTL 520, the second emitting part 540 including the first blue EML 550 and the third emitting part 560 including the second blue EML 570. Accordingly, the OLED D emits the white light.

In this instance, at least one of the first host 512 in the red EML 510 and the hole transporting material 522 in the first HTL 520 includes the compound in which the spiro-fluorene moiety is partially or wholly deuterated. Accordingly, the emitting efficiency and the lifespan of the OLED D and the organic light emitting display device 300 are increased.

In addition, the first blue EML 550 includes the first blue host being the anthracene derivative having a first deuteration ratio, and the second blue EML 570 includes the second blue host being the anthracene derivative having a second deuteration ratio, which is smaller than the first deuteration ratio. Accordingly, the emitting efficiency and the lifespan of the OLED D and the organic light emitting display device 300 are further increased.

Referring to FIG. 4 again, a second electrode 364 is formed over the substrate 310 where the organic emitting layer 362 is formed.

In the organic light emitting display device 300, since the light emitted from the organic emitting layer 362 is incident to the color filter layer 380 through the second electrode 364, the second electrode 364 has a thin profile for transmitting the light.

The first electrode 360, the organic emitting layer 362 and the second electrode 364 constitute the OLED D.

The color filter layer 380 is positioned over the OLED D and includes a red color filter 382, a green color filter 384 and a blue color filter 386 respectively corresponding to the red, green and blue pixel regions RP, GP and BP. The red color filter 382 can include at least one a red dye and a red pigment, the green color filter 384 can include at least one of a green dye and a green pigment, and the blue color filter 386 can include at least one of a blue dye and a blue pigment.

The color filter layer 380 can be attached to the OLED D by using an adhesive layer. Alternatively, the color filter layer 380 can be formed directly on the OLED D.

An encapsulation film can be formed to prevent penetration of moisture into the OLED D. For example, the encapsulation film can include a first inorganic insulating layer, an organic insulating layer and a second inorganic insulating layer sequentially stacked, but it is not limited thereto. The encapsulation film can be omitted.

A polarization plate for reducing an ambient light reflection can be disposed over the top-emission type OLED D. For example, the polarization plate can be a circular polarization plate.

In the organic light emitting display device 300 of FIG. 4, the first electrode 360 and the second electrode 364 are a reflective electrode and a transparent (semitransparent) electrode, respectively, and the color filter layer 380 is disposed over the OLED D. Alternatively, the first electrode 360 and the second electrode 364 are a transparent (semitransparent) electrode and a reflective electrode, respectively, and the color filter layer 380 can be disposed between the OLED D and the first substrate 310.

A color conversion layer can be formed between the OLED D and the color filter layer 380. The color conversion layer can include a red color conversion layer, a green color conversion layer and a blue color conversion layer respectively corresponding to the red, green and blue pixel regions RP, GP and BP. The white light from the OLED D is converted into the red light, the green light and the blue light by the red, green and blue color conversion layer, respectively. For example, the color conversion layer can include a quantum dot. The color purity of the organic light emitting display device 300 can be further improved due to the color conversion layer.

As described above, the white light from the organic light emitting diode D passes through the red color filter 382, the green color filter 384 and the blue color filter 386 in the red pixel region RP, the green pixel region GP and the blue pixel region BP such that the red light, the green light and the blue light are provided from the red pixel region RP, the green pixel region GP and the blue pixel region BP, respectively.

In FIG. 4, the OLED D emitting the white light is used for a display device. Alternatively, the OLED D can be formed on an entire surface of a substrate without at least one of the driving element and the color filter layer to be used for a lightening device. The display device and the lightening device each including the OLED D of the present disclosure can be referred to as an organic light emitting device.

In the OLED D and the organic light emitting display device 300, the first host in the red EML and the hole transporting material in the first HTL includes a compound in which the spiro-fluorene moiety is partially or wholly deuterated. Accordingly, the emitting efficiency and the lifespan of the OLED D and the organic light emitting display device 300 are increased.

[Organic Light Emitting Diode]

On the anode (ITO), the HIL (the compound J4 in Formula 10 and $MgF_2$ (weight ratio=1:1), 70 Å), the second HTL (the compound E3 in Formula 30, 850 Å), the first EBL (the compound H3 in Formula 16, 150 Å), the first blue EML (host (the compound Host1-1 and the compound Host1-5 (weight ratio-3:7)) and dopant (the compound Dopant2 in Formula 26, 3 wt % doping), 200 Å), the second ETL (the compound F1 in Formula 13, 60 Å), the first N-type CGL (the compound H1 in Formula 28 and Li (1.5 wt % doping), 170 Å), the first P-type CGL (a P-type charge generation material and the compound I1 in Formula 31 (10 wt % doping), 75 Å), the first HTL (a hole transporting material, 50 Å), the red EML (a P-type host and the N-type host (the compound N-9 in Formula 8, e.g., "REH", weight ratio=3:7) and dopant (the compound M8 (e.g., "RD") in Formula 6, 3.5 wt % doping), 150 Å), the green EML (host (the compound P2 in Formula 18 and the compound Q10 in Formula 20 (weight ratio=7:3)) and dopant (the compound $S_1$ in Formula 22, 10 wt % doping), 350 Å), the first ETL (the compound G1 in Formula 14, 180 Å), the second N-type CGL (the compound H1 in Formula 28 and Li (0.7 wt % doping), 240 Å), the second P-type CGL (the compound E3 in Formula 30 and the compound I1 in Formula 31 (10 wt % doping), 110 Å), the third HTL (the compound E3 in Formula 30, 640 Å), the second EBL (the compound H3 in Formula 16, 150 Å), the second blue EML (host (the compound Host1-1) and dopant (the compound Dopant2 in Formula 26, 2.5 wt % doping), 300 Å), the third ETL (the compound G1 in Formula 14, 230 Å), the EIL (LiF, 13.5 Å) and the cathode (AgMg (weight ratio=10:1), 175 Å) was sequentially deposited. An encapsulation film is formed by using an UV curable epoxy and a moisture getter to form the OLED.

1. Comparative Examples 1 to 100 to Ref100)

The compounds A-2 and B-2 in Formula 2 and the compounds A-1, A-3 to A-5, B-1 and B-3 to B-5 in Formula 4 are used for the P-type charge generation material of the first P-type CGL, the hole transporting material of the first HTL and the P-type host of the red EML.

2. Examples 1 to 54 (Ex1 to Ex54)

The compound A-2 and the compound B-2 in Formula 2 are used for at least one of the hole transporting material of the first HTL and the P-type host of the red EML.

The combinations of the compounds used in to Ref100 and Ex1 to Ex54 are listed in Tables 1 to 7, and the properties, e.g., the driving voltage (V), the efficiency (cd/A), the lifespan (hr) and the color coordinate, of the OLED of to Ref100 and Ex1 to Ex54 are measured and listed in Tables 8 to 14. The driving voltage and the efficiency were measured at a current density of 10 mA/$cm^2$, and the lifespan is the time until a luminance of 95% of the initial luminance is achieved at a current density of 40 mA/$cm^2$ and a temperature condition of 40° C.

TABLE 1

| | | | | R-EML | | |
|---|---|---|---|---|---|---|
| | p-CGL 1 | | HTL1 | Host1 | Host2 | Dopant |
| Ref1 | A-1 | p-dopant | A-1 | A-1 | REH | RD |
| Ref2 | A-2 | p-dopant | A-1 | A-1 | REH | RD |
| Ref3 | A-3 | p-dopant | A-1 | A-1 | REH | RD |
| Ref4 | A-4 | p-dopant | A-1 | A-1 | REH | RD |
| Ref5 | A-5 | p-dopant | A-1 | A-1 | REH | RD |
| Ex1 | A-1 | p-dopant | A-2 | A-1 | REH | RD |
| Ref6 | A-1 | p-dopant | A-3 | A-1 | REH | RD |
| Ref7 | A-1 | p-dopant | A-4 | A-1 | REH | RD |
| Ref8 | A-1 | p-dopant | A-5 | A-1 | REH | RD |
| Ex2 | A-1 | p-dopant | A-1 | A-2 | REH | RD |
| Ref9 | A-1 | p-dopant | A-1 | A-3 | REH | RD |
| Ref10 | A-1 | p-dopant | A-1 | A-4 | REH | RD |
| Ref11 | A-1 | p-dopant | A-1 | A-5 | REH | RD |
| Ex3 | A-2 | p-dopant | A-2 | A-1 | REH | RD |
| Ref12 | A-2 | p-dopant | A-3 | A-1 | REH | RD |
| Ref13 | A-2 | p-dopant | A-4 | A-1 | REH | RD |
| Ref14 | A-2 | p-dopant | A-5 | A-1 | REH | RD |
| Ex4 | A-3 | p-dopant | A-2 | A-1 | REH | RD |
| Ref15 | A-3 | p-dopant | A-3 | A-1 | REH | RD |
| Ref16 | A-3 | p-dopant | A-4 | A-1 | REH | RD |
| Ref17 | A-3 | p-dopant | A-5 | A-1 | REH | RD |
| Ex5 | A-4 | p-dopant | A-2 | A-1 | REH | RD |
| Ref18 | A-4 | p-dopant | A-3 | A-1 | REH | RD |
| Ref19 | A-4 | p-dopant | A-4 | A-1 | REH | RD |

TABLE 2

| | | | | R-EML | | |
|---|---|---|---|---|---|---|
| | p-CGL 1 | | HTL1 | Host1 | Host2 | Dopant |
| Ref20 | A-4 | p-dopant | A-5 | A-1 | REH | RD |
| Ex6 | A-5 | p-dopant | A-2 | A-1 | REH | RD |
| Ref21 | A-5 | p-dopant | A-3 | A-1 | REH | RD |
| Ref22 | A-5 | p-dopant | A-4 | A-1 | REH | RD |
| Ref23 | A-5 | p-dopant | A-5 | A-1 | REH | RD |
| Ex7 | A-2 | p-dopant | A-1 | A-2 | REH | RD |
| Ref24 | A-2 | p-dopant | A-1 | A-3 | REH | RD |
| Ref25 | A-2 | p-dopant | A-1 | A-4 | REH | RD |
| Ref26 | A-2 | p-dopant | A-1 | A-5 | REH | RD |
| Ex8 | A-3 | p-dopant | A-1 | A-2 | REH | RD |
| Ref27 | A-3 | p-dopant | A-1 | A-3 | REH | RD |
| Ref28 | A-3 | p-dopant | A-1 | A-4 | REH | RD |
| Ref29 | A-3 | p-dopant | A-1 | A-5 | REH | RD |
| Ex9 | A-4 | p-dopant | A-1 | A-2 | REH | RD |
| Ref30 | A-4 | p-dopant | A-1 | A-3 | REH | RD |
| Ref31 | A-4 | p-dopant | A-1 | A-4 | REH | RD |
| Ref32 | A-4 | p-dopant | A-1 | A-5 | REH | RD |
| Ex10 | A-5 | p-dopant | A-1 | A-2 | REH | RD |
| Ref33 | A-5 | p-dopant | A-1 | A-3 | REH | RD |
| Ref34 | A-5 | p-dopant | A-1 | A-4 | REH | RD |
| Ref35 | A-5 | p-dopant | A-1 | A-5 | REH | RD |
| Ex11 | A-1 | p-dopant | A-2 | A-2 | REH | RD |
| Ex12 | A-1 | p-dopant | A-2 | A-3 | REH | RD |
| Ex13 | A-1 | p-dopant | A-2 | A-4 | REH | RD |

TABLE 3

| | | | | R-EML | | |
|---|---|---|---|---|---|---|
| | p-CGL 1 | | HTL1 | Host1 | Host2 | Dopant |
| Ex14 | A-1 | p-dopant | A-2 | A-5 | REH | RD |
| Ex15 | A-1 | p-dopant | A-3 | A-2 | REH | RD |
| Ref36 | A-1 | p-dopant | A-3 | A-3 | REH | RD |
| Ref37 | A-1 | p-dopant | A-3 | A-4 | REH | RD |

TABLE 3-continued

| | | | | R-EML | | |
|---|---|---|---|---|---|---|
| | | p-CGL 1 | HTL1 | Host1 | Host2 | Dopant |
| Ref38 | A-1 | p-dopant | A-3 | A-5 | REH | RD |
| Ex16 | A-1 | p-dopant | A-4 | A-2 | REH | RD |
| Ref39 | A-1 | p-dopant | A-4 | A-3 | REH | RD |
| Ref40 | A-1 | p-dopant | A-4 | A-4 | REH | RD |
| Ref41 | A-1 | p-dopant | A-4 | A-5 | REH | RD |
| Ex17 | A-1 | p-dopant | A-5 | A-2 | REH | RD |
| Ref42 | A-1 | p-dopant | A-5 | A-3 | REH | RD |
| Ref43 | A-1 | p-dopant | A-5 | A-4 | REH | RD |
| Ref44 | A-1 | p-dopant | A-5 | A-5 | REH | RD |
| Ex18 | A-2 | p-dopant | A-2 | A-2 | REH | RD |
| Ex19 | A-2 | p-dopant | A-2 | A-3 | REH | RD |
| Ex20 | A-2 | p-dopant | A-2 | A-4 | REH | RD |
| Ex21 | A-2 | p-dopant | A-2 | A-5 | REH | RD |
| Ex22 | A-2 | p-dopant | A-5 | A-2 | REH | RD |
| Ref45 | A-2 | p-dopant | A-5 | A-3 | REH | RD |
| Ref46 | A-2 | p-dopant | A-5 | A-4 | REH | RD |
| Ref47 | A-2 | p-dopant | A-5 | A-5 | REH | RD |
| Ex23 | A-5 | p-dopant | A-2 | A-2 | REH | RD |
| Ex24 | A-5 | p-dopant | A-2 | A-3 | REH | RD |
| Ex25 | A-5 | p-dopant | A-2 | A-4 | REH | RD |

TABLE 4

| | | | | R-EML | | |
|---|---|---|---|---|---|---|
| | | p-CGL 1 | HTL1 | Host1 | Host2 | Dopant |
| Ex26 | A-5 | p-dopant | A-2 | A-5 | REH | RD |
| Ex27 | A-5 | p-dopant | A-5 | A-2 | REH | RD |
| Ref48 | A-5 | p-dopant | A-5 | A-3 | REH | RD |
| Ref49 | A-5 | p-dopant | A-5 | A-4 | REH | RD |
| Ref50 | A-5 | p-dopant | A-5 | A-5 | REH | RD |
| Ref51 | B-1 | p-dopant | B-1 | B-1 | REH | RD |
| Ref52 | B-2 | p-dopant | B-1 | B-1 | REH | RD |
| Ref53 | B-3 | p-dopant | B-1 | B-1 | REH | RD |
| Ref54 | B-4 | p-dopant | B-1 | B-1 | REH | RD |
| Ref55 | B-5 | p-dopant | B-1 | B-1 | REH | RD |
| Ex28 | B-1 | p-dopant | B-2 | B-1 | REH | RD |
| Ref56 | B-1 | p-dopant | B-3 | B-1 | REH | RD |
| Ref57 | B-1 | p-dopant | B-4 | B-1 | REH | RD |
| Ref58 | B-1 | p-dopant | B-5 | B-1 | REH | RD |
| Ex29 | B-1 | p-dopant | B-1 | B-2 | REH | RD |
| Ref59 | B-1 | p-dopant | B-1 | B-3 | REH | RD |
| Ref60 | B-1 | p-dopant | B-1 | B-4 | REH | RD |
| Ref61 | B-1 | p-dopant | B-1 | B-5 | REH | RD |
| Ex30 | B-2 | p-dopant | B-2 | B-1 | REH | RD |
| Ref62 | B-2 | p-dopant | B-3 | B-1 | REH | RD |
| Ref63 | B-2 | p-dopant | B-4 | B-1 | REH | RD |
| Ref64 | B-2 | p-dopant | B-5 | B-1 | REH | RD |
| Ex31 | B-3 | p-dopant | B-2 | B-1 | REH | RD |
| Ref65 | B-3 | p-dopant | B-3 | B-1 | REH | RD |

TABLE 5

| | | | | R-EML | | |
|---|---|---|---|---|---|---|
| | | p-CGL 1 | HTL1 | Host1 | Host2 | Dopant |
| Ref66 | B-3 | p-dopant | B-4 | B-1 | REH | RD |
| Ref67 | B-3 | p-dopant | B-5 | B-1 | REH | RD |
| Ex32 | B-4 | p-dopant | B-2 | B-1 | REH | RD |
| Ref68 | B-4 | p-dopant | B-3 | B-1 | REH | RD |
| Ref69 | B-4 | p-dopant | B-4 | B-1 | REH | RD |
| Ref70 | B-4 | p-dopant | B-5 | B-1 | REH | RD |
| Ex33 | B-5 | p-dopant | B-2 | B-1 | REH | RD |
| Ref71 | B-5 | p-dopant | B-3 | B-1 | REH | RD |
| Ref72 | B-5 | p-dopant | B-4 | B-1 | REH | RD |
| Ref73 | B-5 | p-dopant | B-5 | B-1 | REH | RD |
| Ex34 | B-2 | p-dopant | B-1 | B-2 | REH | RD |
| Ref74 | B-2 | p-dopant | B-1 | B-3 | REH | RD |
| Ref75 | B-2 | p-dopant | B-1 | B-4 | REH | RD |

TABLE 5-continued

| | | | | R-EML | | |
|---|---|---|---|---|---|---|
| | | p-CGL 1 | HTL1 | Host1 | Host2 | Dopant |
| Ref76 | B-2 | p-dopant | B-1 | B-5 | REH | RD |
| Ex35 | B-3 | p-dopant | B-1 | B-2 | REH | RD |
| Ref77 | B-3 | p-dopant | B-1 | B-3 | REH | RD |
| Ref78 | B-3 | p-dopant | B-1 | B-4 | REH | RD |
| Ref79 | B-3 | p-dopant | B-1 | B-5 | REH | RD |
| Ex36 | B-4 | p-dopant | B-1 | B-2 | REH | RD |
| Ref80 | B-4 | p-dopant | B-1 | B-3 | REH | RD |
| Ref81 | B-4 | p-dopant | B-1 | B-4 | REH | RD |
| Ref82 | B-4 | p-dopant | B-1 | B-5 | REH | RD |
| Ex37 | B-5 | p-dopant | B-1 | B-2 | REH | RD |
| Ref83 | B-5 | p-dopant | B-1 | B-3 | REH | RD |

TABLE 6

| | | | | R-EML | | |
|---|---|---|---|---|---|---|
| | | p-CGL 1 | HTL1 | Host1 | Host2 | Dopant |
| Ref84 | B-5 | p-dopant | B-1 | B-4 | REH | RD |
| Ref85 | B-5 | p-dopant | B-1 | B-5 | REH | RD |
| Ex38 | B-1 | p-dopant | B-2 | B-2 | REH | RD |
| Ex39 | B-1 | p-dopant | B-2 | B-3 | REH | RD |
| Ex40 | B-1 | p-dopant | B-2 | B-4 | REH | RD |
| Ex41 | B-1 | p-dopant | B-2 | B-5 | REH | RD |
| Ex42 | B-1 | p-dopant | B-3 | B-2 | REH | RD |
| Ref86 | B-1 | p-dopant | B-3 | B-3 | REH | RD |
| Ref89 | B-1 | p-dopant | B-3 | B-4 | REH | RD |
| Ref88 | B-1 | p-dopant | B-3 | B-5 | REH | RD |
| Ex43 | B-1 | p-dopant | B-4 | B-2 | REH | RD |
| Ref89 | B-1 | p-dopant | B-4 | B-3 | REH | RD |
| Ref90 | B-1 | p-dopant | B-4 | B-4 | REH | RD |
| Ref91 | B-1 | p-dopant | B-4 | B-5 | REH | RD |
| Ex44 | B-1 | p-dopant | B-5 | B-2 | REH | RD |
| Ref92 | B-1 | p-dopant | B-5 | B-3 | REH | RD |
| Ref93 | B-1 | p-dopant | B-5 | B-4 | REH | RD |
| Ref94 | B-1 | p-dopant | B-5 | B-5 | REH | RD |
| Ex45 | B-2 | p-dopant | B-2 | B-2 | REH | RD |
| Ex46 | B-2 | p-dopant | B-2 | B-3 | REH | RD |
| Ex47 | B-2 | p-dopant | B-2 | B-4 | REH | RD |
| Ex48 | B-2 | p-dopant | B-2 | B-5 | REH | RD |
| Ex49 | B-2 | p-dopant | B-5 | B-2 | REH | RD |
| Ref95 | B-2 | p-dopant | B-5 | B-3 | REH | RD |

TABLE 7

| | | | | R-EML | | |
|---|---|---|---|---|---|---|
| | | p-CGL 1 | HTL1 | Host1 | Host2 | Dopant |
| Ref96 | B-2 | p-dopant | B-5 | B-4 | REH | RD |
| Ref97 | B-2 | p-dopant | B-5 | B-5 | REH | RD |
| Ex50 | B-5 | p-dopant | B-2 | B-2 | REH | RD |
| Ex51 | B-5 | p-dopant | B-2 | B-3 | REH | RD |
| Ex52 | B-5 | p-dopant | B-2 | B-4 | REH | RD |
| Ex53 | B-5 | p-dopant | B-2 | B-5 | REH | RD |
| Ex54 | B-5 | p-dopant | B-5 | B-2 | REH | RD |
| Ref98 | B-5 | p-dopant | B-5 | B-3 | REH | RD |
| Ref99 | B-5 | p-dopant | B-5 | B-4 | REH | RD |
| Ref100 | B-5 | p-dopant | B-5 | B-5 | REH | RD |

TABLE 8

| | Results | | | | |
|---|---|---|---|---|---|
| | V | cd/A | hr | CIEx | CIEy |
| Ref1 | 12.25 | 71.77 | 120 | 0.272 | 0.293 |
| Ref2 | 12.25 | 72.05 | 121 | 0.272 | 0.293 |
| Ref3 | 12.26 | 71.41 | 121 | 0.272 | 0.293 |

TABLE 8-continued

| | Results | | | | |
|---|---|---|---|---|---|
| | V | cd/A | hr | CIEx | CIEy |
| Ref4 | 12.26 | 71.55 | 120 | 0.272 | 0.293 |
| Ref5 | 12.26 | 71.91 | 121 | 0.272 | 0.293 |
| Ex1 | 12.25 | 73.20 | 133 | 0.272 | 0.293 |
| Ref6 | 12.25 | 72.48 | 122 | 0.272 | 0.293 |
| Ref7 | 12.25 | 72.48 | 121 | 0.272 | 0.293 |
| Ref8 | 12.35 | 72.48 | 131 | 0.272 | 0.293 |
| Ex2 | 12.25 | 71.41 | 144 | 0.272 | 0.293 |
| Ref9 | 12.25 | 71.05 | 122 | 0.272 | 0.293 |
| Ref10 | 12.25 | 71.05 | 122 | 0.272 | 0.293 |
| Ref11 | 12.26 | 71.05 | 144 | 0.272 | 0.293 |
| Ex3 | 12.25 | 73.20 | 133 | 0.272 | 0.293 |
| Ref12 | 12.25 | 72.48 | 121 | 0.272 | 0.293 |
| Ref13 | 12.25 | 72.48 | 121 | 0.272 | 0.293 |
| Ref14 | 12.35 | 72.48 | 131 | 0.272 | 0.293 |
| Ex4 | 12.25 | 73.20 | 133 | 0.272 | 0.293 |
| Ref15 | 12.25 | 72.48 | 122 | 0.272 | 0.293 |
| Ref16 | 12.25 | 72.48 | 121 | 0.272 | 0.293 |
| Ref17 | 12.35 | 72.48 | 131 | 0.272 | 0.293 |
| Ex5 | 12.25 | 73.20 | 133 | 0.272 | 0.293 |
| Ref18 | 12.25 | 72.48 | 121 | 0.272 | 0.293 |
| Ref19 | 12.25 | 72.48 | 121 | 0.272 | 0.293 |

TABLE 9

| | Results | | | | |
|---|---|---|---|---|---|
| | V | cd/A | hr | CIEx | CIEy |
| Ref20 | 12.35 | 72.48 | 131 | 0.272 | 0.293 |
| Ex6 | 12.25 | 73.20 | 133 | 0.272 | 0.293 |
| Ref21 | 12.25 | 72.48 | 122 | 0.272 | 0.293 |
| Ref22 | 12.25 | 72.48 | 121 | 0.272 | 0.293 |
| Ref23 | 12.35 | 72.48 | 131 | 0.272 | 0.293 |
| Ex7 | 12.25 | 71.41 | 144 | 0.272 | 0.293 |
| Ref24 | 12.25 | 71.05 | 121 | 0.272 | 0.293 |
| Ref25 | 12.25 | 71.05 | 121 | 0.272 | 0.293 |
| Ref26 | 12.27 | 71.05 | 144 | 0.272 | 0.293 |
| Ex8 | 12.25 | 71.41 | 144 | 0.272 | 0.293 |
| Ref27 | 12.25 | 71.05 | 122 | 0.272 | 0.293 |
| Ref28 | 12.25 | 71.05 | 121 | 0.272 | 0.293 |
| Ref29 | 12.26 | 71.05 | 144 | 0.272 | 0.293 |
| Ex9 | 12.25 | 71.41 | 145 | 0.272 | 0.293 |
| Ref30 | 12.25 | 71.05 | 121 | 0.272 | 0.293 |
| Ref31 | 12.25 | 71.05 | 122 | 0.272 | 0.293 |
| Ref32 | 12.27 | 71.05 | 144 | 0.272 | 0.293 |
| Ex10 | 12.25 | 71.41 | 145 | 0.272 | 0.293 |
| Ref33 | 12.25 | 71.05 | 121 | 0.272 | 0.293 |
| Ref34 | 12.25 | 71.05 | 121 | 0.272 | 0.293 |
| Ref35 | 12.26 | 71.05 | 144 | 0.272 | 0.293 |
| Ex11 | 12.30 | 71.77 | 156 | 0.272 | 0.293 |
| Ex12 | 12.26 | 68.90 | 134 | 0.272 | 0.293 |
| Ex13 | 12.25 | 68.90 | 135 | 0.272 | 0.293 |

TABLE 10

| | Results | | | | |
|---|---|---|---|---|---|
| | V | cd/A | hr | CIEx | CIEy |
| Ex14 | 12.26 | 68.18 | 155 | 0.272 | 0.293 |
| Ex15 | 12.25 | 71.41 | 146 | 0.272 | 0.293 |
| Ref36 | 12.25 | 71.05 | 122 | 0.272 | 0.293 |
| Ref37 | 12.25 | 71.05 | 122 | 0.272 | 0.293 |
| Ref38 | 12.26 | 71.05 | 144 | 0.272 | 0.293 |
| Ex16 | 12.25 | 71.41 | 146 | 0.272 | 0.293 |
| Ref39 | 12.25 | 71.05 | 122 | 0.272 | 0.293 |
| Ref40 | 12.25 | 71.05 | 122 | 0.272 | 0.293 |
| Ref41 | 12.26 | 71.05 | 144 | 0.272 | 0.293 |
| Ex17 | 12.30 | 71.77 | 156 | 0.272 | 0.293 |
| Ref42 | 12.26 | 68.90 | 134 | 0.272 | 0.293 |
| Ref43 | 12.25 | 68.90 | 135 | 0.272 | 0.293 |

TABLE 10-continued

| | Results | | | | |
|---|---|---|---|---|---|
| | V | cd/A | hr | CIEx | CIEy |
| Ref44 | 12.26 | 68.18 | 155 | 0.272 | 0.293 |
| Ex18 | 12.30 | 71.77 | 156 | 0.272 | 0.293 |
| Ex19 | 12.26 | 68.90 | 134 | 0.272 | 0.293 |
| Ex20 | 12.25 | 68.90 | 135 | 0.272 | 0.293 |
| Ex21 | 12.26 | 68.18 | 155 | 0.272 | 0.293 |
| Ex22 | 12.30 | 71.77 | 156 | 0.272 | 0.293 |
| Ref45 | 12.26 | 68.90 | 134 | 0.272 | 0.293 |
| Ref46 | 12.25 | 68.90 | 135 | 0.272 | 0.293 |
| Ref47 | 12.26 | 68.18 | 155 | 0.272 | 0.293 |
| Ex23 | 12.30 | 71.77 | 157 | 0.272 | 0.293 |
| Ex24 | 12.26 | 68.90 | 134 | 0.272 | 0.293 |
| Ex25 | 12.25 | 68.90 | 135 | 0.272 | 0.293 |

TABLE 11

| | Results | | | | |
|---|---|---|---|---|---|
| | V | cd/A | hr | CIEx | CIEy |
| Ex26 | 12.26 | 68.18 | 156 | 0.272 | 0.293 |
| Ex27 | 12.30 | 71.77 | 157 | 0.272 | 0.293 |
| Ref48 | 12.26 | 68.90 | 134 | 0.272 | 0.293 |
| Ref49 | 12.25 | 68.90 | 135 | 0.272 | 0.293 |
| Ref50 | 12.26 | 68.18 | 156 | 0.272 | 0.293 |
| Ref51 | 11.75 | 78.94 | 114 | 0.272 | 0.293 |
| Ref52 | 11.75 | 79.26 | 115 | 0.272 | 0.293 |
| Ref53 | 11.76 | 78.55 | 115 | 0.272 | 0.293 |
| Ref54 | 11.76 | 78.71 | 114 | 0.272 | 0.293 |
| Ref55 | 11.76 | 79.10 | 115 | 0.272 | 0.293 |
| Ex28 | 11.75 | 80.52 | 126 | 0.272 | 0.293 |
| Ref56 | 11.75 | 79.73 | 115 | 0.272 | 0.293 |
| Ref57 | 11.75 | 79.73 | 115 | 0.272 | 0.293 |
| Ref58 | 11.85 | 79.73 | 125 | 0.272 | 0.293 |
| Ex29 | 11.75 | 78.55 | 137 | 0.272 | 0.293 |
| Ref59 | 11.75 | 78.15 | 115 | 0.272 | 0.293 |
| Ref60 | 11.75 | 78.15 | 115 | 0.272 | 0.293 |
| Ref61 | 11.76 | 78.15 | 137 | 0.272 | 0.293 |
| Ex30 | 11.75 | 80.52 | 126 | 0.272 | 0.293 |
| Ref62 | 11.75 | 79.73 | 115 | 0.272 | 0.293 |
| Ref63 | 11.75 | 79.73 | 115 | 0.272 | 0.293 |
| Ref 64 | 11.85 | 79.73 | 125 | 0.272 | 0.293 |
| Ex31 | 11.75 | 80.52 | 126 | 0.272 | 0.293 |
| Ref65 | 11.75 | 79.73 | 115 | 0.272 | 0.293 |

TABLE 12

| | Results | | | | |
|---|---|---|---|---|---|
| | V | cd/A | hr | CIEx | CIEy |
| Ref66 | 11.75 | 79.73 | 115 | 0.272 | 0.293 |
| Ref67 | 11.85 | 79.73 | 125 | 0.272 | 0.293 |
| Ex32 | 11.75 | 80.52 | 126 | 0.272 | 0.293 |
| Ref68 | 11.75 | 79.73 | 115 | 0.272 | 0.293 |
| Ref69 | 11.75 | 79.73 | 115 | 0.272 | 0.293 |
| Ref70 | 11.85 | 79.73 | 125 | 0.272 | 0.293 |
| Ex33 | 11.75 | 80.52 | 126 | 0.272 | 0.293 |
| Ref71 | 11.75 | 79.73 | 116 | 0.272 | 0.293 |
| Ref72 | 11.75 | 79.73 | 115 | 0.272 | 0.293 |
| Ref73 | 11.85 | 79.73 | 125 | 0.272 | 0.293 |
| Ex34 | 11.75 | 78.55 | 137 | 0.272 | 0.293 |
| Ref74 | 11.75 | 78.15 | 115 | 0.272 | 0.293 |
| Ref75 | 11.75 | 78.15 | 115 | 0.272 | 0.293 |
| Ref76 | 11.77 | 78.15 | 137 | 0.272 | 0.293 |
| Ex35 | 11.75 | 78.55 | 137 | 0.272 | 0.293 |
| Ref77 | 11.75 | 78.15 | 116 | 0.272 | 0.293 |
| Ref78 | 11.75 | 78.15 | 115 | 0.272 | 0.293 |
| Ref79 | 11.76 | 78.15 | 137 | 0.272 | 0.293 |
| Ex36 | 11.75 | 78.55 | 137 | 0.272 | 0.293 |
| Ref80 | 11.75 | 78.15 | 115 | 0.272 | 0.293 |
| Ref81 | 11.75 | 78.15 | 116 | 0.272 | 0.293 |

TABLE 12-continued

| | Results | | | | |
|---|---|---|---|---|---|
| | V | cd/A | hr | CIEx | CIEy |
| Ref82 | 11.77 | 78.15 | 136 | 0.272 | 0.293 |
| Ex37 | 11.75 | 78.55 | 138 | 0.272 | 0.293 |
| Ref83 | 11.75 | 78.15 | 115 | 0.272 | 0.293 |

TABLE 13

| | Results | | | | |
|---|---|---|---|---|---|
| | V | cd/A | hr | CIEx | CIEy |
| Ref84 | 11.75 | 78.15 | 115 | 0.272 | 0.293 |
| Ref85 | 11.76 | 78.15 | 137 | 0.272 | 0.293 |
| Ex38 | 11.80 | 78.94 | 149 | 0.272 | 0.293 |
| Ex39 | 11.76 | 75.79 | 127 | 0.272 | 0.293 |
| Ex40 | 11.75 | 75.79 | 128 | 0.272 | 0.293 |
| Ex41 | 11.76 | 75.00 | 147 | 0.272 | 0.293 |
| Ex42 | 11.75 | 78.55 | 138 | 0.272 | 0.293 |
| Ref86 | 11.75 | 78.15 | 115 | 0.272 | 0.293 |
| Ref89 | 11.75 | 78.15 | 115 | 0.272 | 0.293 |
| Ref88 | 11.76 | 78.15 | 137 | 0.272 | 0.293 |
| Ex43 | 11.75 | 78.55 | 138 | 0.272 | 0.293 |
| Ref89 | 11.75 | 78.15 | 115 | 0.272 | 0.293 |
| Ref90 | 11.75 | 78.15 | 115 | 0.272 | 0.293 |
| Ref91 | 11.76 | 78.15 | 137 | 0.272 | 0.293 |
| Ex44 | 11.80 | 78.94 | 148 | 0.272 | 0.293 |
| Ref92 | 11.76 | 75.79 | 127 | 0.272 | 0.293 |
| Ref93 | 11.75 | 75.79 | 128 | 0.272 | 0.293 |
| Ref94 | 11.76 | 75.00 | 147 | 0.272 | 0.293 |
| Ex45 | 11.80 | 78.94 | 149 | 0.272 | 0.293 |
| Ex46 | 11.76 | 75.79 | 127 | 0.272 | 0.293 |
| Ex47 | 11.75 | 75.79 | 128 | 0.272 | 0.293 |
| Ex48 | 11.76 | 75.00 | 147 | 0.272 | 0.293 |
| Ex49 | 11.80 | 78.94 | 148 | 0.272 | 0.293 |
| Ref95 | 11.76 | 75.79 | 127 | 0.272 | 0.293 |

TABLE 14

| | Results | | | | |
|---|---|---|---|---|---|
| | V | cd/A | hr | CIEx | CIEy |
| Ref96 | 11.75 | 75.79 | 128 | 0.272 | 0.293 |
| Ref97 | 11.76 | 75.00 | 147 | 0.272 | 0.293 |
| Ex50 | 11.80 | 78.94 | 149 | 0.272 | 0.293 |
| Ex51 | 11.76 | 75.79 | 127 | 0.272 | 0.293 |
| Ex52 | 11.75 | 75.79 | 128 | 0.272 | 0.293 |
| Ex53 | 11.76 | 75.00 | 148 | 0.272 | 0.293 |
| Ex54 | 11.80 | 78.94 | 149 | 0.272 | 0.293 |
| Ref98 | 11.76 | 75.79 | 127 | 0.272 | 0.293 |
| Ref99 | 11.75 | 75.79 | 128 | 0.272 | 0.293 |
| Ref100 | 11.76 | 75.00 | 148 | 0.272 | 0.293 |

As shown in Tables 1 to 14, the properties of the OLED are not affected by the deuteration on the compound included in the first P-type CGL "p-CGL1".

On the other hand, in the OLED of Ref 8, 11, 14, 17, 20, 23, 26, 29, 32, 35, 38, 41~50, 58, 61, 64, 67, 70, 73, 76, 79, 82, 85, 88 and 91 to 100, in which the anthracene derivative, e.g., the compound A-5 or the compound B-5, being wholly deuterated is included in at least one of the first HTL and the red EML in the first emitting part, and the OLED of Ex1 to Ex54, in which the anthracene derivative, e.g., the compound A-2 or the compound B-2, including deuterated spiro-fluorene moiety is included in at least one of the first HTL and the red EML in the first emitting part, the emitting efficiency and the lifespan are significantly increased.

In addition, in the OLED of Ex 1 to 54, in which the anthracene derivative, e.g., the compound A-2 or the compound B-2, including deuterated spiro-fluorene moiety is included in at least one of the first HTL and the red EML in the first emitting part, less deuterium atoms, which is very expensive, are used and there is an advantage in the driving voltage. Namely, in the OLED of Ex1 to Ex54, the production cost increase by the deuterium atom is minimized, and sufficient emitting efficiency and lifespan are provided.

Moreover, in the OLED of Ex 11, 18, 23, 38, 45 and 50, in which the anthracene derivative, e.g., the compound A-2 or the compound B-2, including deuterated spiro-fluorene moiety is included in both the first HTL and the red EML, the emitting efficiency and the lifespan are remarkably increased.

It will be apparent to those skilled in the art that various modifications and variations can be made in the embodiments of the present disclosure without departing from the spirit or scope of the present disclosure. Thus, it is intended that the modifications and variations cover this disclosure provided they come within the scope of the appended claims and their equivalents.

What is claimed is:

1. An organic light emitting diode, comprising:

a first electrode;

a second electrode facing the first electrode; and a first emitting part including a red emitting material layer and a first hole transporting layer and positioned between the first and second electrodes, the red emitting material layer including a first red host and a red dopant, and the first hole transporting layer including a hole transporting material and positioned between the first electrode and the red emitting material layer, wherein the first red host end is a compound of Formula 1-1:

[Formula 1-1]

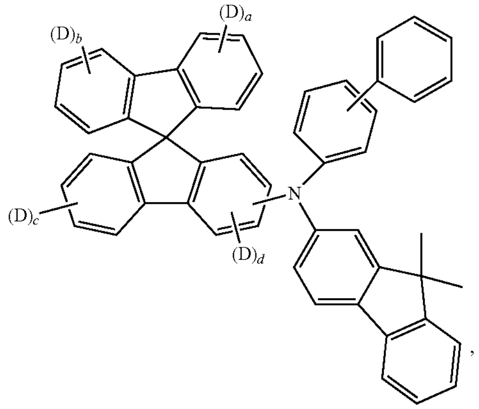

wherein:

D denotes a deuterium atom, each of a, b and c is independently an integer of 0 to 4, d is an integer of 0 to 3, and at least one of a, b, c and d is a positive integer, wherein the hole transporting material is a compound of Formula 3-1;

[Formula 3-1]

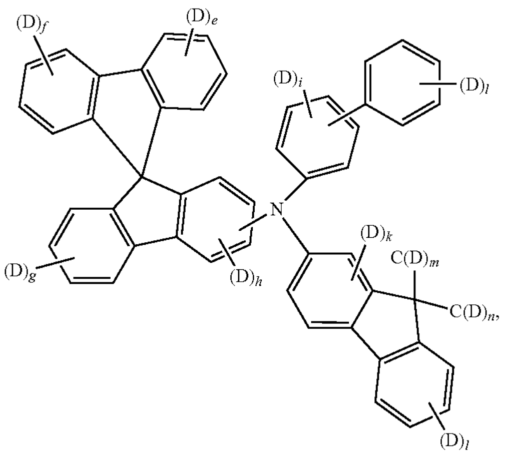

and wherein:

each of e, f, g, i and 1 is independently an integer of 0 to 4 each of h, k, m and n is independently an integer of 0 to 3, and j is an integer of 0 to 5, and at least one of I, j, k, l, m and n is a positive integer.

2. The organic light emitting diode according to claim 1, wherein the compound of Formula 1-1 is one of compounds in Formula 2:

[Formula 2]

A-2

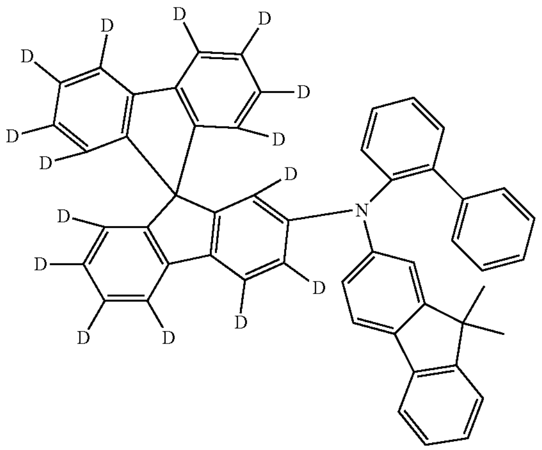

-continued

B-2

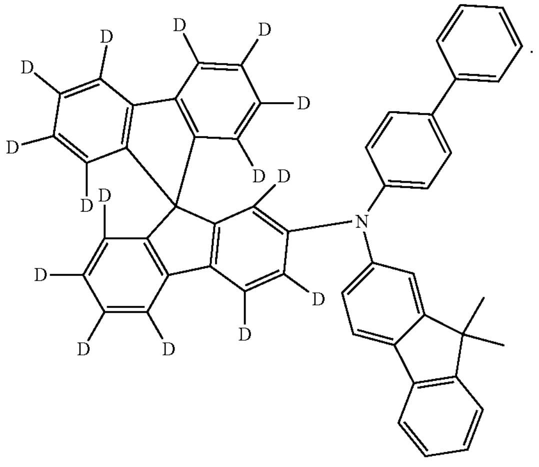

3. The organic light emitting diode according to claim 1, wherein the compound of Formula 3-1 is one of compounds in Formula 4:

[Formula 4]

A-3

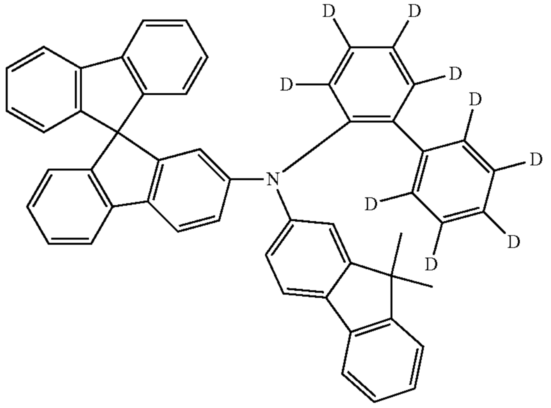

A-4

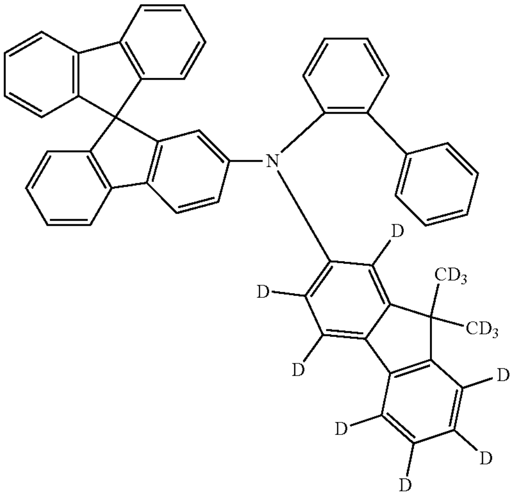

-continued

A-5

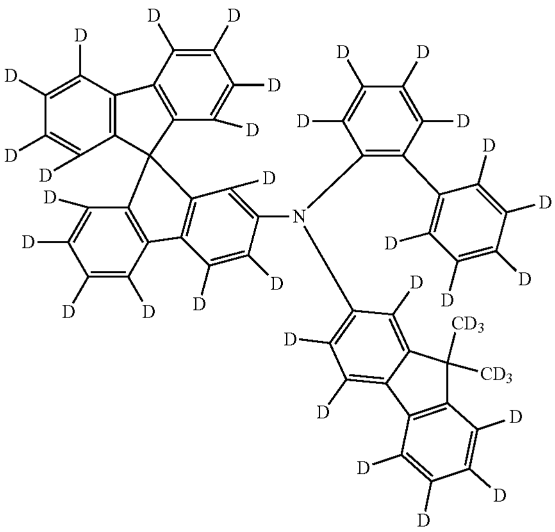

B-3

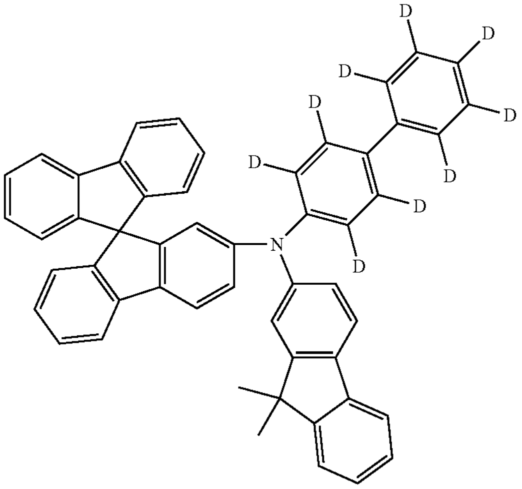

B-4

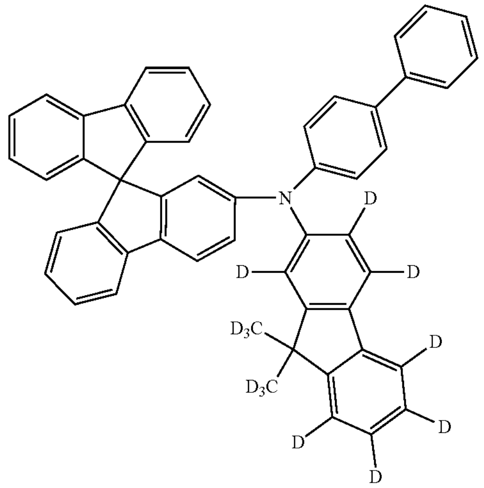

-continued

B-5

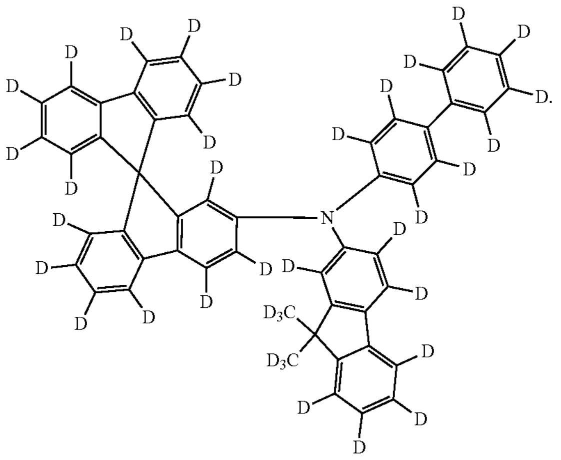

4. The organic light emitting diode according to claim 1, further comprising:

a second emitting part including a first blue emitting material layer and positioned between the first electrode and the first emitting part; and a first charge generation layer including a P-type charge generation material and positioned between the first emitting part and the second emitting part.

5. The organic light emitting diode according to claim 4, wherein the P-type charge generation material is one of the compound of Formula 1-1 and the compound of Formula 3-1.

6. The organic light emitting diode according to claim 4, wherein the P-type charge generation material is a compound in Formula 29-2:

[Formula 29-2]

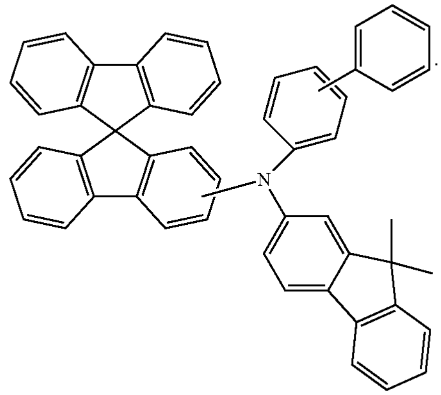

7. The organic light emitting diode according to claim 4, further comprising:

a third emitting part including a second blue emitting material layer and positioned between the first emitting part and the second electrode; and a second charge generation layer positioned between the second emitting part and the third emitting part.

8. The organic light emitting diode according to claim 7, wherein the first blue emitting material layer includes a first blue host of Formula 23-2, and the second blue emitting material layer includes a second blue host of Formula 23-3:

[Formula 23-2]

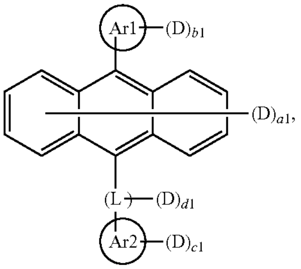

and

[Formula 23-3]

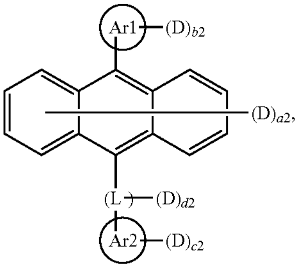

wherein each of Ar1 and Ar2 is independently C6 to C20 aryl group, and L is C6 to C20 arylene group, wherein each of a1 and a2 is independently an integer of 0 to 8, wherein each of b1, b2, c1, c2, d1 and d2 is independently an integer of 0 to 20, and wherein a summation of a1, b1, c1 and d1 is greater than a summation of a2, b2, c2 and d2.

9. The organic light emitting diode according to claim 8, wherein the first blue host is represented by Formula 23-4, and the second blue host is represented by Formula 23-5:

[Formula 23-4]

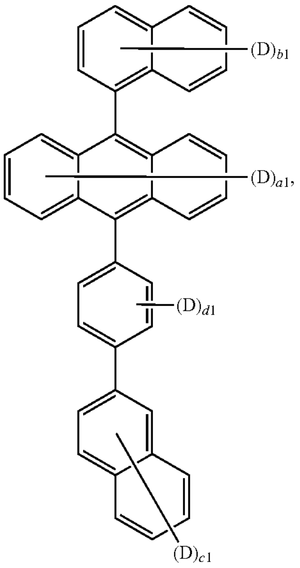

and

-continued

[Formula 23-5]

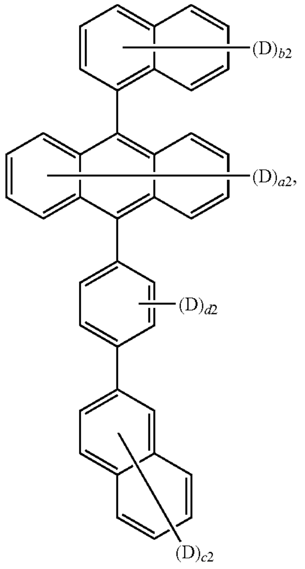

wherein each of a1 and a2 is independently an integer of 0 to 8, wherein each of b1, b2, c1 and c2 is independently an integer of 0 to 7, wherein each of d1 and d2 is independently an integer of 0 to 4, and wherein a summation of a1, b1, c1 and d1 is greater than a summation of a2, b2, c2 and d2.

10. The organic light emitting diode according to claim 9, wherein the first blue host is a compound in Formula 24-1, and the second blue host is one of compounds in Formula 24-2:

[Formula 24-1]
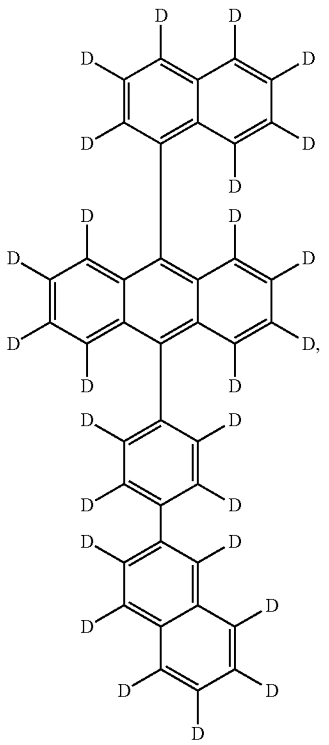
and
[Formula 24-2]
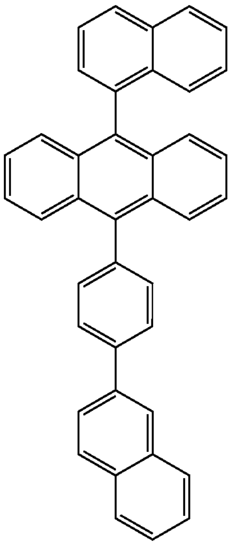
Host 1-1
-continued
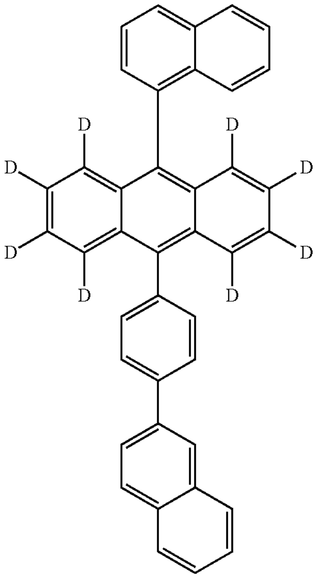
Host 1-2
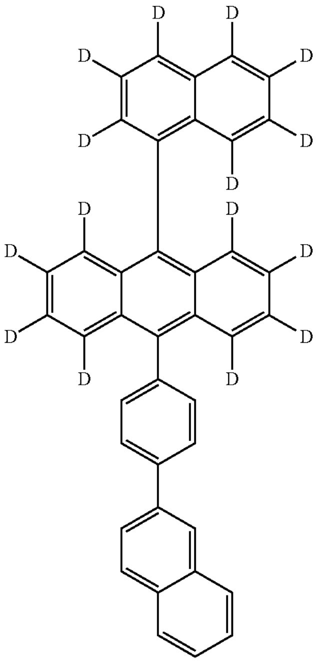
Host 1-3

-continued

Host 1-4

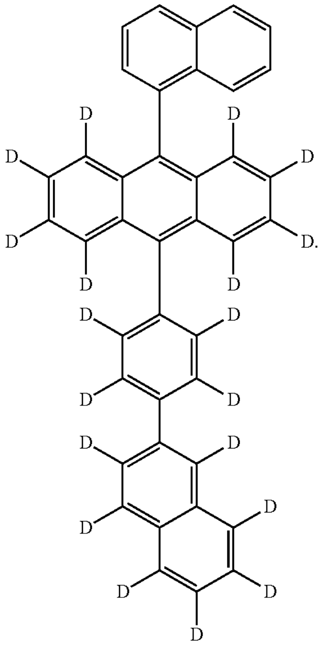

11. The organic light emitting diode according to claim 8, wherein the first blue emitting material layer includes a first blue dopant being a boron derivative, and the second blue emitting material layer includes a second blue dopant being a boron derivative.

12. The organic light emitting diode according to claim 11, wherein each of the first and second blue dopants is represented by Formula 25:

[Formula 25]

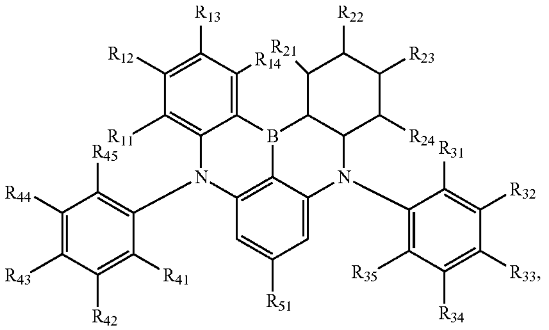

wherein each of $R_1$ to $R_{14}$, each of $R_{21}$ to $R_{24}$, each of $R_{31}$ to $R_{35}$ and each of $R_{41}$ to Ras is selected from the group of hydrogen, deuterium, C1 to C10 alkyl group, C6 to C30 aryl group unsubstituted or substituted with C1 to C10 alkyl group, C12 to C30 arylamine group and C5 to C30 heteroaryl group, or adjacent two of Ru to $R_{14}$, adjacent two of $R_{21}$ to $R_{24}$, adjacent two of $R_{31}$ to $R_{35}$ and adjacent two of $R_{41}$ to $R_{45}$ are connected to each other to form a fused ring unsubstituted or substituted with C1 to C10 alkyl group, and wherein $R_{51}$ is selected from the group consisting of hydrogen, deuterium, C1 to C10 alkyl group and C3 to C30 cycloalkyl group, C6 to C30 aryl group, C5 to C30 heteroaryl group unsubstituted or substituted with deuterium and C6 to C30 arylamine group unsubstituted or substituted with C1 to C10 alkyl group.

13. The organic light emitting diode according to claim 12, wherein each of the first and second blue dopants is independently selected from compounds in Formula 26:

[Formula 26]

Dopant 1

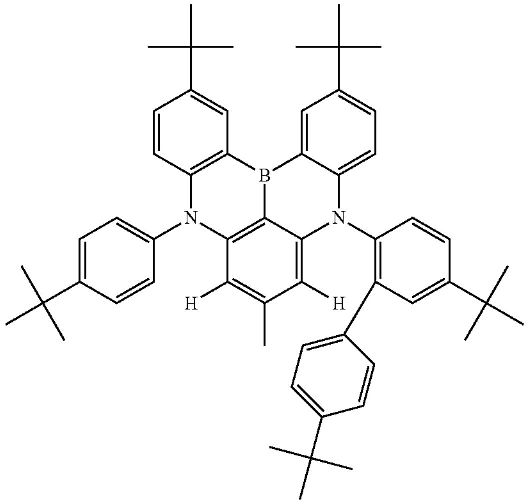

Dopant 2

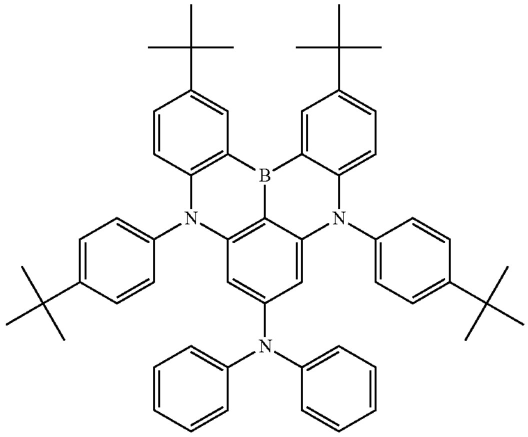

Dopant 3

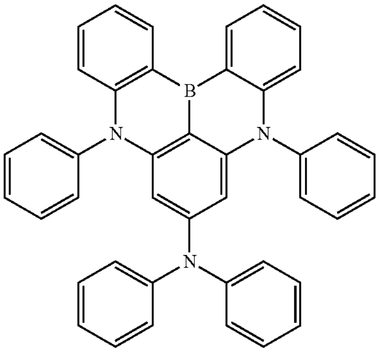

-continued
Dopant 4
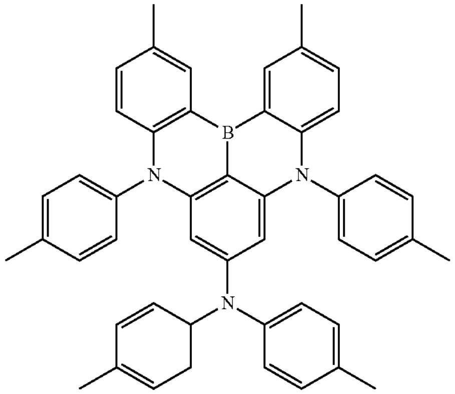
Dopant 5
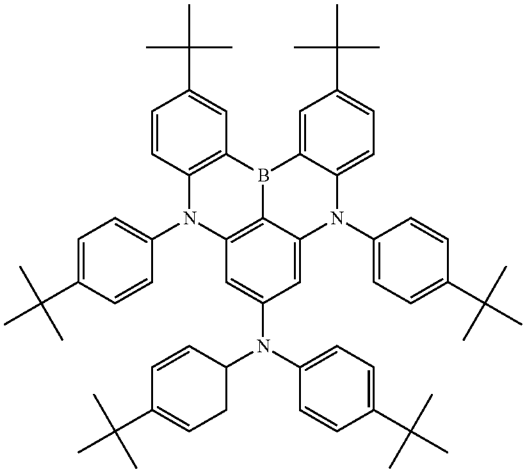
Dopant 6
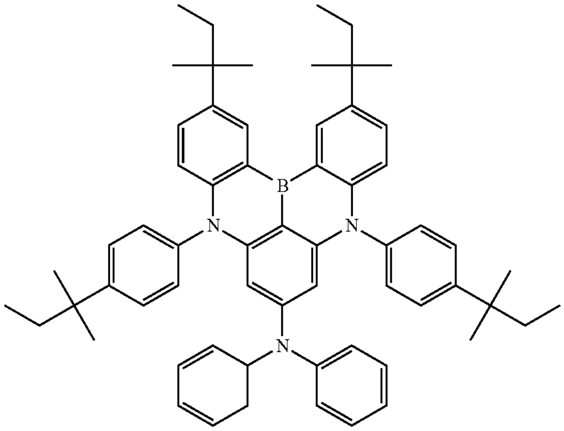
-continued
Dopant 7
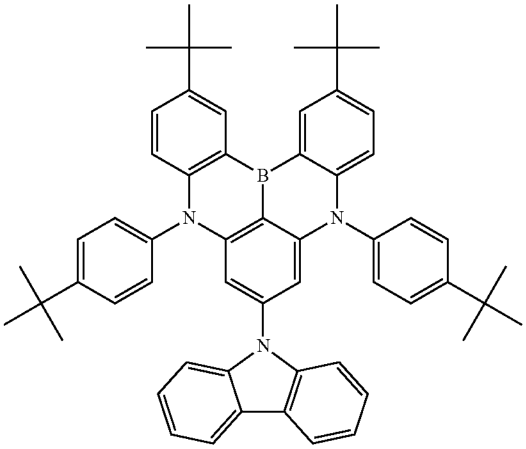
Dopant 8
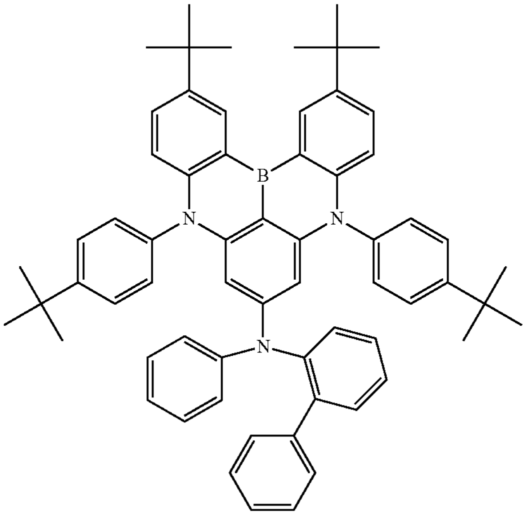
Dopant 9
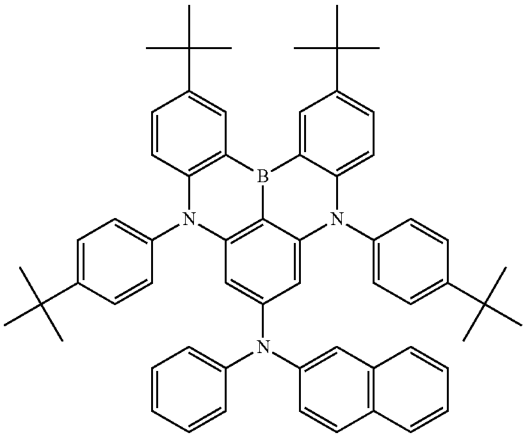

-continued
Dopant 10
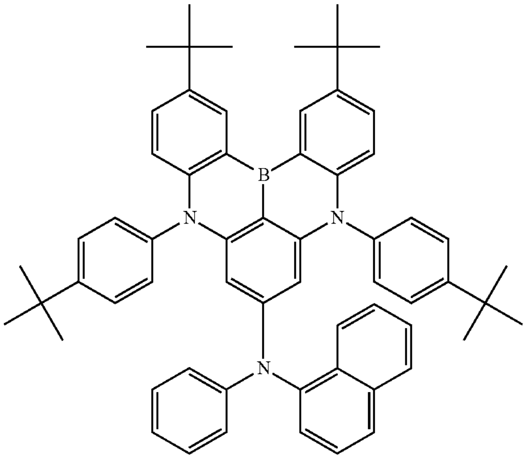
Dopant 11
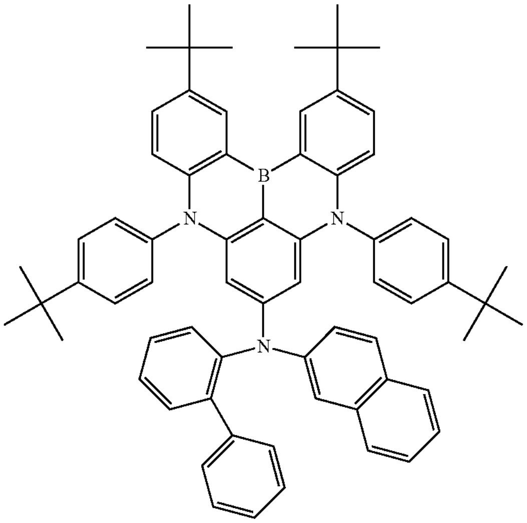
Dopant 12
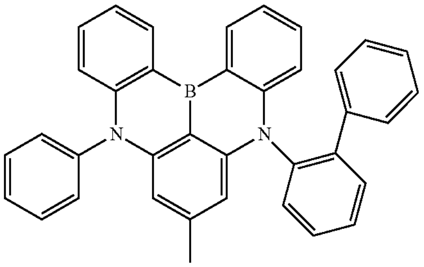
Dopant 13
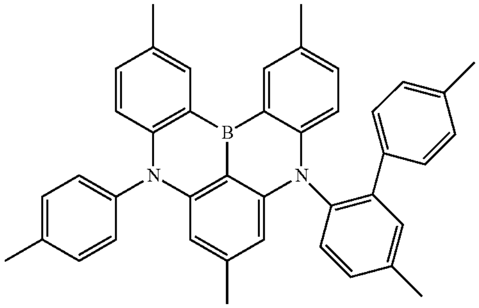
-continued
Dopant 14
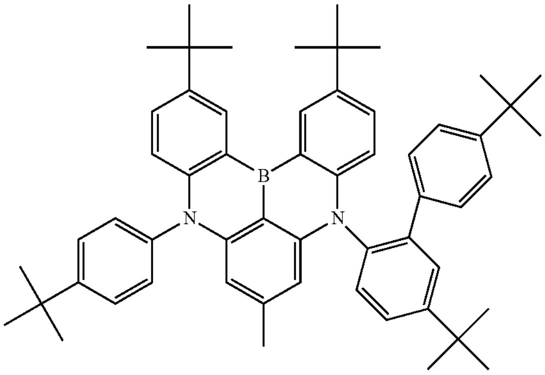
Dopant 15
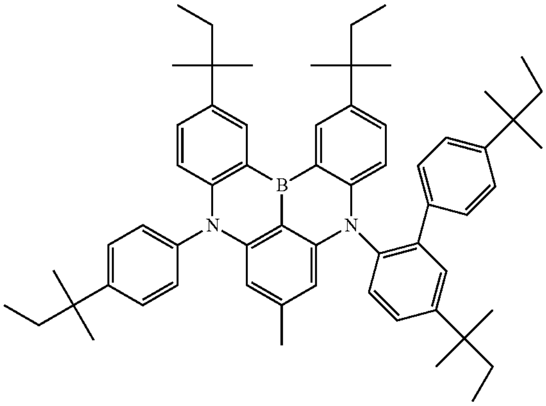
Dopant 16
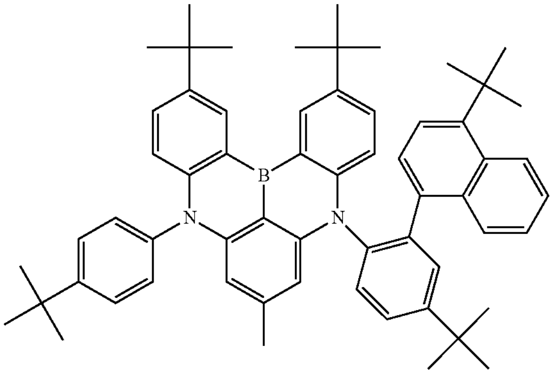
Dopant 17
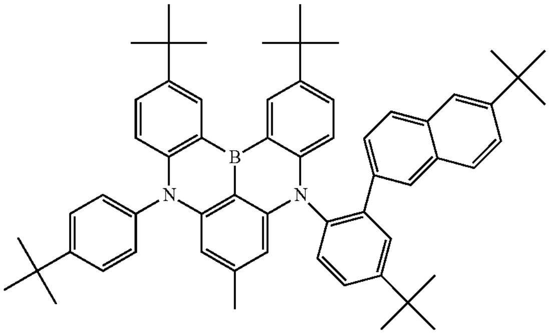

-continued

Dopant 18

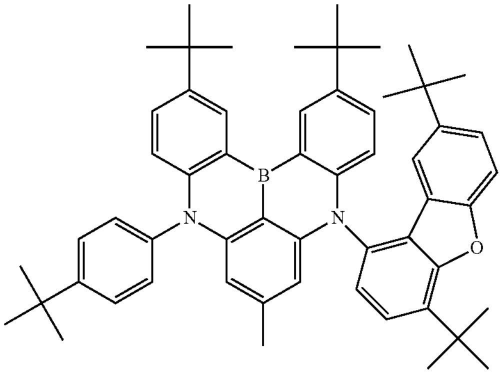

Dopant 19

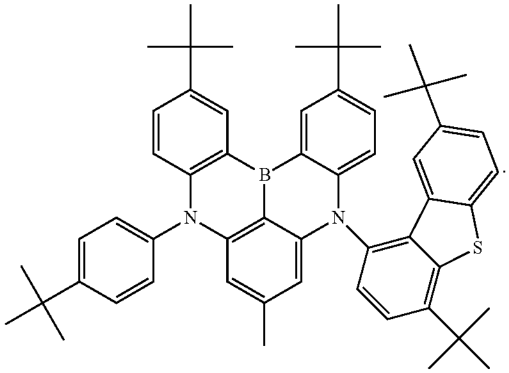

14. The organic light emitting diode according to claim 12, wherein a weight % of the first blue dopant in the first blue emitting material layer is equal to or greater than a weight % of the second blue dopant in the second blue emitting material layer.

15. The organic light emitting diode according to claim 14, wherein a thickness of the first blue emitting material layer is equal to or smaller than a thickness of the second blue emitting material layer.

16. The organic light emitting diode according to claim 7, wherein the first emitting part further includes a green emitting material layer between the red emitting material layer and the second charge generation layer.

17. The organic light emitting diode according to claim 16, wherein the first emitting part further includes a yellow-green emitting material layer between the red and green emitting material layers.

18. An organic light emitting device, comprising:

a substrate; and an organic light emitting diode positioned on the substrate and including a first electrode, a second electrode facing the first electrode, and a first emitting part including a red emitting material layer and a first hole transporting layer and positioned between the first and second electrodes, the red emitting material layer including a first red host and a red dopant, and the first hole transporting layer including a hole transporting material and positioned between the first electrode and the red emitting material layer, wherein the first red host is a compound of Formula 1-1:

[Formula 1-1]

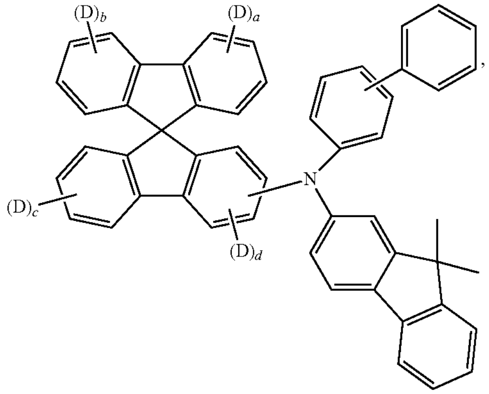

wherein each of a, b and c is independently an integer of 0 to 4, d is an integer of 0 to 3, and at least one of a, b, c and d is a positive integer, wherein the hole transporting material is a compound of Formula 3-1:

[Formula 3-1]

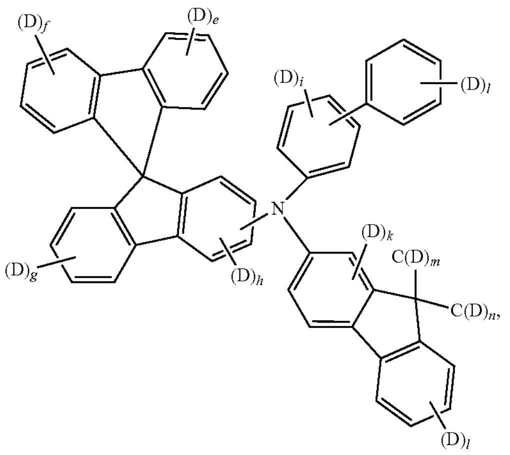

and wherein:

each of e, f, g, i and l is independently an integer of 0 to 4, each of h, k, m, and n is independently an integer of 0 to 3, and j is an integer of 0 to 5, and at least one of I, j, k, l, m and n is a positive integer.

19. The organic light emitting device according to claim 18, wherein the substrate includes a red pixel region, a green pixel region and a blue pixel region, and the organic light emitting diode corresponds to each of the red, green and blue pixel regions, wherein the organic light emitting device further comprises:

a color filter layer corresponding to the red, green and blue pixel regions and disposed between the substrate and the organic light emitting diode or over the organic light emitting diode.

20. The organic light emitting device according to claim 18, wherein the compound of Formula 3-1 is one of compounds in Formula 4:

[Formula 4]

A-3

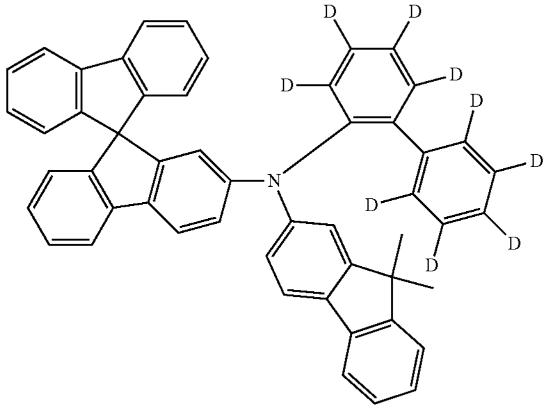

A-4

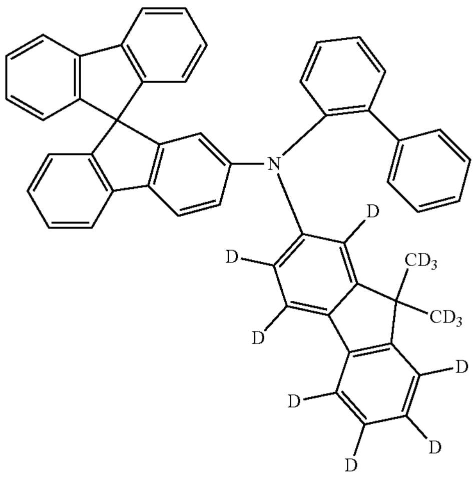

A-5

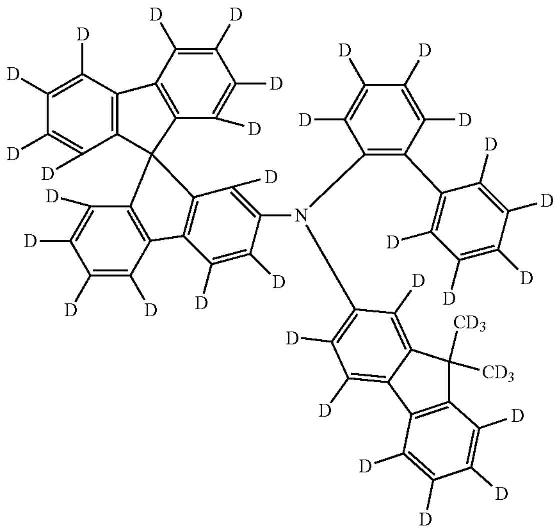

-continued

B-3

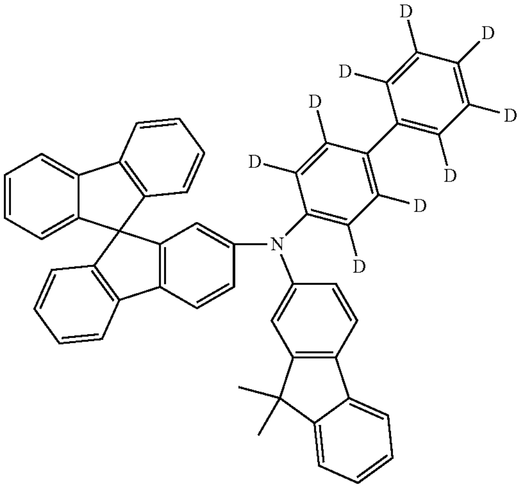

B-4

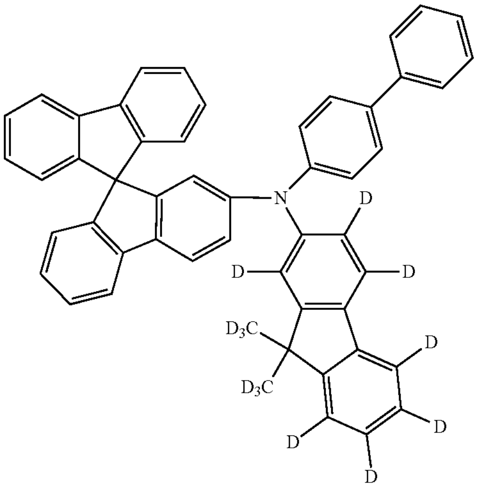

B-5

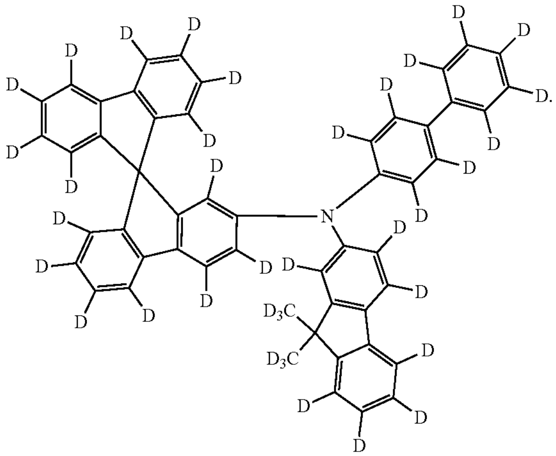

21. The organic light emitting device according to claim 18, further comprising:

a second emitting part including a first blue emitting material layer and positioned between the first electrode and the first emitting part; and a first charge generation layer including a P-type charge generation material and positioned between the first emitting part and the second emitting part.
22. The organic light emitting device according to claim 21, wherein the P-type charge generation material is a compound in Formula 29-2:
[Formula 29-2]
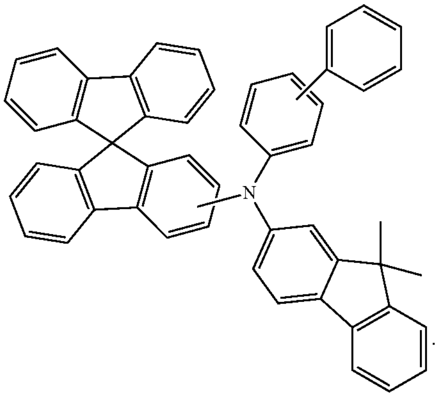
* * * * *